(12) United States Patent
Kim

(10) Patent No.: US 11,979,700 B2
(45) Date of Patent: May 7, 2024

(54) DISPLAY APPARATUS

(71) Applicant: LG Display Co., Ltd., Seoul (KR)

(72) Inventor: Kwangho Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/210,011

(22) Filed: Jun. 14, 2023

(65) Prior Publication Data

US 2023/0328416 A1  Oct. 12, 2023

Related U.S. Application Data

(63) Continuation of application No. 16/438,885, filed on Jun. 12, 2019, now Pat. No. 11,765,492.

(30) Foreign Application Priority Data

Jun. 28, 2018 (KR) .................. 10-2018-0074956

(51) Int. Cl.
| | | |
|---|---|---|
| *H04R 1/02* | (2006.01) | |
| *G02F 1/1333* | (2006.01) | |
| *H10K 59/00* | (2023.01) | |
| *H10K 59/126* | (2023.01) | |
| *G02F 1/1362* | (2006.01) | |
| *G02F 1/1368* | (2006.01) | |

(52) U.S. Cl.
CPC ....... *H04R 1/028* (2013.01); *G02F 1/133308* (2013.01); *H10K 59/00* (2023.02); *H10K 59/126* (2023.02); *G02F 1/136286* (2013.01); *G02F 1/1368* (2013.01); *H04R 2499/15* (2013.01)

(58) Field of Classification Search
CPC .... H04R 2499/15; H04R 7/045; H04R 1/028; H04R 2499/11; H04R 17/00; H04R 2440/00; H04R 2440/05; H04R 2440/07; H04R 17/005; H04R 7/04; H04R 7/26; H04R 2207/00; H04R 2207/021; H04R 2307/201; H04R 5/642; G06F 1/1688; G06F 1/1605
See application file for complete search history.

(56) References Cited

U.S. PATENT DOCUMENTS

| 6,671,171 B1 | 12/2003 | Homer et al. |
| 9,818,805 B2 | 11/2017 | Choi et al. |
| 2005/0047616 A1 | 3/2005 | Lee |
(Continued)

FOREIGN PATENT DOCUMENTS

| CN | 102595288 A | 7/2012 |
| CN | 104751743 A | 7/2015 |
(Continued)

OTHER PUBLICATIONS

Office Action dated Nov. 4, 2020, issued in corresponding European Patent Application No. 19 182 826.8.
(Continued)

*Primary Examiner* — Kile O Blair
(74) *Attorney, Agent, or Firm* — Morgan, Lewis & Bockius LLP

(57) ABSTRACT

A display apparatus may include: a display panel configured to display an image, a supporting member configured to support the display panel, a coupling member in the supporting member, and at least one sound-generating device coupled to the display panel by the coupling member, the at least one sound-generating device being configured to vibrate the display panel to generate sound.

11 Claims, 31 Drawing Sheets

(56) References Cited

U.S. PATENT DOCUMENTS

| | | |
|---|---|---|
| 2009/0097692 A1 | 4/2009 | Sakamoto |
| 2012/0170794 A1 | 7/2012 | Kim et al. |
| 2012/0247866 A1 | 10/2012 | Lage |
| 2013/0156218 A1 | 6/2013 | Annacone et al. |
| 2015/0078604 A1 | 3/2015 | Seo et al. |
| 2015/0185963 A1 | 7/2015 | Lee et al. |
| 2015/0341714 A1 | 11/2015 | Ahn et al. |
| 2016/0105743 A1 | 4/2016 | Yamazaki et al. |
| 2017/0280215 A1 | 9/2017 | Lee et al. |
| 2017/0289694 A1 | 10/2017 | Choi et al. |
| 2018/0332376 A1 | 11/2018 | Lee |
| 2018/0352314 A1 | 12/2018 | Lee et al. |
| 2019/0028787 A1 | 1/2019 | Masuda et al. |
| 2019/0200111 A1 | 6/2019 | Kang et al. |

FOREIGN PATENT DOCUMENTS

| | | |
|---|---|---|
| CN | 105096778 A | 11/2015 |
| CN | 107295446 A | 10/2017 |
| CN | 107454519 A | 12/2017 |
| CN | 206993387 U | 2/2018 |
| CN | 108124218 A | 6/2018 |
| CN | 108877597 A | 11/2018 |
| CN | 109963242 A | 7/2019 |
| EP | 3 229 063 A1 | 10/2017 |
| EP | 3 330 780 A1 | 6/2018 |
| EP | 3 410 739 A1 | 12/2018 |
| KR | 10-2017-0135465 A | 12/2017 |
| KR | 2017-0135673 A | 12/2017 |
| KR | 10-1817102 B1 | 1/2018 |
| KR | 10-2018-0062320 A | 6/2018 |

OTHER PUBLICATIONS

Office Action dated Mar. 1, 2021, issued in corresponding Chinese Patent Application No. 201910567452.0.
1 Office Action dated Jul. 7, 2023, issued in corresponding Korean Divisional Patent Application No. 10-2023-0080724.
Extended European Search Report, dated Sep. 25, 2023, issued in corresponding EP Patent Application No. 23178948.8.
Office Action dated Dec. 19, 2023 for corresponding Chinese Divisional Patent Application No. 202210573149.3.
Office Action from the Korean Intellectual Property Office dated Dec. 6, 2022, in corresponding Korean Patent Application No. 10-2018-0074956.
Office Action dated Oct. 11, 2021, issued in corresponding Chinese Patent Application No. 201910567452.0.

DISPLAY APPARATUS

CROSS-REFERENCE TO RELATED APPLICATION(S)

This application is a continuation of a co-pending U.S. patent application Ser. No. 16/438,885, filed on Jun. 12, 2019, which claims the benefit of and priority to Korean Patent Application No. 10-2018-0074956, filed on Jun. 28, 2018. The entirety of each of the above prior U.S. and Korean patent applications is hereby incorporated by reference.

BACKGROUND

1. Technical Field

The present disclosure relates to a display apparatus, and more particularly, to a display apparatus configured to vibrate a display panel to generate sound.

2. Discussion of the Related Art

Recently, as society advances toward an information-oriented society, the field of display apparatuses for visually displaying electrical information signal has rapidly advanced. Consequently, various display apparatuses having excellent performance, such as thinness, light weight, and low power consumption, are being developed.

For example, display apparatuses may be categorized into liquid crystal display (LCD) apparatuses, field emission display (FED) apparatuses, organic light-emitting display apparatuses, etc.

The LCD apparatuses each include an array substrate including a thin-film transistor (TFT), an upper substrate including a color filter and/or a black matrix, and a liquid crystal layer between the array substrate and the upper substrate. The LCD apparatuses are apparatuses in which an alignment state of the liquid crystal layer is adjusted with an electric field generated between two electrodes provided in a pixel area, and a transmittance of light is adjusted based on the alignment state, thereby displaying an image. The organic light-emitting display apparatuses, which are self-emitting devices, have low power consumption, a fast response time, high emission efficiency, excellent luminance, and a wide viewing angle.

Display apparatuses display an image on a display panel, but a separate speaker is installed for providing a sound in related art devices. When a speaker is installed in a display apparatus, a traveling direction of a sound output through the speaker is a direction toward a rear surface of the display panel or toward a region under the display panel, instead of toward a front surface of the display panel displaying an image. Thus, the sound does not travel in a direction toward a viewer who is watching an image in front of the display panel, whereby an immersion experience of the viewer watching the image is hindered.

Moreover, a sound output through a speaker travels toward a rear surface of a display panel or toward a region under the display panel. As such, the quality of the sound is degraded due to interference of a sound reflected from a wall or a floor.

Moreover, when a speaker is included in a set apparatus, such as a television (TV), a laptop computer, or a computer monitor, the speaker occupies a certain space. Thus, the design and space disposition of the set apparatus are limited.

SUMMARY

Accordingly, the present disclosure is directed to a display apparatus that substantially obviates one or more of the issues due to limitations and disadvantages of the related art.

An aspect of the present disclosure is to provide a display apparatus including a sound-generating device for generating a sound that travels toward a region in front of a display panel.

Another aspect of the present disclosure is to provide a display apparatus having a new structure that decreases a wave phenomenon of a display panel.

Another aspect of the present disclosure is to provide a display apparatus having a new structure that is slimmed.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, a supporting member configured to support the display panel, a coupling member in the supporting member, and at least one sound-generating device coupled to the display panel by the coupling member, the at least one sound-generating device being configured to vibrate the display panel to generate sound.

In another aspect, there is provided a display apparatus, including: a display panel configured to display an image and including: a first region, a second region, and a third region, a supporting member configured to support the display panel, a coupling member in the supporting member, at least one sound-generating device coupled between the display panel and the supporting member by the coupling member, the at least one sound-generating device being in at least one of: the first region, the second region, and the third region, and a first partition between the display panel and the supporting member.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1A:
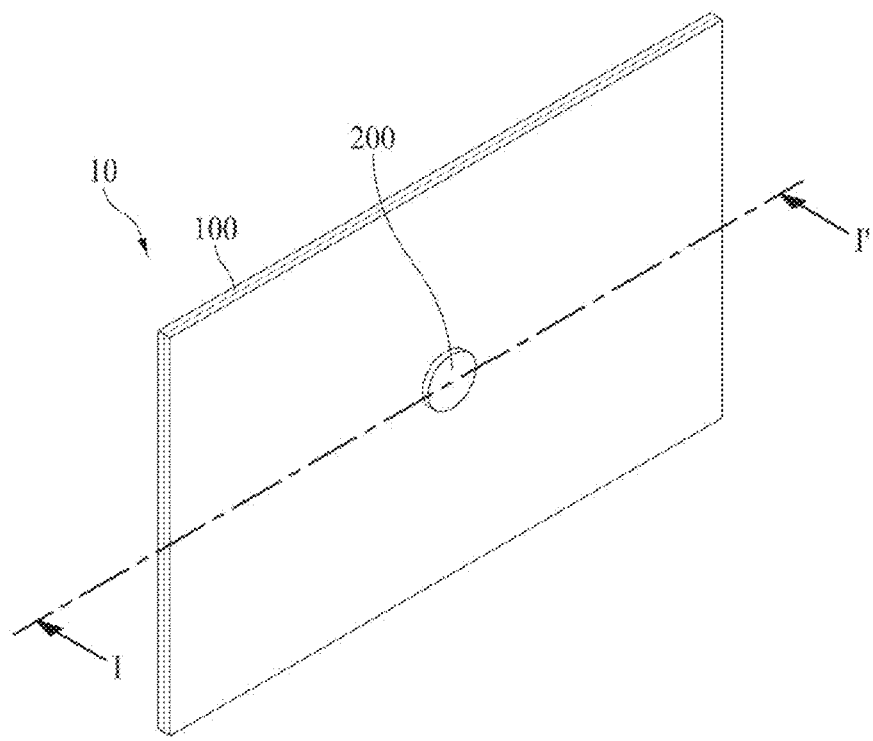
FIG. 1A illustrates a display apparatus including a sound-generating device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

Features of various embodiments of the present disclosure may be partially or overall coupled to or combined to each other, and may be variously inter-operated to each other and driven technically as those skilled in the art can sufficiently understand. Embodiments of the present disclosure may be carried out independently from each other, or may be carried out together in co-dependent relationship.

In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

In the present disclosure, examples of a display apparatus may include a narrow-sense display apparatus, such as an organic light-emitting display (OLED) module or a liquid crystal module (LCM), including a display panel and a driver for driving the display panel. Also, examples of the display apparatus may include a set apparatus or a set electronic apparatus, such as a notebook computer, a television (TV), a computer monitor, an automotive display or another type of equipment display including for vehicles, or a mobile electronic apparatus, such as a smartphone or an electronic pad, which is a complete product (or a final product) including an LCM or an OLED module. Therefore, in the present disclosure, examples of the display apparatus may include a narrow-sense display apparatus itself, such as an LCM or an OLED module, and a set apparatus, which is a final consumer apparatus or an application product including the LCM or the OLED module.

Depending on the case, an LCM or an OLED module including a display panel and a driver may be referred to as a "narrow-sense display apparatus," and an electronic apparatus that is a final product including an LCM or an OLED module may be referred to as a "set apparatus." For example, the narrow-sense display apparatus may include a display panel, such as an LCD or an OLED, and a source printed circuit board (PCB) that is a controller for driving the display panel. The set apparatus may further include a set PCB that is a set controller electrically connected to the source PCB to overall control the set apparatus.

A display panel applied to the present embodiment may use any type of display panels, such as a liquid crystal display panel, an organic light-emitting diode (OLED) display panel, and an electroluminescent display panel, but is not limited to any particular type of display panel that is vibrated by a sound generation device according to the present embodiment to output a sound. Also, a shape or a size of a display panel applied to a display apparatus according to the present embodiment is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin-film transistor (TFT), which is a switching element for adjusting a light transmittance of each of the plurality of pixels, an upper substrate including a color filter and/or a black matrix, and a liquid crystal layer between the array substrate and the upper substrate.

Moreover, if the display panel is the organic light-emitting diode display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT, which is an element for selectively applying a voltage to each of the pixels, an organic light-emitting device layer on the array substrate, and an encapsulation substrate on the array substrate to cover the organic light-emitting device layer. The encapsulation substrate may protect the TFT and the organic light-emitting device layer from an external impact, and may prevent water or oxygen from penetrating into the organic light-emitting device layer. Also, a layer provided on the array substrate may include an inorganic light-emitting layer (for example, a nano-sized material layer, a quantum dot, or the like). Alternatively, the layer provided on the array substrate may include a micro light-emitting diode.

Moreover, the display panel may further include a backing, such as a metal plate attached to the display panel. However, embodiments are not limited to the metal plate, and the display panel may include another structure.

In the present disclosure, the display panel may be applied to vehicles as a user interface module, such as a central control panel for automobiles. For example, the display panel may be provided between occupants sitting on two front seats for a vibration of the display panel to be transferred to the inside of a vehicle. Therefore, an audio experience in a vehicle is improved in comparison with a case in which speakers are on interior sides of the vehicle.

The present inventor has recognized the above-described problems, and have performed various experiments so that, when watching an image in front of a display panel, a traveling direction of a sound becomes a direction toward a front surface of the display panel, and thus, sound quality is enhanced. Through the various experiments, the present inventor has invented a display apparatus having a new structure, which outputs sound so that a traveling direction of the sound becomes a direction toward a front surface of a display panel, thereby enhancing sound quality.

A display apparatus according to an embodiment of the present disclosure may include a sound-generating device that may vibrate the display panel to generate sound, so that the sound of the display apparatus may be output to a region in front of the display panel. Accordingly, an immersion experience of a viewer who is watching an image displayed by the display apparatus may be enhanced.

Moreover, when the display apparatus according to an embodiment of the present disclosure includes the sound-generating device that vibrates the display panel to generate sound, a speaker may not be provided. Thus, a degree of freedom in design and element disposition of a set apparatus may be enhanced.

Moreover, according to an embodiment of the present disclosure, when the sound-generating device capable of being slimmed is provided, the sound-generating device may be provided between the display panel and the supporting member, thereby providing a display apparatus having a thin thickness. Moreover, according to an embodiment of the present disclosure, when the sound-generating device capable of being slimmed is provided, the sound-generating device may be provided between the display panel and the supporting member, thereby providing a display apparatus having a clean-looking design.

Moreover, according to an embodiment of the present disclosure, the first to third sound-generating devices may be provided, thereby providing a display apparatus having a three-channel, five-channel, or multiple channel sound output characteristic. Moreover, according to the embodiments of the present disclosure, a partition may be configured based on a shape of the display panel, thereby decreasing a wave phenomenon of the display panel.

Moreover, in the display apparatus according to an embodiment of the present disclosure, the partition and the one or more pad parts on the at least one side of the partition may be provided, and the partition and the pad parts may include different materials, thereby decreasing a wave phenomenon of the display panel, reducing or preventing the occurrence of an abnormal sound, and enhancing a sound output characteristic. Moreover, according to an embodiment of the present disclosure, the partition and the one or more pad parts on the at least one side of the partition may be provided, sound quality may be prevented from being reduced by the standing wave or the reflected wave which each occurs in the display panel, thereby providing a display apparatus having an enhanced sound output characteristic.

Moreover, according to an embodiment of the present disclosure, the partition and the one or more pad parts on the at least one side of the partition may be provided, the peak and the dip each caused by the standing wave may be reduced, thereby providing a display apparatus having an enhanced sound output characteristic. Moreover, according to an embodiment of the present disclosure, when the partition is configured based on a shape of the display panel and the one or more pad parts are provided on the at least one side of the partition, the wave phenomenon which is a defect occurring in the display panel is reduced, and the peak and the dip each caused by the standing wave are reduced, thereby providing a display apparatus having an enhanced sound output characteristic.

Moreover, according to an embodiment of the present disclosure, the partition may be configured based on a shape of the display panel, the one or more pad parts may be provided on the at least one side of the partition, and one or more elements may be provided on at least one side of the partition, thereby providing a display apparatus that reduces the wave phenomenon of the display panel and has an enhanced sound output characteristic. Moreover, according to an embodiment of the present disclosure, when the partition is provided between one or more sound-generating devices on the display panel, the partition may separate a sound, thus providing a display apparatus that may realize a stereo sound and may have an enhanced sound output characteristic.

Hereinafter, embodiments of the present disclosure will be described in detail with reference to the accompanying drawings.

FIG. 1A illustrates a display apparatus including a sound-generating device according to an embodiment of the present disclosure.

FIG. 1A illustrates a rear surface of a display apparatus 10. With reference to FIG. 1A, the display apparatus may include a display panel 100, which may display an image, and a sound-generating device 200. The sound-generating device 200 may vibrate the display panel 100 to generate sound. The sound-generating device 200 may be on a rear surface of the display panel 100. The display apparatus may include the sound-generating device 200, which may vibrate the display panel 100 to generate sound.

The display panel 100 may display an image (for example, an electronic image or a digital image), and may be implemented as any type of display panel, such as a liquid crystal display panel, an organic light-emitting diode (OLED) display panel, an electroluminescent display panel, etc. The display panel 100 may vibrate based on a vibration of the sound-generating device 200 to output a sound in a direction toward a front surface of the display panel 100.

According to an embodiment, the display panel 100 may display an image in a type, such as a top-emission type, a bottom-emission type, or a dual-emission type, based on a structure of a pixel array layer including an anode electrode, a cathode electrode, and an organic compound layer. In the top-emission type, visible light emitted from the pixel array layer may be irradiated onto a region in front of a base substrate to allow an image to be displayed. In the bottom-emission type, the visible light emitted from the pixel array layer may be irradiated onto a rearward region behind the base substrate to allow an image to be displayed.

Moreover, the sound-generating device 200 may generate sound using the display panel 100 as a vibration plate. The sound-generating device 200 may be referred to as an "actuator," an "exciter," or a "transducer," but is not limited thereto. For example, the sound-generating device 200 may be a sound device for outputting a sound according to an electrical signal.

Figure 1B:
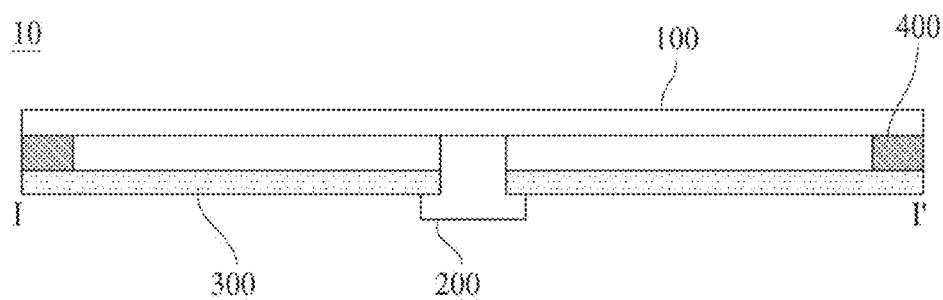
FIG. 1B is a cross-sectional view taken along line I-I' of FIG. 1A.

FIG. 1B is a cross-sectional view taken along line I-I' of FIG. 1A.

With reference to FIG. 1B, the display apparatus may include the sound-generating device 200 and a supporting member 300. The supporting member 300 may support one or more of a rear surface and a side surface of the display panel 100. Also, the sound-generating device 200 may be fixed to the supporting member 300.

The supporting member 300 may be, for example, a cover bottom. For example, the supporting member 300 may include a middle cabinet, which may be coupled to a cover bottom to surround the side surface (or a lateral surface) of the display panel 100, and may accommodate one edge of the display panel 100 to support the display panel 100. For example, the middle cabinet may include a sideways-'T' (⊢)-shaped cross-sectional surface. The supporting member 300 may include the cover bottom, or may include the cover bottom and the middle cabinet, but a structure thereof is not limited thereto. For example, the supporting member 300 may include an arbitrary structure that supports the rear surface and/or the side surface of the display panel 100.

Moreover, the supporting member 300 may be a plate member that may be provided on the rear surface of the display panel 100 or all over the display panel 100. For example, the supporting member 300 may cover the whole rear surface of the display panel 100 to be spaced apart from the rear surface of the display panel by a certain air gap or distance. Also, the supporting member 300 may have a plate shape formed of a glass material, a metal material, or a plastic material. Here, an edge or a sharp corner of the supporting member 300 may have a tetragonal (e.g., quadrilateral) shape or a curved shape, e.g., through a chamfer process or a corner rounding process. According to an embodiment, the supporting member 300 including the glass material may include sapphire glass. For example, the supporting member 300 including the metal material may include one or more of: aluminum (Al), an Al alloy, a magnesium (Mg) alloy, and an iron (Fe)-nickel (Ni) alloy. As another example, the supporting member 300 may have a stacked structure including a glass plate, which may have a thickness relatively thinner than each of a metal plate and a glass plate, and may face the rear surface of the display panel 100. For example, a rear surface of the display apparatus 10 may be used as a mirror surface due to the metal plate. However, the embodiments are not limited to the above materials or shape.

Moreover, the supporting member 300 may include a through-hole or a hole into which the sound-generating device 200 may be inserted or accommodated. The through-hole or hole may be located in a center of or off-center of the supporting member 300. For example, the through-hole or the hole may be bored in a certain partial region of the supporting member 300 along a thickness direction of the supporting member 300 to have a circular shape or a polygonal shape, for the sound-generating device 200 to be inserted or accommodated into the through-hole.

Moreover, in the present disclosure, the supporting member 300 may be referred to as a "cover bottom," a "plate bottom," a "back cover," a "base frame," a "metal frame," a "metal chassis," a "chassis base," or an "m-chassis." Therefore, the supporting member 300 may be a supporter for supporting the display panel 100, and may be implemented as any type of frame or plate structure, each on the rear surface of the display apparatus.

Moreover, an adhesive member 400 may be in a periphery of each of the display panel 100 and the supporting member 300. For example, the adhesive member 400 may be between the rear surface of the display panel 100 and an upper surface of the supporting member 300. The adhesive member 400 may attach the display panel 100 to the supporting member 300. Also, the adhesive member 400 may include a double-sided tape, a single-sided tape, an adhesive, a bond, and/or the like, but is not limited thereto.

Figure 2A:
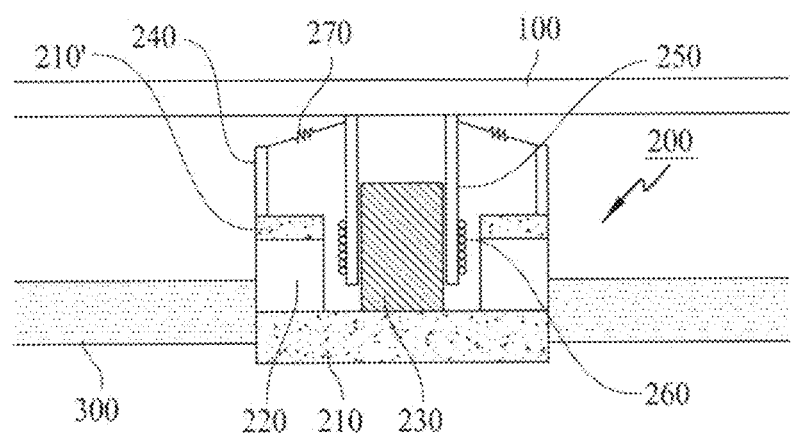
FIGS. 2A and 2B are cross-sectional views of a sound-generating device according to an embodiment of the present disclosure.
Figure 2B:
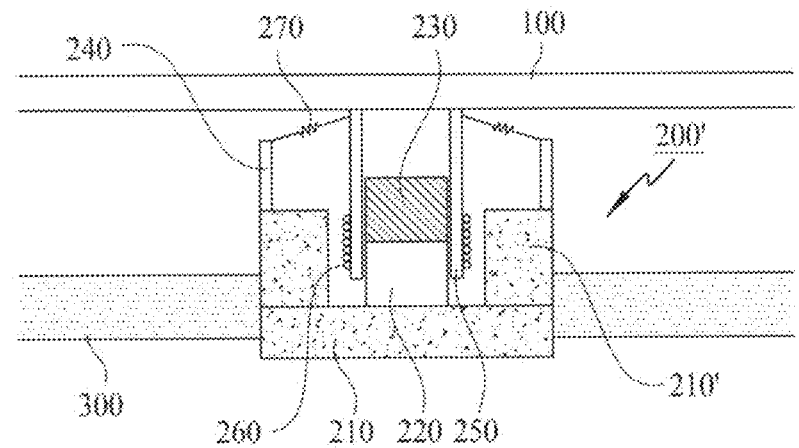

FIGS. 2A and 2B are cross-sectional views of a sound-generating device according to an embodiment of the present disclosure.

The sound-generating device may be classified into a first structure in which a magnet may be outside a coil, and a second structure in which a magnet may be inside a coil. The first structure may be referred to as a "dynamic type" or an "external magnetic type." The second structure may be referred to as a "micro type" or an "internal magnetic type." A part of the sound generating device may be fixedly attached to, or may contact, the rear side of the display panel. FIG. 2A illustrates the first structure, and FIG. 2B illustrates the second structure.

With reference to FIG. 2A, a sound-generating device 200 may include a plurality of plates (for example, first and second plates) 210 and 210', a magnet 220 on a corresponding plate, a center pole 230 on a corresponding plate, a bobbin 250 around the center pole 230, and a coil 260 wound around the bobbin 250.

For example, the magnet 220 may be on the first plate 210, and the second plate 210' may be on the magnet 220. The first plate 210 and the second plate 210' may support the magnet 220, and may fix the sound-generating device 200 to a supporting member 300. Therefore, the first plate 210 may be fixed to a supporting hole in the supporting member 300, and the magnet 220 may be fixed and supported between the first plate 210 and the second plate 210'.

At least one of the first plate 210 and the second plate 210' may include a material, such as iron (Fe). Each of the first plate 210 and the second plate 210' may be not limited to the term. For example, the first plate 210 or the second plate 210' may be referred to as a "yoke" or the like.

The magnet 220 may be implemented with a sintered magnet, such as barium ferrite, and a material of the magnet 220 may use iron (III) oxide ($Fe_2O_3$), barium carbonate ($BaCO_3$; "witherite"), a neodymium magnet, strontium ferrite ($Fe_{12}O_{19}Sr$), e.g., with an improved magnet component, an alloy cast magnet including Al, nickel (Ni), and cobalt (Co), and/or the like, but is not limited thereto. For example, the neodymium magnet may be neodymium-iron-boron (Nd—Fe—B). However, embodiments are not limited thereto.

A frame 240 may be on the second plate 210' along an edge of the first plate 210. A center pole 230 may be in a center region of the first plate 210. Also, the center pole 230 and the first plate 210 may be provided as one body. Also, the center pole 230 may be referred to as "pole pieces." For example, pole pieces may be further on the center pole 230.

The bobbin 250 may surround the center pole 230. The coil 260 may be wound around a lower region of the bobbin 250 (for example, an outer surface of the lower region of the bobbin 250), and a voice signal or a current for generating a sound may be applied to the coil 260. The bobbin 250 may be a ring-shaped structure, which may include paper, an Al sheet, and/or the like. The coil 260 may be wound around a certain lower region of the bobbin 250. The generic term for the bobbin 250 and the coil 260 may be a "voice coil."

Moreover, a damper 270 may be between the frame 240 and a portion of an upper portion of the bobbin 250. The damper may be referred to as an "edge" or the like.

FIG. 2B illustrates the second structure in which a magnet may be inside a coil. With reference to FIG. 2B, a sound-generating device 200' having the second structure may include a magnet 220 on a first plate 210, a center pole 230 on the magnet 220, a bobbin 250 around the magnet 220 and the center pole 230, and a coil 260 wound around the bobbin 250.

For example, the first plate 210 may be fixed to a supporting hole provided in a supporting member 300. The magnet 220 may be on the first plate 210, and the center pole 230 may be on the magnet 220. Also, the center pole 230 may be referred to as "pole pieces." For example, pole pieces may be further on the center pole 230.

The bobbin 250 may surround the magnet 220 and the center pole 230, and the coil 260 may be wound around the bobbin 250. A second plate 210' may be near the first plate 210, and a frame 240 may be outside the second plate 210'. For example, a damper 270 may be between the frame 240 and the bobbin 250.

In comparison with the first structure in which a magnet may be outside a coil, the second structure including an internal magnet may be small in leakage of magnetic flux, and may reduce a total size of a sound-generating device. The sound-generating device applied to the display apparatus according to an embodiment of the present disclosure is not limited to the first structure illustrated in FIG. 2A and the second structure illustrated in FIG. 2B. For example, the display apparatus according to an embodiment of the present disclosure may include another kind of sound-generating device, which may vibrate a display panel to generate sound.

Figure 3A:
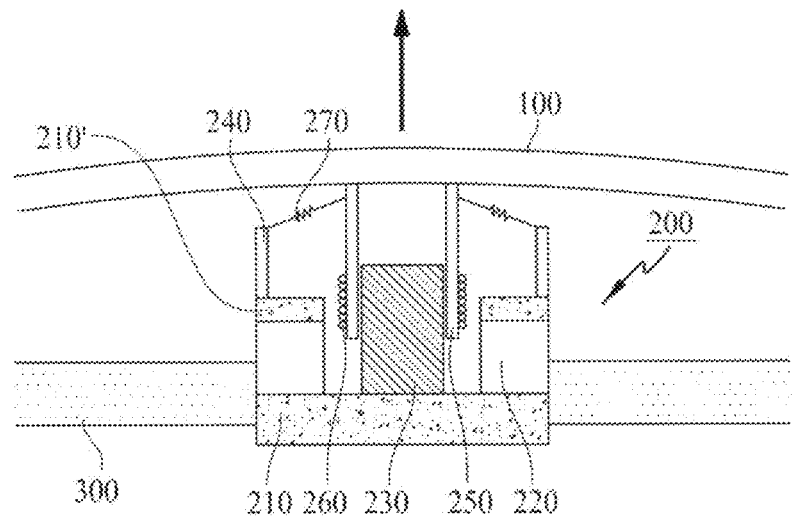
FIGS. 3A and 3B are diagrams for describing a sound generating operation performed by a sound-generating device having a first structure according to an embodiment of the present disclosure.
Figure 3B:
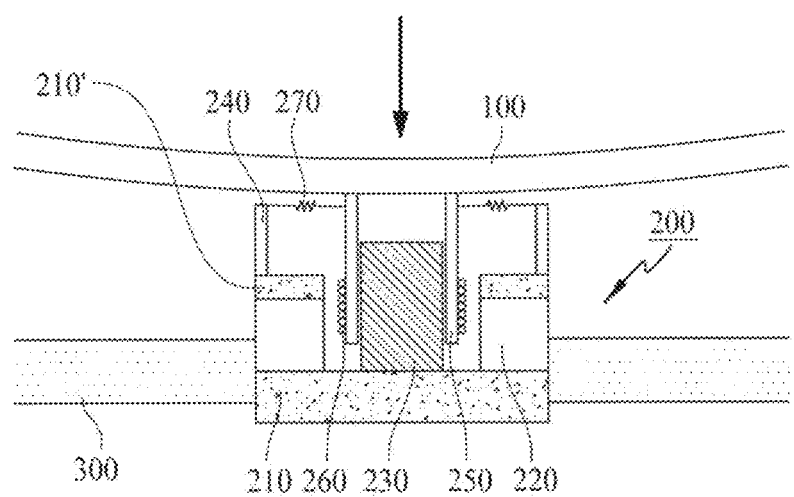

FIGS. 3A and 3B illustrate a sound generating operation performed by a sound-generating device having a first structure according to an embodiment of the present disclosure.

FIG. 3A illustrates a state in which a current may be applied. The center pole 230 connected to a lower surface of the magnet 220 may be a north (N)-pole, and the second plate 210' connected to an upper surface of the magnet 220 may be a south (S)-pole, and an external magnetic field may be generated around the coil 260. The north and south poles may be interchangeable.

In this state, when a current for generating a sound is applied to the coil 260, an application magnetic field may be generated around the coil 260, and a force for moving the bobbin 250 to an upper side may be generated by the application magnetic field and an external magnetic field. For example, when a current is applied to the coil 260, a magnetic field may be generated around the coil 260. Thus, the bobbin 250 may be guided by the center pole 230, and may move to the upper portion according to Fleming's Left-Hand Rule for Motors based on the generated magnetic field and the external magnetic field generated by the magnet 220.

Therefore, one surface of the bobbin 250 may contact a rear surface of the display panel 100. Thus, the bobbin 250 may vibrate the display panel 100 in an upward direction (illustrated by an arrow) according to whether a current is applied to the coil 260 or not, and a sound wave (or a sound) may be generated by the vibration of the display panel 100. In this state, when the application of the current stops or a reverse current is applied, as illustrated in FIG. 3B, a force for moving the bobbin 250 to a lower portion may be generated according to the principle similar to description given above with reference to FIG. 3A, and the display panel 100 may vibrate in a downward direction (illustrated by an arrow).

The damper 270 may be between a portion of an upper portion of the bobbin 250 and the frame 240. The damper 270 may be provided in a creased structure, and may be contracted and relaxed based on a vertical motion of the bobbin 250 to control a vertical vibration of the bobbin 250. For example, the damper 270 may be connected to the bobbin 250 and the frame 240. Thus, the vertical vibration of the bobbin 250 may be controlled by a restoring force of the damper 270. For example, when the bobbin 250 vibrates by a certain height or more or vibrates by a certain height or less, the bobbin 250 may be restored to an original position by the restoring force of the damper 270.

Therefore, the display panel 100 may vertically vibrate based on a direction and level of a current applied to the coil 260. A sound wave may be generated by the vibration.

Figure 4A:
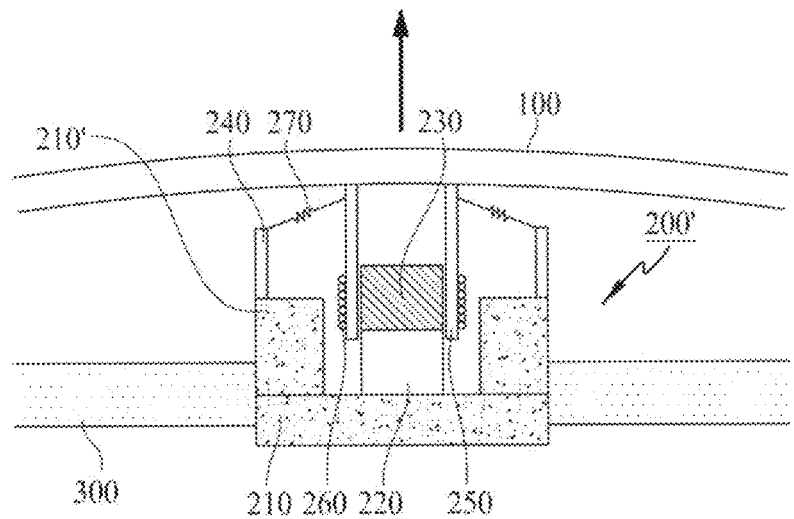
FIGS. 4A and 4B are diagrams for describing a sound generating operation performed by a sound-generating device having a second structure according to an embodiment of the present disclosure.
Figure 4B:
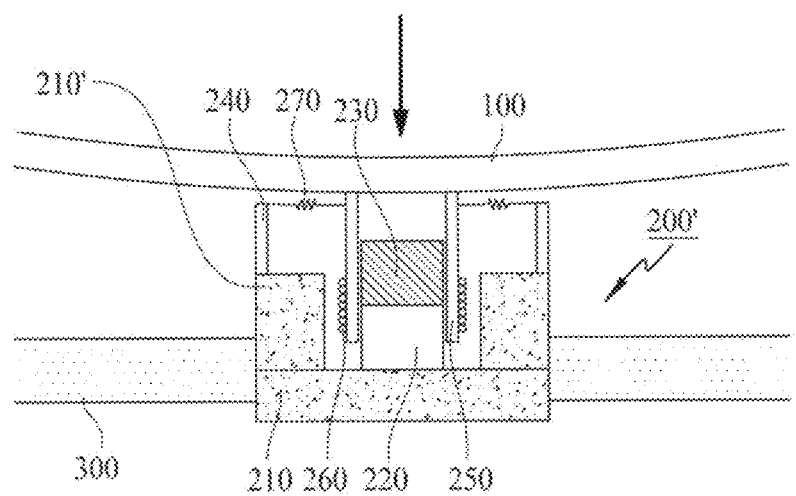

FIGS. 4A and 4B illustrates a sound generating operation performed by a sound-generating device having a second structure according to an embodiment of the present disclosure.

FIG. 4A illustrates a state in which a current may be applied. The second plate 210' may be an S-pole, and the center pole 230 connected to an upper surface of the magnet 220 may be an N-pole, whereby an external magnetic field may be generated around the coil 260. The S-pole and the N-pole may switch therebetween, and if the S-pole and the N-pole switches therebetween, the sound-generating device may identically operate by correcting a winding direction of the coil 260. In this state, when a current for generating a sound is applied to the coil 260, an application magnetic field may be generated around the coil 260, and a force for moving the bobbin 250 to an upper portion may be generated by the application magnetic field and an external magnetic field. For example, when a current is applied to the coil 260, a magnetic field may be generated around the coil 260. Thus, the bobbin 250 may be guided by the center pole 230, and may move to the upper portion according to Fleming's Left-Hand Rule for Motors based on the generated magnetic field and the external magnetic field generated by the magnet 220.

Therefore, one surface of the bobbin 250 may contact a rear surface of the display panel 100. Thus, the bobbin 250 may vibrate the display panel 100 in an upward direction (illustrated by an arrow) according to whether a current is applied to the coil 260 or not, and a sound wave (or a sound) may be generated by the vibration of the display panel 100. In this state, when the application of the current stops or a reverse current is applied, as illustrated in FIG. 4B, a force for moving the bobbin 250 to a lower portion may be generated according to the principle similar to description given above with reference to FIG. 4A, and the display panel 100 may vibrate in a downward direction (illustrated by an arrow).

Moreover, the damper 270 may be between a portion of an upper portion of the bobbin 250 and the frame 240. The damper 270 may be provided in a creased structure, and may be contracted and relaxed based on a vertical motion of the bobbin 250 to control a vertical vibration of the bobbin 250. For example, the damper 270 may be connected to the bobbin 250 and the frame 240. Thus, the vertical vibration of the bobbin 250 may be controlled by a restoring force of the damper 270. For example, when the bobbin 250 vibrates by a certain height or more or vibrates by a certain height or less, the bobbin 250 may be restored to an original position by the restoring force of the damper 270.

Therefore, the display panel 100 may vertically vibrate based on an application direction and level of a current applied to the coil 260. A sound wave may be generated by the vibration.

Figure 5:
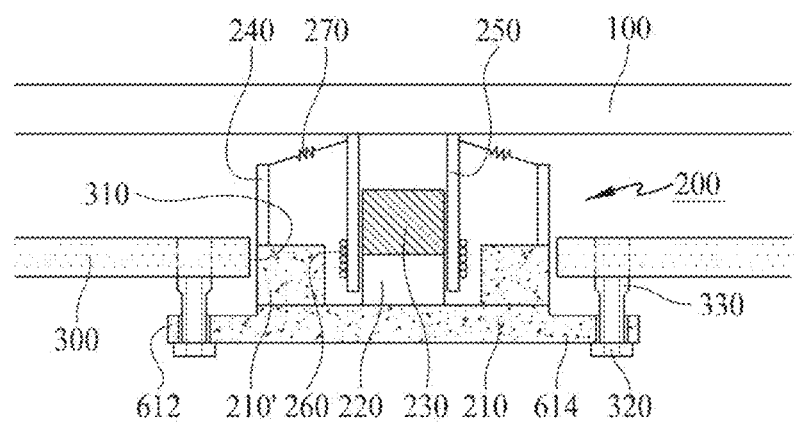
FIG. 5 illustrates a coupling structure of a supporting member and a sound-generating device according to an embodiment of the present disclosure.

FIG. 5 illustrates a coupling structure of a supporting member and a sound-generating device according to an embodiment of the present disclosure.

In an embodiment of the present disclosure, any of a sound-generating device having the first structure and a sound-generating device having the second structure may be applied. Hereinafter, a sound-generating device having the second structure will be described as an example.

With reference to FIG. 5, a sound-generating device 200 may include a diameter enlargement part 614. The diameter enlargement part 614 may be provided as one body with a first plate 210 of the sound-generating device 200. The first plate 210 of the sound-generating device 200 may not have a cylindrical shape. One side of the first plate 210 may include a protrusion that may be greater than a diameter of the other portion of the first plate 210. A protrusion region having an enlarged diameter may be referred to as a "diameter enlargement part 614." The diameter enlargement part 614 may be provided in a ring shape. Also, an extension part 612 for fixing the sound-generating device 200 may be provided in a portion of the diameter enlargement part 614.

A screw 320 and a nut 330 may be provided on the extension part 612. The sound-generating device 200 may be coupled to a supporting member 300 by the screw 320 using the nut 330 fixed to the supporting member 300. The nut 330 may be, for example, a self-clinching nut. An example of the self-clinching nut may include a PEM® nut, and the present embodiment is not limited thereto. Therefore, the sound-generating device 200 may be accommodated into the supporting hole 310 provided in the supporting member 300.

If the self-clinching nut is used, a portion of a vibration generated by the sound-generating device 200 may be absorbed by the self-clinching nut, which may be the nut 330. Thus, a vibration transferred to the supporting member 300 may be reduced. Moreover, the display panel 100 may be attached to the bobbin 250 of the sound-generating device 200.

Figure 6A:
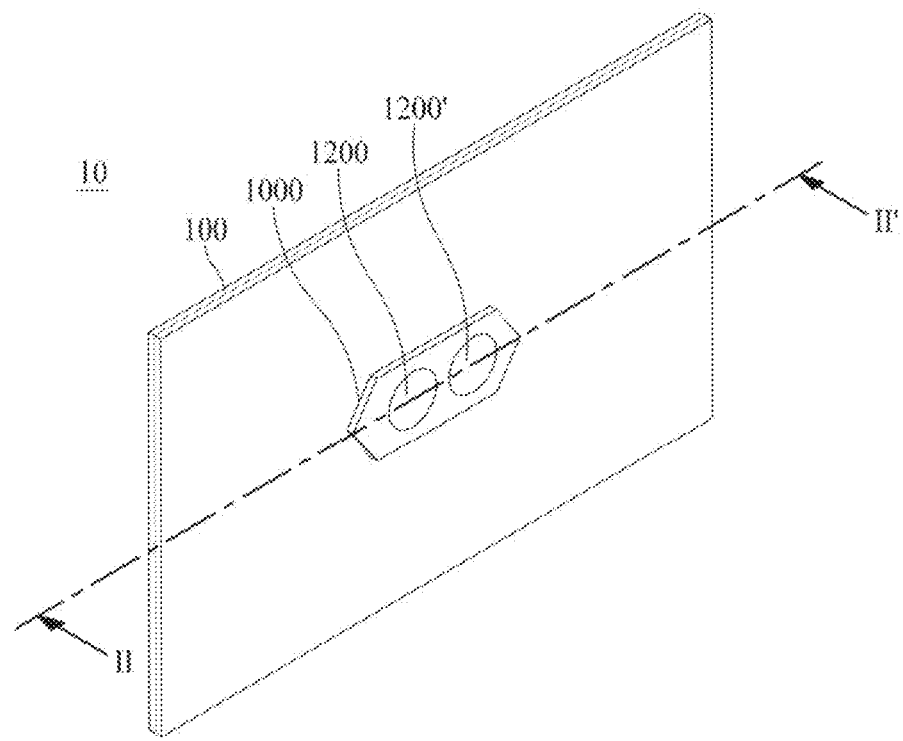
FIG. 6A illustrates a sound-generating device according to another embodiment of the present disclosure.
Figure 6B:
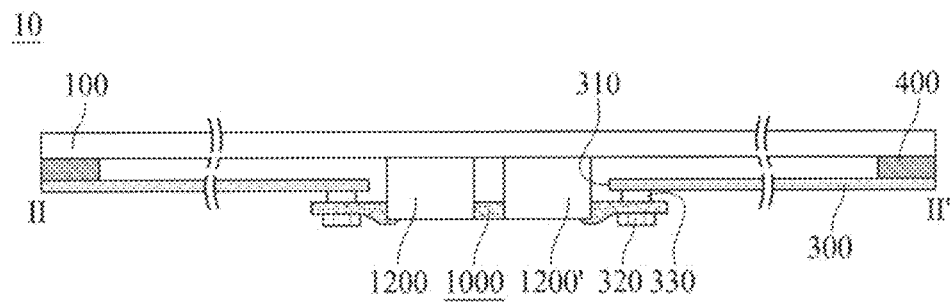
FIG. 6B is a cross-sectional view taken along line II-IF of FIG. 6A.

FIG. 6A illustrates a sound-generating device according to another embodiment of the present disclosure. FIG. 6B is a cross-sectional view taken along line II-IF of FIG. 6A.

With reference to FIG. 6A, a display apparatus 10 may include a display panel 100, which may display an image, and first and second sound-generating devices 1200 and 1200', which may vibrate the display panel 100 to generate sound. The first sound-generating device 1200 and the second sound-generating device 1200' may be adjacent to each other. When a plurality of sound-generating devices are apart from one another, it may be difficult to uniformly maintain a contact characteristic between the sound-generating devices and the display panel 100, and sound quality may be degraded due to interference and delay between the plurality of sound-generating devices. Therefore, in an embodiment of the present disclosure in which sound-generating devices are adjacent to each other, interference or delay between sound waves generated by the sound-generating devices may be reduced compared to when a plurality of sound-generating devices are apart from one another. Thus, a sound output characteristic may be enhanced.

The first structure or the second structure, each described above with reference to FIG. 2A or 2B, may be applied to a structure of each of the first sound-generating device 1200 and the second sound-generating device 1200'. Moreover, the display apparatus 10 may include a fixing device 1000 for fixing the first sound-generating device 1200 and the second sound-generating device 1200'. The fixing device 1000 may include a mold structure, which may include a material, such as plastic and/or the like, through a molding process, but is not limited thereto. The fixing device 1000 will be described below with reference to FIG. 7.

With reference to FIG. 6B, the display apparatus 10 may include the first sound-generating device 1200, the second sound-generating device 1200', and a supporting member 300. The supporting member 300 may support one or more of a rear surface and a side surface of a display panel 100. Also, the supporting member 300 may be a plate member, which may include a metal or plastic material, and may be provided on the rear surface of the display panel 100 or all over the display panel 100.

Moreover, the first sound-generating device 1200 and the second sound-generating device 1200' may be accommodated into a supporting hole 310 included in the supporting member 300. When the first sound-generating device 1200 and the second sound-generating device 1200' are inserted into and fixed to the supporting hole 310, a height of each of the first sound-generating device 1200 and the second sound-generating device 1200' between the rear surface of the display panel 100 and an inner surface of the supporting member 300 may be reduced. Thus, a space or a region for generating a sound may be small.

For example, the display apparatus may further include a nut 330 fixed to the supporting member 300, and the fixing device 1000 may be fixed to the nut 330 by a screw 320 inserted into a mounting hole or a hole of the fixing device 1000. For example, a screw-through-hole or a hole may be provided in an inner surface of the nut 330. Thus, after the mounting hole or the hole of the fixing device 1000 is aligned with the screw-through-hole or the hole of the nut 330, the fixing device 1000 may be fixed to the supporting member 300 by fastening the screw 320.

The nut 330 may be, for example, a self-clinching nut. An example of the self-clinching nut may include a PEM® nut. If the self-clinching nut is used, a portion of a vibration generated by each of the first and second sound-generating devices 1200 and 1200' may be absorbed by the self-clinching nut. Thus, a vibration transferred to the supporting member 300 may be reduced.

In the display apparatus according to the present embodiment, the supporting member 300 and the first and second sound-generating devices 1200 and 1200' may be fixed by the nut and the screw each included in the supporting member. Thus, a thickness of the display panel 100 may be reduced.

An adhesive member 400 may be in an edge of each of the display panel 100 and the supporting member 300, and may attach the display panel 100 on the supporting member 300. The adhesive member 400 may include a double-sided tape, a single-sided tape, an adhesive, a bond, and/or the like, but is not limited thereto.

Figure 7:
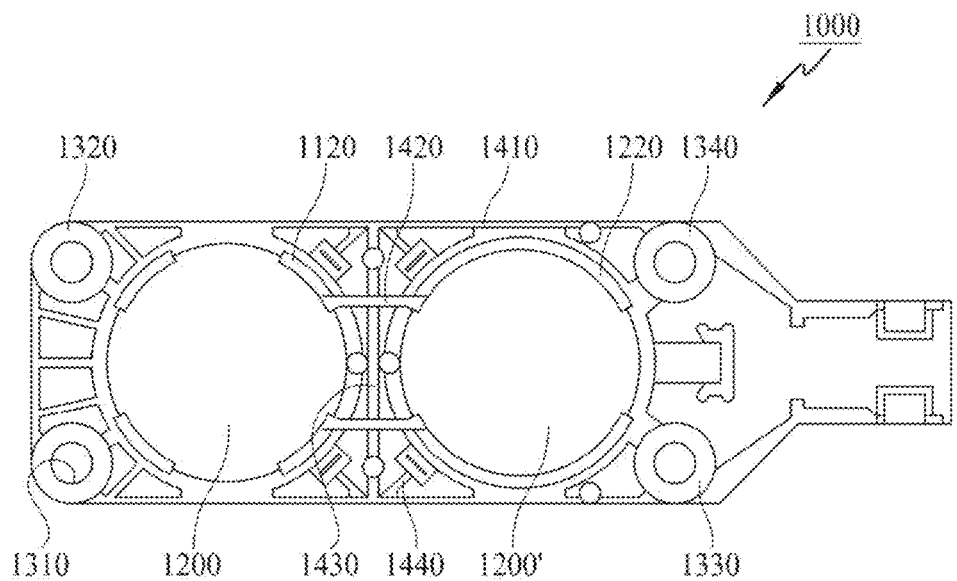
FIG. 7 illustrates a fixing device of a sound-generating device according to another embodiment of the present disclosure.

FIG. 7 illustrates a fixing device of a sound-generating device according to another embodiment of the present disclosure.

With reference to FIG. 7, a fixing device 1000 of the sound-generating device may be an integrated fixing device, which may fix and support a first sound-generating device 1200 and a second sound-generating device 1200' to be adjacent to each other. Therefore, the first sound-generating device 1200 and the second sound-generating device 1200', each fixed by the fixing device 1000, may be a pair of sound-generating devices, and may be referred to as a "pair of sound-generating devices."

The fixing device 1000 of the sound-generating device may include a supporting part that may support the first sound-generating device 1200 and the second sound-generating device 1200', a plurality of rib parts that may be near the first sound-generating device 1200 and the second sound-generating device 1200', and a plurality of mounting holes for fixing the fixing device 1000 to a supporting member 300.

For example, the supporting part may include a first supporting part 1120 that may support the first sound-generating device 1200 and a second supporting part 1220 that may support the second sound-generating device 1200'. The first supporting part 1120 may support a portion of each of a side surface and a rear surface of the first sound-generating device 1200. The first supporting part 1120 may have a cylindrical shape, but is not limited thereto. The second supporting part 1220 may support a portion of each of a side surface and a rear surface of the second sound-generating device 1200'. The second supporting part 1220 may have a cylindrical shape, but is not limited thereto.

For example, each of the first supporting part 1120 and the second supporting part 1220 may further include two or four arc-shaped protrusions. One surface of each of the protrusions may be bent to an inner side of each of the first and second sound-generating devices 1200 and 1200', and may support a portion of a rear surface of each of the first and second sound-generating devices 1200 and 1200', avoiding or preventing the first and second sound-generating devices 1200 and 1200' from deviating to the outside of the fixing device 1000 of the display apparatus.

A plurality of rib parts may be near the first supporting part 1120 and the second supporting part 1220 for maintaining a rigidity of the fixing device 1000 of the sound-generating device, and for avoiding or preventing the fixing device 1000 of the sound-generating device from being deformed even when being used for a long time. For example, the rib parts may include a first rib part 1410 that may extend in a widthwise direction from an outer portion of each of the first and second supporting parts 1120 and 1220, a second rib part 1420 that may connect the first supporting part 1120 to the second supporting part 1220 in the widthwise direction, and a third rib part 1430 that may be connected to the first rib part 1410 in a lengthwise direction. The widthwise direction may be a direction toward a long side along which a pair of sound-generating devices may be disposed. The lengthwise direction may be a direction vertical (or perpendicular) to the widthwise direction, the widthwise direction may be a widthwise direction of a display panel, and a lengthwise direction may be a lengthwise direction of the display panel. The first rib part 1410 may extend along a widthwise direction from an outer surface of each of the first and second supporting parts 1120 and 1220 to form a widthwise-direction outer structure of the fixing device 1000 of the sound-generating device.

A center region (e.g., a center region between the first supporting part 1120 and the second supporting part 1220) of the first rib part 1410 may be higher in height and thicker in thickness than both side regions of the first rib part 1410. Therefore, even when two sound-generating devices vibrate for a long time, a fixing device of each of the two sound-generating devices may not be deformed, and a relative position change between the two sound-generating devices and the display panel may be reduced.

One or more second rib parts 1420, which may be connected to the first supporting part 1120 and the second supporting part 1220 as one body, may be provided. The one or more second rib parts 1420 may be inward from the first rib part 1410.

In the example of FIG. 7, two second rib parts 1420 are illustrated as being provided, but are not limited thereto. For example, the second rib part 1420 may be provided as one, three, or more.

One or more third rib parts 1430 may be connected to the first rib part 1410 and the second rib part 1420 as one body. The one or more third rib parts 1430 may extend in the lengthwise direction, and may be between two second rib parts 1420 or two first rib parts 1410.

In the embodiment of FIG. 7, one third rib part 1430 may be illustrated and may extend along the lengthwise direction between two first rib parts 1410, but is not limited thereto. For example, the third rib part 1430 may extend by a shorter distance between two second rib parts 1420.

The rib part may further include one or more fourth rib parts 1440, which may obliquely extend between the first supporting part 1120 and the first rib part 1410 or between the second supporting part 1220 and the first rib part 1410. The fourth rib parts 1440 may reduce or prevent the bending deformation of the fixing device 1000 of the sound-generating device caused by the long-time driving of the sound-generating device.

Therefore, the display apparatus according to the present embodiment may include a fixing device for fixing a pair of sound-generating devices and a plurality of rib parts near the sound-generating devices. Accordingly, the rigidity of each sound-generating device may be maintained, and a display apparatus, in which a sound characteristic change caused by a long-time operation may be reduced, may be provided.

Moreover, a distance between the first supporting part 1120 and the second supporting part 1220 may be greater than a minimum threshold value that may enable a rib part to be formed, and may be less than a maximum threshold value corresponding to a diameter of each of the first sound-generating device 1200 and the second sound-generating device 1200'. If the distance between the first supporting part 1120 and the second supporting part 1220 is greater than the maximum threshold value, sound quality may be degraded. Therefore, the distance between the first supporting part 1120 and the second supporting part 1220 may be less than the diameter of each of the first sound-generating device 1200 and the second sound-generating device 1200'. Thus, the degradation in sound quality may be reduced or prevented. For example, when a size (or a diameter) of the sound-generating device is D, the distance between the first supporting part 1120 and the second supporting part 1220 may be greater than, e.g., about 7 mm, corresponding to an example of the minimum threshold value, and may be less than the size D of the sound-generating device. In an embodiment, it may be seen that the change in sound quality characteristic may be not greater when the size D of the sound-generating device is, e.g., about 28 mm, than when the size D of the sound-generating device is, e.g., about 0.85*D (e.g., about 23.6 mm).

A plurality of mounting holes 1310, 1320, 1330, and 1340 for fixing the fixing device 1000 to the supporting member 300 may be provided. The through-hole may be provided in the inner surface of the nut 330 illustrated in FIG. 6B. The mounting holes 1310, 1320, 1330, and 1340 of the fixing device 1000 and the through-hole of the nut 330 may be aligned. Then, by fastening the screw 320, the fixing device 1000 may be fixed to the supporting member 300.

Moreover, when a pair of sound-generating devices according to an embodiment of the present disclosure is applied, a uniform sound pressure may be generated in a whole frequency band. Thus, a good sound output characteristic may be realized.

As described above with reference to FIGS. 5 to 6B, a sound-generating device may be coupled to a display panel through a supporting hole of a supporting member. However, there may be a problem in which a rear surface of the supporting member needs the supporting hole or the hole, and external particles may penetrate into the inside of the display panel through the supporting hole. Also, because the sound-generating device may be exposed at the rear surface of the supporting member, a sense of aesthetic in appearance may be reduced by the sound-generating device exposed at the rear surface of the supporting member. Also, because a protection cover for protecting the sound-generating device may be needed for preventing damage of the sound-generating device exposed at the rear surface of the supporting member, there may be a problem in which a process of adding the protection cover may be needed or a thickness of the sound-generating device may be thickened by the protection cover.

Therefore, the present inventor has performed various experiments for configuring the sound-generating device, which may be provided in the display panel without being coupled to the supporting member by the supporting hole of the supporting member. Through the various experiments, the present inventor has recognized that a thickness of the sound-generating device should be reduced for configuring the sound-generating device in the display panel. When the sound-generating device is thick, the present inventor has recognized that there may be a problem in which a thickness of the display panel may be thickened, the image quality of the display panel or an image displayed by the display panel may be adversely affected, and a sense of aesthetic in appearance may be reduced. Therefore, to reduce a thickness of the sound-generating device, it may be required to reduce a thickness of each element included in the sound-generating device. For example, when a thickness of a magnet may be reduced, a magnetic flux density may decrease, causing a problem in which a sound pressure may be lowered. Also, when a height (or a thickness) of a bobbin is lowered, a winding width of a coil wound around the bobbin may be reduced. Thus, a magnetic force of the sound-generating device may be weakened, causing a problem in which an articulation of a tone may be reduced or a sound pressure may be lowered. Also, a line through which an electrical signal may be transferred to a coil may cause a problem in which an interference sound may occur in the sound-generating device due to interference by a damper. Therefore, through various experiments, the present inventor has invented a sound-generating device having a new structure, in which a thickness of the sound-generating device may be reduced by widening an area of the sound-generating device, and a sound may be not affected. It will be described with reference to FIGS. 8 to 10.

Figure 8:
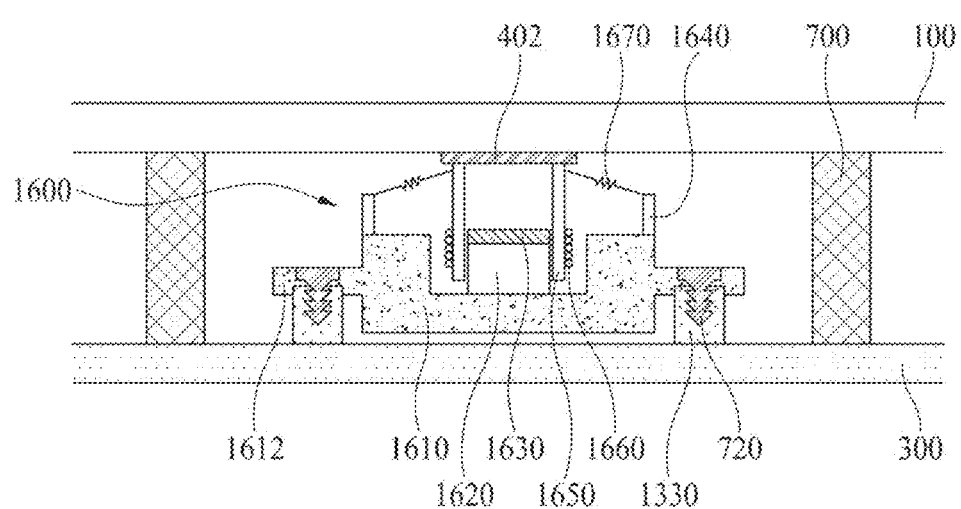
FIG. 8 illustrates a display apparatus according to another embodiment of the present disclosure.

FIG. 8 illustrates a display apparatus according to another embodiment of the present disclosure.

In an embodiment of the present disclosure, any of a sound-generating device having the first structure and a sound-generating device having the second structure may be applied. Hereinafter, the second structure will be described as an example.

With reference to FIG. 8, a sound-generating device 1600 may be between a display panel 100 and a supporting member 300. The sound-generating device 1600 may be in the display panel 100. For example, the sound-generating device 1600 may be between the display panel 100 and the supporting member 300.

The sound-generating device 1600 may include a magnet 1620 on a plate 1610, a center pole 1630 on the magnet 1620, a bobbin 1650 around the magnet 1620 and the center pole 1630, and a coil 1660 wound around the bobbin 1650. A frame 1640 may be outside the plate 1610. Also, a damper 1670 may be between the frame 1640 and the bobbin 1650. A description of the sound-generating device 1600 may be substantially similar to description given above with reference to FIGS. 2A and 2B, and thus, may be omitted.

A coupling member or connection member may be on an extension part 1612 of the plate 1610. For example, the coupling member may be on the supporting member 300. A screw 720 and a nut 1330, each corresponding to the coupling member, may be on the supporting member 300. The sound-generating device 1600 may be fixed to the supporting member 300 by the screw 720 and the nut 1330. The nut 1330 may be, for example, a self-clinching nut. An example of the self-clinching nut may include a PEM® nut, but the present embodiment is not limited thereto.

For example, in the sound-generating device 1600, the supporting member 300 may be coupled to the nut 1330 by a press-fitting manner without a supporting hole of the supporting member 300. The press-fitting manner may use a saw-toothed press-fitting manner, and the present embodiment is not limited to a coupling manner or a coupling shape. Therefore, the sound-generating device 1600 may be in the display panel 100. For example, the sound-generating device 1600 may be between the display panel 100 and the supporting member 300 by the coupling member or the connection member. Therefore, a sound-generating device may be in a display panel. Thus, a supporting hole of a supporting member may not be provided, thereby preventing penetration of external particles through the supporting hole of the supporting member. Also, when the sound-generating device is not exposed at a rear surface of the supporting member, a display apparatus having an aesthetic appearance may be provided, and damage of the sound-generating device may be reduced or prevented.

Moreover, the display panel 100 may be attached on the bobbin 1650 of the sound-generating device 1600 by an adhesive member 402. The adhesive member 402 may include a double-sided tape, a single-sided tape, an adhesive, a bond, and/or the like, but is not limited thereto. Also, as illustrated in the FIG. 8 example, the adhesive member 402 may be provided in a portion in which the sound-generating device 1600 may be attached on the display panel 100, but is not limited thereto. In other embodiments, the adhesive member 402 may be provided on a whole rear surface of the display panel 100. For example, the adhesive member 402 may be provided on a whole surface between the display panel 100 and the sound-generating device 1600.

A thickness of the sound-generating device 1600 should be thin for the sound-generating device 1600 to be disposed in the display panel 100. Therefore, the present inventor has designed a structure in which an area of a damper near a bobbin is wide, for solving a problem in which a height (or a thickness) of the bobbin may be lowered. The present inventor has recognized that, when an area of the damper is wide, a space of a line through which a current may be applied to a coil may be narrowed. Thus, interference between the line and the damper may occur. Therefore, through various experiments, the damper has been formed of a conductor to perform a function of each of the line and the damper. For example, the damper may include metal, but the present embodiment is not limited thereto. For example, the damper may include stainless steel, copper (Cu), and/or the like, but the present embodiment is not limited thereto.

FIGS. 9A to 9D illustrate examples of a sound-generating device according to another embodiment of the present disclosure.

Figure 9A:
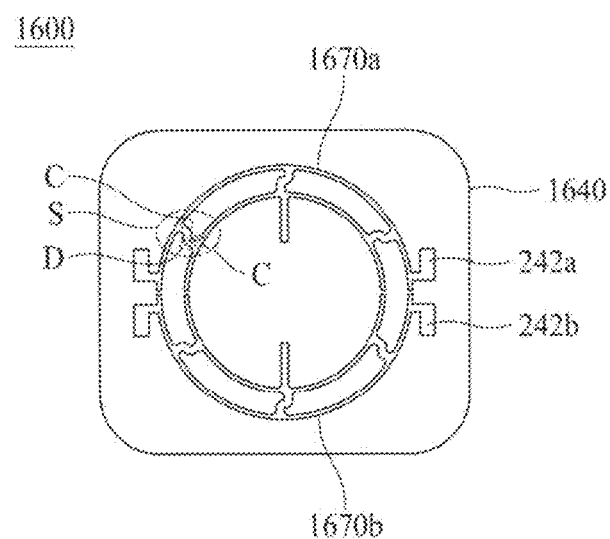
FIGS. 9A to 9D illustrate examples of a sound-generating device according to another embodiment of the present disclosure.
Figure 9B:
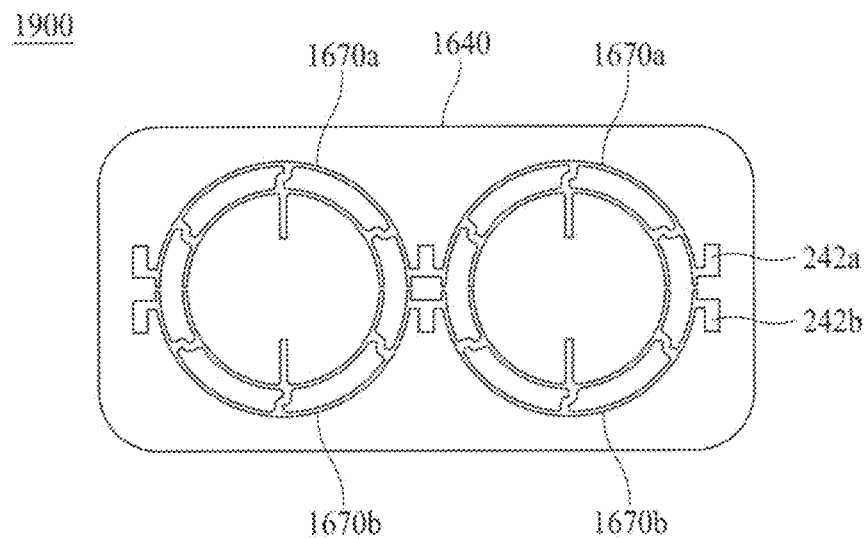
Figure 9C:
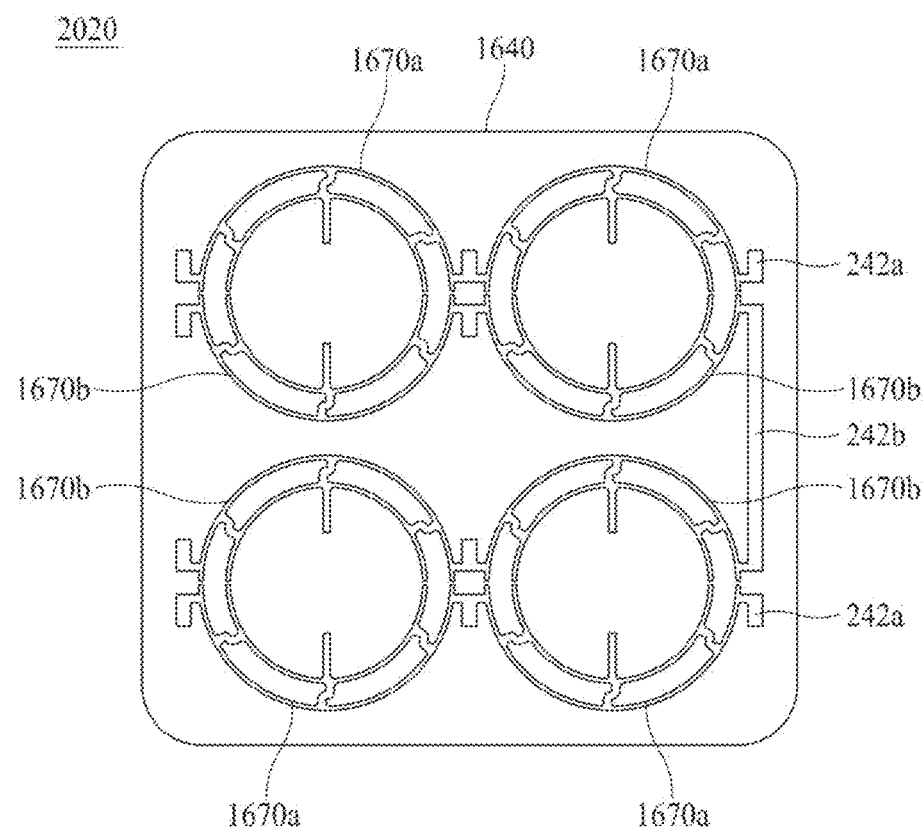
Figure 9D:
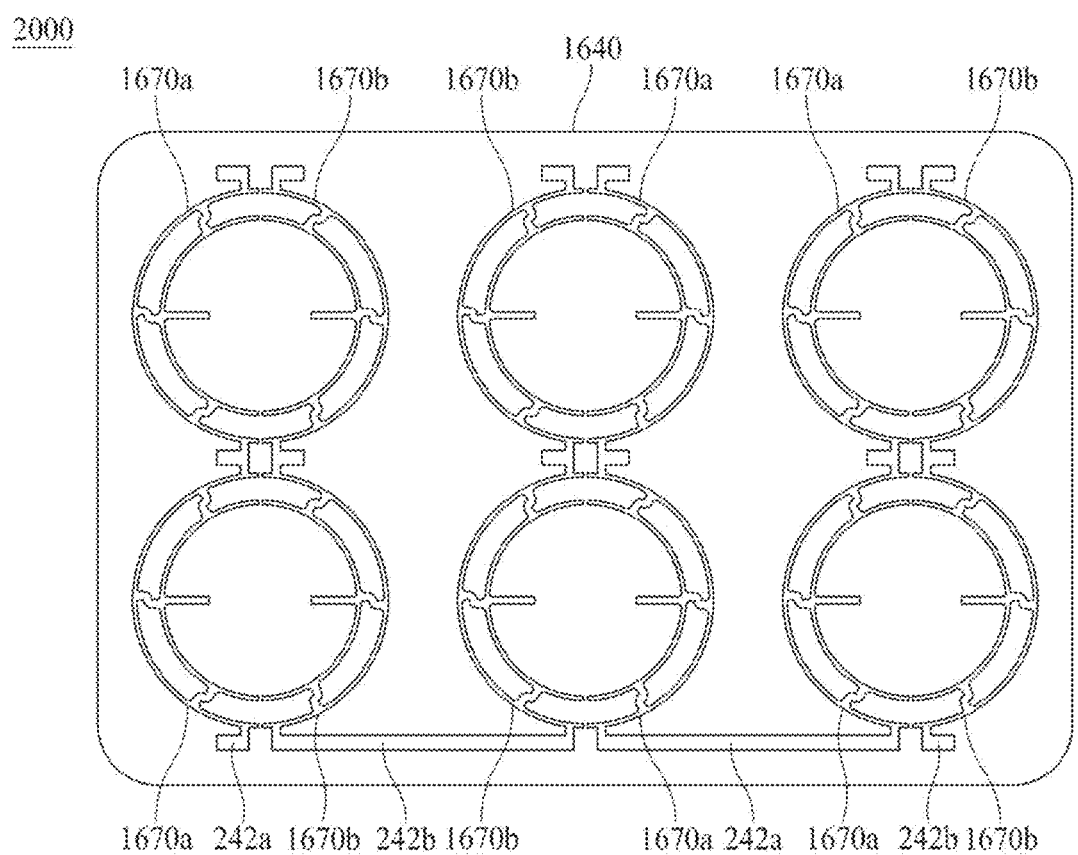

FIG. 9A illustrates one sound-generating device. FIG. 9B illustrates a two-device array in which two sound-generating devices may be provided. FIG. 9C illustrates a four-device array in which four sound-generating devices may be provided. FIG. 9D illustrates a six-device array in which six sound-generating devices may be provided. The sound-generating device according to the present embodiment may be configured as one sound-generating device or a sound-generating device having a two or more device array structure, but is not limited thereto.

With reference to FIGS. 9A to 9D, an area of a damper may be widely set for decreasing a thickness of a sound-generating device, and for enhancing the performance of a magnet. Also, the damper may include stainless steel, Cu, and/or the like, and thus, may be a line for applying a sound signal to the sound-generating device.

With reference to FIG. 9A, in a one-array sound-generating device 1600, a damper 1670 may be on a frame 1640. The one sound-generating device 1600 may be referred to as a "single type."

The damper 1670 may be configured to perform a function of a line, and thus, may include a first damper 1670a to which positive (+) power (or a sound signal) may be applied, and a second damper 1670b to which negative (−) power (or a sound signal) may be applied. The damper 1670 may be divided with respect to a widthwise direction. For example, the first damper 1670a, to which the positive power may be applied, may be an upper portion with respect to the front of the drawing, and the second damper 1670b, to which the negative power may be applied, may be a lower portion with respect to the front of the drawing. For example, the first damper 1670a may be connected to a first line 242a, and the second damper 1670b may be connected to a second line 242b. Also, a shape 'S' of the damper 1670 may be provided as a zigzag shape. When the damper 1670 may be configured diagonally, disconnection may occur due to a vertical motion of the damper 1670, and when a length of the damper 1670 is long, the damper 1670 may affect a resonance frequency. For example, a portion illustrated by 'C' and a portion illustrated by 'D' may be configured to have the same thickness and different widths, and disconnection may be avoided or prevented from occurring in an overlapping portion therebetween.

With reference to FIG. 9B, in a two-array sound-generating device 1900, a damper 1670 may be on a frame 1640. The two-array sound-generating device 1900 may be referred to as a "twin type."

A plurality of dampers may be connected to each other in parallel. The damper 1670 may be configured to perform a function of a line, and thus, may include a first damper 1670a to which positive (+) power may be applied, and a second damper 1670b to which negative (−) power may be applied. The damper 1670 may be divided with respect to a widthwise direction. For example, the first damper 1670a. to which the positive power may be applied. may be an upper portion with respect to the front of the drawing. and the second damper 1670b, to which the negative power may be applied, may be a lower portion with respect to the front of the drawing. For example, the first damper 1670a may be connected to a first line 242a, and the second damper 1670b may be connected to a second line 242b. For example, two first dampers 1670a may be connected as one body, and may be connected to the first line 242a; and two second dampers 1670b may be connected as one body, and may be connected to the second line 242b. A description of a shape of the damper 1670 may be the same as or similar to the description give above with respect to FIG. 9A.

With reference to FIG. 9C, in a four-array sound-generating device 2020, a damper 1670 may be on a frame 1640. The four-array sound-generating device 2020 may be referred to as a "quad type."

A plurality of dampers may be connected to one another in parallel and in series. The damper 1670 may be configured to perform a function of a line, and thus, may include a first damper 1670a, to which positive (+) power may be applied and a second damper 1670b to which negative (−) power may be applied. The damper 1670 may be divided with respect to a widthwise direction, and in this case, the first damper 1670a, to which the positive power may be applied, may be an upper portion with respect to the front of the drawing, and the second damper 1670b, to which the negative power may be applied, may be a lower portion with respect to the front of the drawing. Each of a plurality of first dampers 1670a may be connected to a first line 242a, and each of a plurality of second dampers 1670b may be connected to a second line 242b. For example, two first dampers 1670a may be connected as one body, and may be connected to the first line 242a; and two second dampers 1670b may be connected as one body, and may be connected to the second line 242b. A description of a shape of the damper 1670 may be the same as or similar to description give above with respect to FIG. 9A.

With reference to FIG. 9D, in a six-array sound-generating device 2000, a damper 1670 may be on a frame 1640. The six-array sound-generating device 2000 may be referred to as a "hexa type."

A plurality of dampers may be connected to one another in parallel and serially. The damper 1670 may be configured to perform a function of a line, and thus, may include a first damper 1670a to which positive (+) power may be applied, and a second damper 1670b to which negative (−) power may be applied. The damper 1670 may be divided with respect to a lengthwise direction. For example, in dampers disposed in a left portion and a right portion of the drawing, the first damper 1670a, to which the positive power may be applied, may be a left portion with respect to the front of the drawing, and the second damper 1670b, to which the negative power may be applied, may be a right portion with respect to the front of the drawing. It should be appreciated that the terms "left" and "right" are used herein for convenience of description and are interchangeable, and embodiments are not limited to these positions or terms. Each of a plurality of first dampers 1670a may be connected to a first line 242a, and each of a plurality of second dampers 1670b may be connected to a second line 242b. For example, two first dampers 1670a may be connected as one body, and may be connected to the first line 242a; and two second dampers 1670b may be connected as one body, and may be connected to the second line 242b. A description of a shape of the damper 1670 may be the same as or similar to description give above with respect to FIG. 9A.

Therefore, according to the present embodiment, when the sound-generating device according to an embodiment of the present disclosure is configured as a pair of sound-generating devices described above with reference to FIG. 7, a rib part for fixing the pair of sound-generating devices may not be needed. Thus, a process of fixing the pair of sound-generating devices may not be needed. Also, the sound-generating device may be without a supporting hole of a supporting member. Thus, a degree of freedom in disposition of the sound-generating device may be enhanced.

A line through which a sound signal may be applied to a sound-generating device will be described below with reference to FIG. 10.

Figure 10:
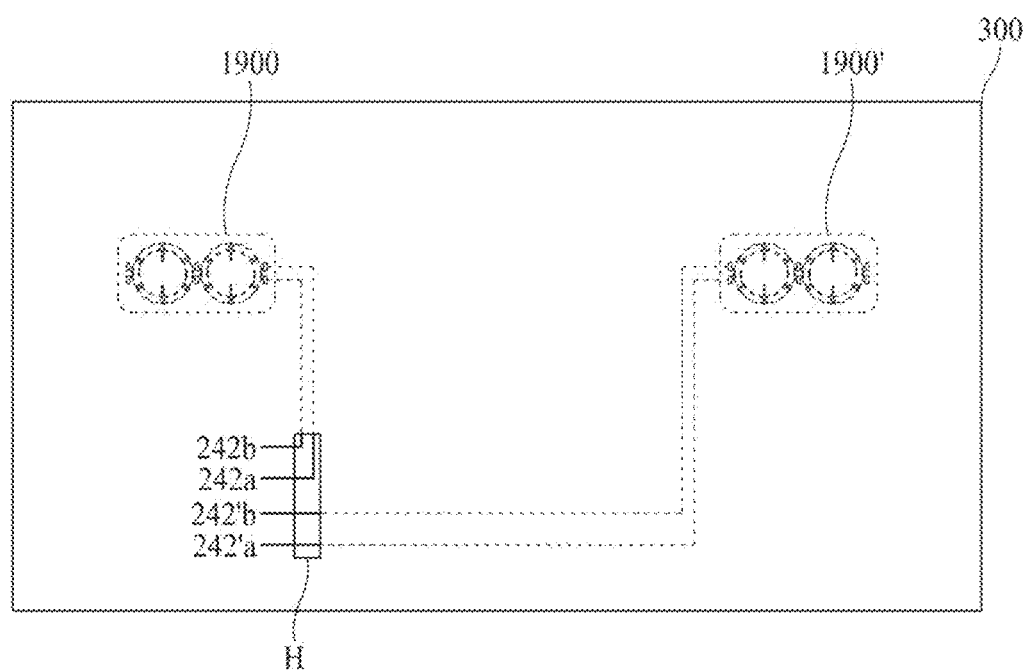
FIG. 10 illustrates a rear surface of a supporting member according to another embodiment of the present disclosure.

FIG. 10 illustrates a rear surface of a supporting member according to another embodiment of the present disclosure.

With reference to FIG. 10, a line, through which a sound signal may be applied to a sound-generating device, may be between a rear surface of a display panel 100 and a supporting member 300. A line 242a to which positive (+) power of a first sound-generating device 1900 may be applied, and a line 242b to which negative (−) power of the first sound-generating device 1900 may be applied, may be unloaded through a hole H, which may be provided in a rear surface of the supporting member 300. A line 242'a to which positive (+) power of a second sound-generating device 1900' may be applied, and a line 242'b to which negative (−) power of the second sound-generating device 1900' may be applied, may be unloaded through the hole H, which may be provided in the rear surface of the supporting member 300. An unloaded line and the hole H may be seen from the rear surface of the supporting member 300, and are illustrated by solid lines, and the other may be not seen from the rear surface of the supporting member 300 and are illustrated by dotted lines. The unloaded line may be covered by a rear cover. In a final product, a line and a sound-generating device may not be seen in appearance. Accordingly, a sense of aesthetic in appearance may be enhanced, and a display apparatus having a clean-looking design may be provided.

Figure 11:
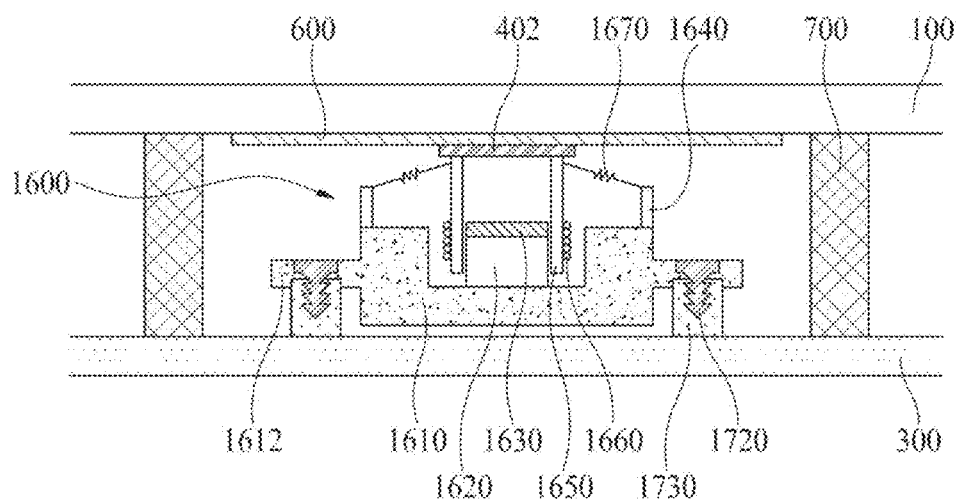
FIG. 11 illustrates a display apparatus according to another embodiment of the present disclosure.

FIG. 11 illustrates a display apparatus according to another embodiment of the present disclosure.

In an embodiment of the present disclosure, any of a sound-generating device having the first structure and a sound-generating device having the second structure may be applied. Hereinafter, the second structure will be described as an example. A description of a sound-generating device may be substantially similar to descriptions given above with reference to FIGS. 2 and 8 to 10, and thus, may be omitted.

With reference to FIG. 11, a heat dissipation member 600 may be on a rear surface of a display panel 100, e.g., for decreasing heat occurring when a sound-generating device 1600 is vibrating. For example, the heat dissipation member 600 may be on the rear surface of the display panel 100 using an adhesive member. The heat dissipation member 600 may cover the sound-generating device 1600 or may have a size greater than that of the sound-generating device 1600, and may have a polygonal plate shape or a circular plate shape, each having a certain thickness, but is not limited thereto. For example, the heat dissipation member 600 may be a heat dissipation sheet or a heat dissipation tape, each including a metal material that may be high in thermal conductivity, such as aluminum (Al), copper (Cu), silver (Ag), and an alloy thereof, but is not limited thereto. Accordingly, when the heat dissipation member 600 is provided, an influence of heat, occurring when the sound-generating device is vibrating, may be reduced on the image quality of the display panel 100.

Figure 12:
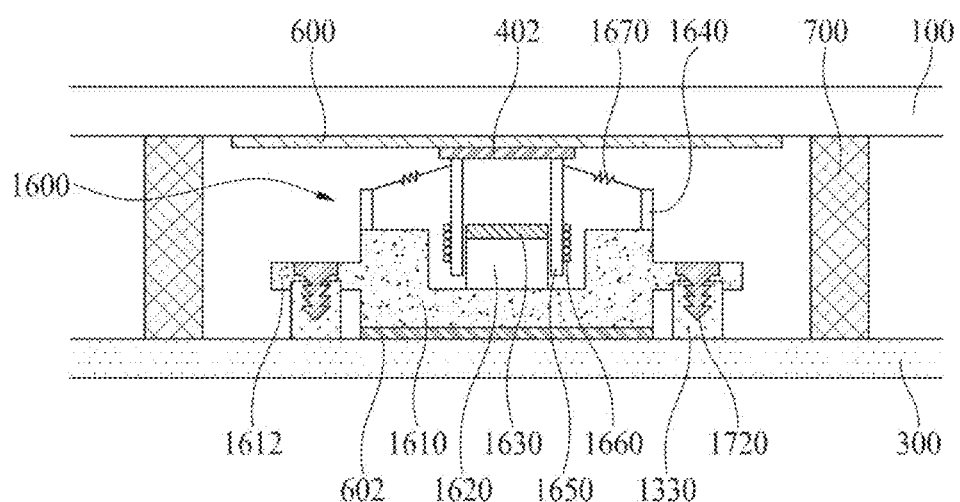
FIG. 12 illustrates a display apparatus according to another embodiment of the present disclosure.

FIG. 12 illustrates a display apparatus according to another embodiment of the present disclosure.

In an embodiment of the present disclosure, any of a sound-generating device having the first structure and a sound-generating device having the second structure may be applied. Hereinafter, the second structure will be described as an example. A description of a sound-generating device may be substantially similar to descriptions given above with reference to FIGS. 2 and 8 to 10, and thus, may be omitted. Also, a description of a heat dissipation member may be substantially similar to description given above with reference to FIG. 11, and thus, may be omitted.

With reference to FIG. 12, a pad 602 may be on a rear surface of a sound-generating device 1600. For example, the pad 602 may be between the sound-generating device 1600 and a supporting member 300. The pad 602 may further decrease heat occurring when the sound-generating device 1600 is vibrating, and may dissipate heat, occurring in the sound-generating device 1600, to the supporting member 300. The pad 602 may include a material having a thermal conduction capacity, and may dissipate heat to the outside. For example, the pad 602 may include a petroleum compound, including silicon (Si), but is not limited thereto. Also, the pad 602 may have an adhesive characteristic, and thus, may be attached on the rear surface of the sound-generating device 1600 without an adhesive member. However, the present embodiment is not limited thereto. For example, the pad 602 may be attached on a region between the rear surface of the sound-generating device 1600 and the supporting member 300 using the adhesive member. The pad 602 may be referred to as a "heat insulation (or heat blocking) pad," a "heat insulation (or heat blocking) film," or a "heat dissipation pad," but is not limited to the terms.

An encapsulation substrate may be on a rear surface of the display panel 100. For example, the encapsulation substrate may protect a thin-film transistor (TFT) and a light-emitting device layer, each provided in the display panel 100, against an external impact, and may reduce or prevent water or oxygen from penetrating into the light-emitting device layer. Also, the encapsulation substrate may include a ferromagnetic material, for example, a material, such as invar, which may be an Fe—Ni alloy. Thus, the present inventor has recognized that a magnetic force of a magnet of the sound-generating device provided in the display panel 100 may be absorbed by the encapsulation substrate, and therefore may be lost. The present inventor has recognized that the encapsulation substrate may be attracted by the magnetic force of the magnet. Thus, the sound-generating device may be pressed, and the sound-generating device may be unable to vibrate vertically. Also, the present inventor has recognized that the encapsulation substrate may be attracted by the magnetic force of the magnet, and may be adhered to the sound-generating device. Thus, a space enabling the sound-generating device to vibrate may be lost. Therefore, through various experiments, the present inventor has invented a display apparatus in which the leakage of a magnetic force of a sound-generating device may be reduced, and a space enabling the sound-generating device to vibrate may be not reduced. This will be described below with reference to FIGS. 13 and 14.

Figure 13:
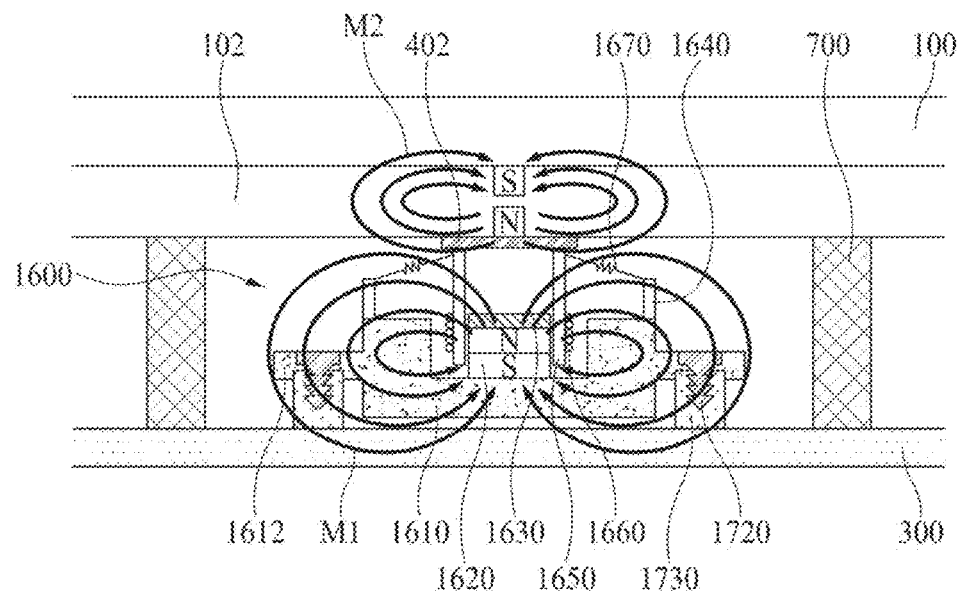
FIG. 13 illustrates a display apparatus according to another embodiment of the present disclosure.

FIG. 13 illustrates a display apparatus according to another embodiment of the present disclosure.

In an embodiment of the present disclosure, any of a sound-generating device having the first structure and a sound-generating device having the second structure may be applied. Hereinafter, the second structure will be described as an example. A description of a sound-generating device may be substantially similar to descriptions given above with reference to FIGS. 2 and 8 to 10, and thus, may be omitted.

With reference to FIG. 13, a sound-generating device 1600 may be between a display panel 100 and a supporting member 300. The sound-generating device 1600 may be in the display panel 100. An encapsulation substrate 102 may be on a rear surface of the display panel 100.

A description of a sound-generating device may be substantially similar to descriptions given above with reference to FIGS. 2 and 8 to 10, and thus, may be omitted. Also, a heat dissipation member described above with reference to FIG. 11 may be further provided, and a pad described above with reference to FIG. 12 may be further provided.

To decrease the loss, caused by the encapsulation substrate 102, of a magnetic force of a magnet 1620 of the sound-generating device 1600, a magnetic force of the encapsulation substrate 102 may be magnetized into a magnetic force opposite to the magnetic force of the magnet 1620 of the sound-generating device 1600. For example, a polarity of the magnetic force of the encapsulation substrate 102 may be opposite to that of the magnetic force of the magnet 1620 of the sound-generating device 1600. The encapsulation substrate 102 may generate a repulsive magnetic force with respect to the magnet 1620, and may maintain a distance between the encapsulation substrate 102 and the magnet 1620.

For example, as illustrated in the example of FIG. 13, when a magnetic-force direction of the magnet 1620 of the sound-generating device 1600 is M1, a magnetic-force direction of the encapsulation substrate 102 may be M2. Therefore, a magnetic force applied to a bobbin 1650 and a coil 1660 of the sound-generating device 1600 may be enhanced. Accordingly, a problem, in which the sound-generating device 1600 may be unable to vibrate vertically, which may be caused by the pressing of the sound generating device 1600 due to the attraction between the encapsulation substrate 102 and the magnet 1620, may be solved.

Also, a problem, in which a space enabling the sound-generating device 1600 to vibrate may be reduced when the encapsulation substrate 102 is attracted by the magnetic force of the magnet 1620 and is adhered to the sound generating device 1600, may be solved.

Figure 14:
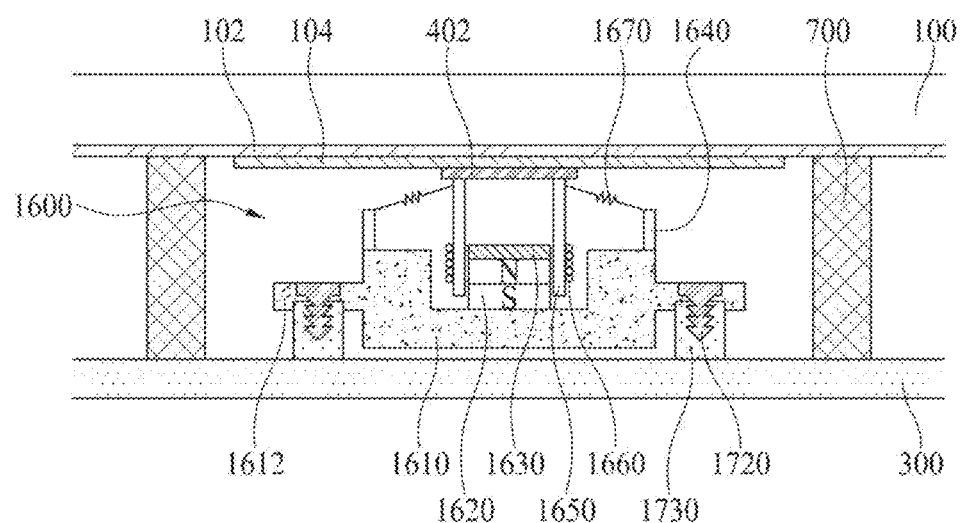
FIG. 14 illustrates a display apparatus according to another embodiment of the present disclosure.

FIG. 14 illustrates a display apparatus according to another embodiment of the present disclosure.

In an embodiment of the present disclosure, any of a sound-generating device having the first structure and a sound-generating device having the second structure may be applied. Hereinafter, the second structure will be described as an example. A description of a sound-generating device may be substantially similar to descriptions given above with reference to FIGS. 2 and 8 to 10, and thus, may be omitted.

With reference to FIG. 14, a sound-generating device 1600 may be between a display panel 100 and a supporting member 300. The sound-generating device 1600 may be in the display panel 100. An encapsulation substrate 102 may be on a rear surface of the display panel 100.

A description of a sound-generating device may be substantially similar to descriptions given above with reference to FIGS. 2 and 8, and thus, may be omitted. Also, a heat dissipation member described above with reference to FIG. 11 may be further provided, and a pad described above with reference to FIG. 12 may be further provided.

To decrease the loss, caused by an encapsulation substrate 102, of a magnetic force of a magnet 1620 of a sound-generating device 1600, a shielding sheet 104 may be on a rear surface of the encapsulation substrate 102, e.g., the surface facing the supporting member and the sound-generating device. The shielding sheet 104 may block or decrease a magnetic force that may be generated by at least one sound-generating device 1600, and may be transferred to the encapsulation substrate 102. The shielding sheet 104 may include, for example, a material that may be high in relative permeability. The relative permeability may be a relative evaluation indicator for a permeability of a material supporting generating of a magnetic field in the material. For example, the material may be a nickel-cobalt (Ni—Co) alloy, but is not limited thereto. In other embodiments, the material may be an alloy in which a ratio of Ni and Co may be adjusted to have magnetism that may be less than that of invar, which may be a material of the encapsulation substrate 102, but is not limited thereto. Therefore, the magnetic force of the magnet 1620 of the sound-generating device 1600 being absorbed by the encapsulation substrate 102 may be blocked or reduced. Accordingly, a problem, in which the sound-generating device 1600 may be unable to vibrate vertically, which may be caused by the pressing of the sound generating device 1600 due to the attraction between the encapsulation substrate 102 and the magnet 1620, may be solved. Also, a problem, in which a space enabling the sound-generating device 1600 to vibrate may be reduced when the encapsulation substrate 102 is attracted by the magnetic force of the magnet 1620 and is adhered to the sound generating device 1600, may be solved.

Figure 15A:
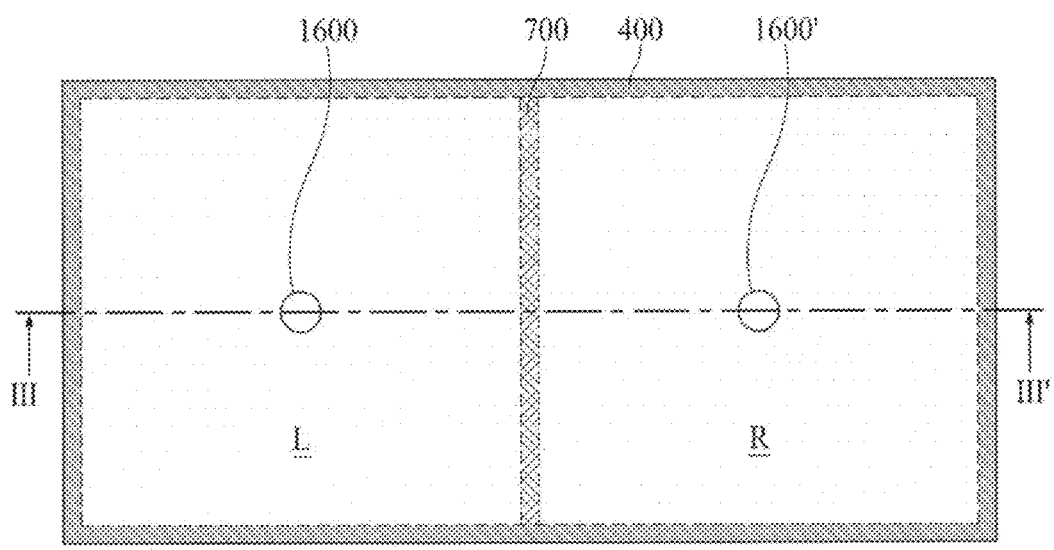
FIGS. 15A to 15C illustrate examples of an embodiment of each of a sound-generating device and a partition in a display apparatus according to an embodiment of the present disclosure.
Figure 15B:
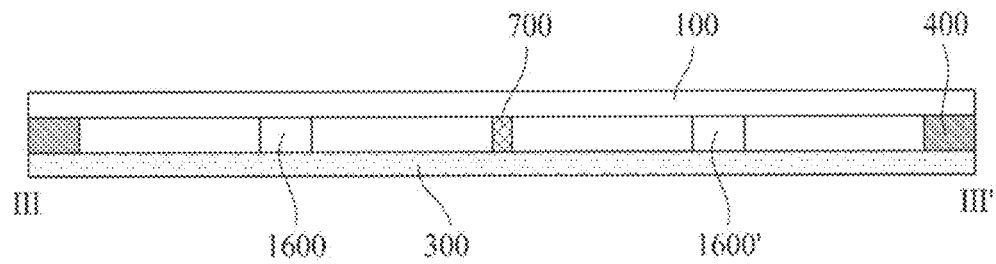
Figure 15C:
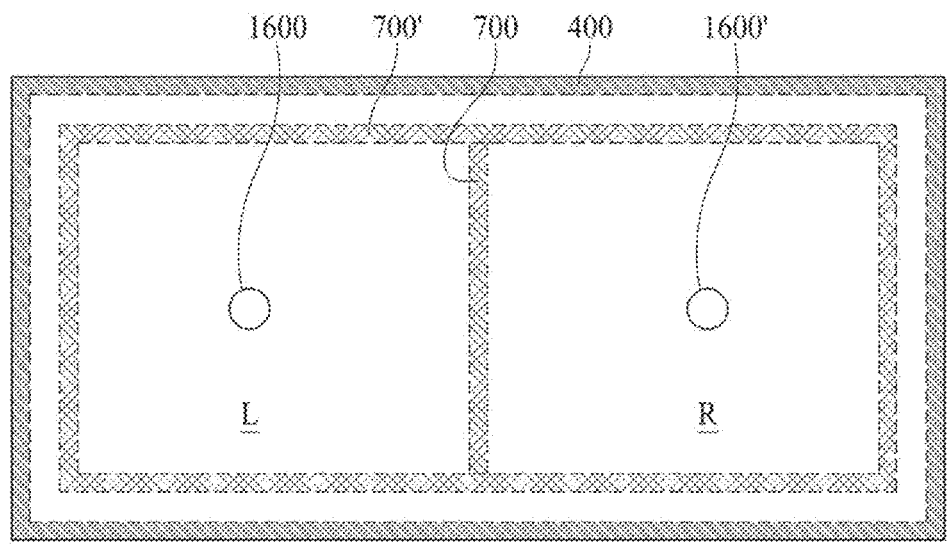

FIGS. 15A to 15C illustrate examples of an embodiment of each of a sound-generating device and a partition in a display apparatus according to an embodiment of the present disclosure.

With reference to FIG. 15A, a rear surface of a display panel 100 may include a first region L and a second region R. The first region L may be a left region of the rear surface of the display panel 100, and the second region R may be a right region of the rear surface of the display panel 100. As mentioned above "left" and "right" are non-limiting terms.

A first sound-generating device 1600 may be in the first region L of the rear surface of the display panel 100, and a second sound-generating device 1600' may be in the second region R of the rear surface of the display panel 100.

In FIGS. 15A to 15C, the sound-generating device of FIG. 5 will be described as an example, and the sound-generating device of each of FIGS. 9A to 9D may be applied similarly. Also, descriptions given above with reference to FIGS. 8 and 10 to 14 may be applied similarly.

A partition 700 may be between the first sound-generating device 1600 and the second sound-generating device 1600'. The partition 700 may be on a supporting member 300. For example, the partition 700 may be on a rear surface or an upper surface of the supporting member 300. Also, the partition 700 may be between a display panel and the supporting member 300. For example, the partition 700 may be between a rear surface of the display panel and the upper surface of the supporting member 300.

The partition 700 may be an air gap or a space in which sound may be generated when the display panel 100 vibrates by sound-generating devices 1600 and 1600'. An air gap or a space that may generate or transfer sound may be referred to as a "partition." A partition may be referred to as an "enclosure" or a "baffle," but the term is not limited thereto. The partition 700 may be a whole area of four outer sides of a rear surface of the display panel 100. Alternatively, the partition 700 may be a whole area of four outer sides of an upper surface of the display panel 100. Also, the partition 700 may be provided as a sealed structure, or may be provided as an unsealed structure.

The partition 700 may separate a left sound and a right sound respectively generated by the first sound-generating device 1600 and the second sound-generating device 1600'. Also, a vibration of the display panel 100, performed in a space or an air gap defined as the partition 700, may be attenuated or absorbed by a center of the display panel 100. Thus, sound generated in the left region may be reduced or prevented from being transferred to a space of the right region. Therefore, when the partition 700 is provided, the left sound and the right sound may be separated from each other, and thus, a sound output characteristic may be enhanced. Also, the first sound-generating device 1600 and the second sound-generating device 1600' may output different middle- and/or high-pitched sounds, and may output a stereo sound by separating the left and right sounds, thereby providing a display apparatus having a two-channel sound output characteristic.

The first sound-generating device 1600 and the second sound-generating device 1600' may output middle- and/or high-pitched sounds. Here, a middle-pitched sound may have a frequency band of about 200 Hz to 3 kHz, a high-pitched sound may have a frequency band of about 3 kHz or more, and a low-pitched sound may have a frequency band of about 200 Hz or less. However, embodiments of the present disclosure are not limited thereto.

The partition 700 may include polyurethane, polyolefin, and/or the like, but is not limited thereto. Also, the partition 700 may include a double-sided tape, a single-sided tape, an adhesive, a bond, and/or the like. For example, the partition 700 may include a material having an elastic force that enables compression to be made to a certain degree, and for example, may include polyurethane, polyolefin, polyethylene, and/or the like, but is not limited thereto.

Therefore, because a partition may be provided between two sound-generating devices, a left sound and a right sound may be separated from each other, thereby enhancing a stereo characteristic of a sound. Also, the middle- and/or high-pitched sounds may be output by the two sound-generating devices.

FIG. 15B is a cross-sectional view taken along line of FIG. 15A. With reference to FIG. 15B, a display apparatus may include a plurality of sound-generating devices 1600 and 1600', a partition 700, and a supporting member 300. The supporting member 300 may support one or more of a rear surface and a side surface (or a lateral surface) of the display panel 100. Also, the sound-generating devices 1600 and 1600' may be in a display panel 100.

An adhesive member 400 may be in a periphery of each of the display panel 100 and the supporting member 300, and may attach the display panel 100 to the supporting member 300. The adhesive member 400 may include a double-sided tape, a single-sided tape, an adhesive, a bond, and/or the like, but is not limited thereto.

FIG. 15C illustrates another example of a sound-generating device and a partition in a display apparatus according to an embodiment of the present disclosure. With reference to FIG. 15C, a partition 700 for separating a left sound and a right sound. respectively generated by a first sound-generating device 1600 and a second sound-generating device 1600' may be provided. Also, a first partition 700' may be further disposed along four outer sides of the supporting member 300. The first partition 700' may reduce or prevent the left sound and the right sound, respectively generated by a first sound-generating device 1600 and a second sound-generating device 1600', from being leaked to the outside through each side surface of a display panel 100. Thus, the sounds may be output only toward a forward region in front of the display panel 100, thereby enhancing a sound output characteristic.

The partition 700 and the first partition 700' may be on the supporting member 300. For example, the partition 700 and the first partition 700' may be on a rear surface or an upper surface of the supporting member 300. Also, the partition 700 and the first partition 700' may be between the display panel 100 and the supporting member 300. For example, the partition 700 and the first partition 700' may be between a rear surface of the display panel 100 and the upper surface of the supporting member 300.

When an adhesive member 400 includes a foam pad, the adhesive member 400 may perform a function of the first partition 700'. For example, the first partition 700' may not be provided. When the first partition 700' performs a function of the adhesive member 400, the adhesive member 400 may be omitted.

The partition 700 and the first partition 700' may each be formed of a double-sided tape, a single-sided tape, an adhesive, and/or a bond, each having a certain thickness (or height) and a certain width, but are not limited thereto. Also, the partition 700 and the first partition 700' may have an elastic force that may enable compression to be made to a certain degree, and for example, may include polyurethane, polyolefin, polyethylene, and/or the like, but are not limited thereto. Also, the partition 700 and the first partition 700' may each be referred to as a "foam pad" or the like, but the term is not limited thereto.

Figure 16A:
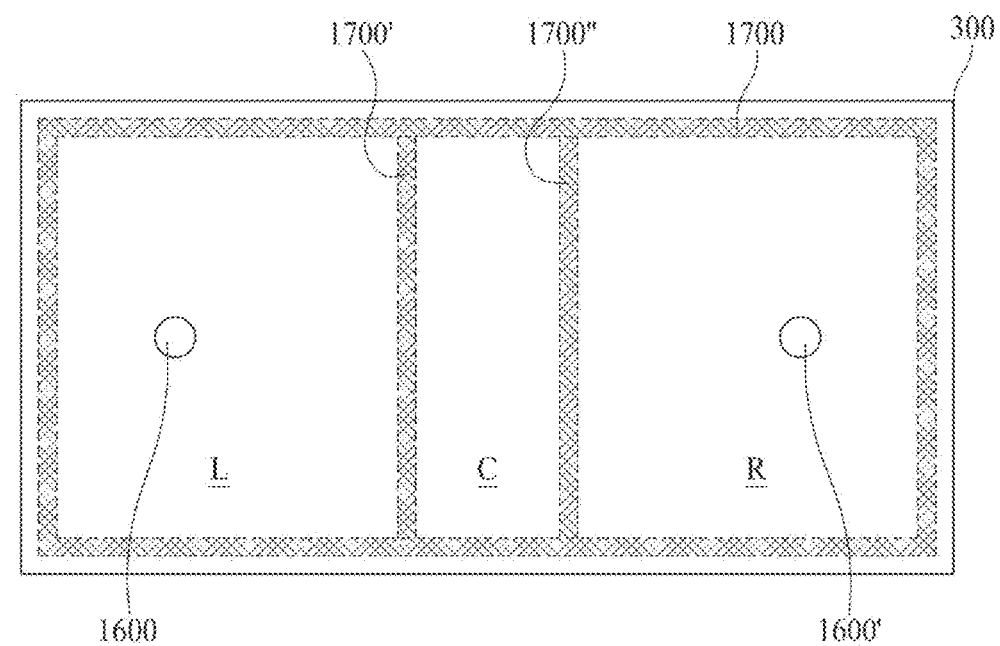
FIGS. 16A to 16C illustrate examples of an embodiment of each of a sound-generating device and a partition in a display apparatus according to an embodiment of the present disclosure.
Figure 16B:
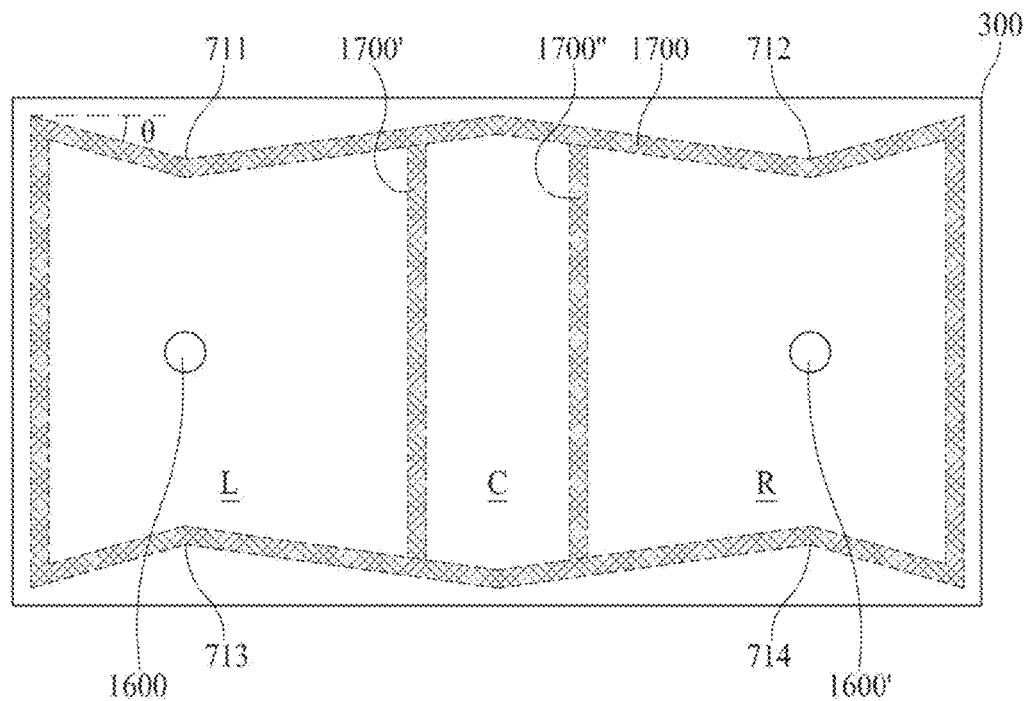
Figure 16C:
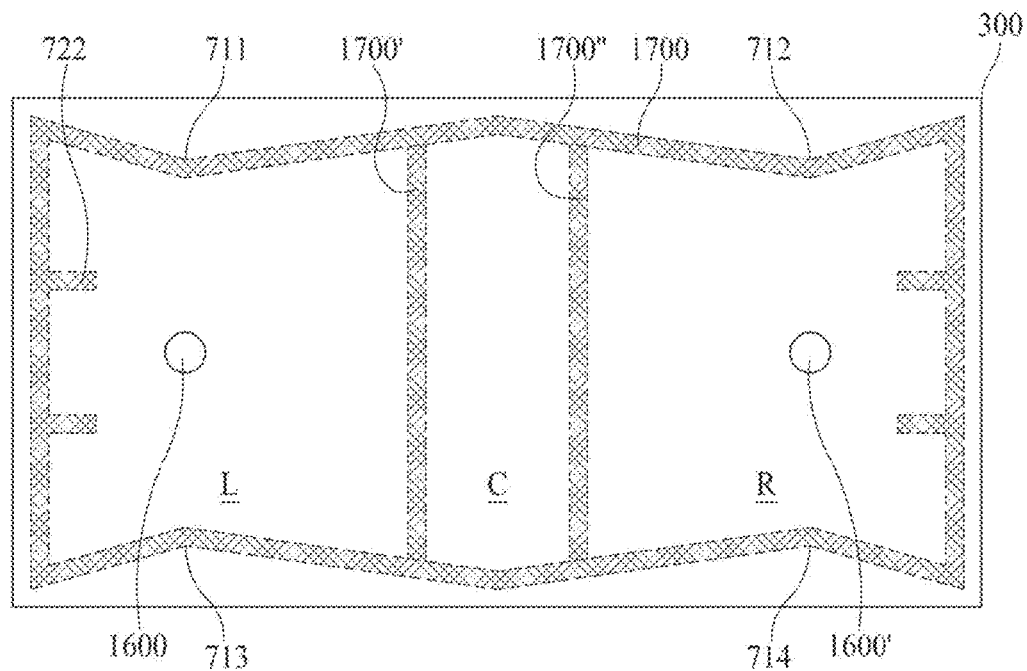

FIGS. 16A to 16C illustrate examples of an embodiment of a sound-generating device and a partition in a display apparatus according to an embodiment of the present disclosure.

As illustrated in FIGS. 16A to 16C, a partition having a double structure, including two or more partitions, may be provided. A partition having a double structure, including two or more partitions, may be provided between a first sound-generating device and a second sound-generating device. For example, a left region and a right region of a display panel may have the same vibration characteristic when realizing a mono sound in which the left and right regions output the same sound. Thus, a resonance phenomenon or an interference phenomenon may be increased or maximized in a certain frequency band, causing the reduction in sound pressure. Therefore, the partition may be configured in a structure including two or more partitions, for decreasing an influence of a sound characteristic caused by a resonance frequency difference of a middle-high sound that may occur in the first sound-generating device provided in the first region L (e.g., the left region) and the second sound-generating device provided in the second region R (e.g., the right region). In the example of FIGS. 16A to 16C, the partition having the double structure is illustrated, but three or more partitions may be provided. When three or more partitions are provided, a sound pressure may be avoided or prevented from being reduced even when sound interference in the left and right regions increases, thereby reducing or preventing a sound output characteristic from being discontinuously recognized.

The first sound-generating device and the second sound-generating device may output different middle- and/or high-pitched sounds, and may output a stereo sound by separating the left and right sounds. Also, the first sound-generating device may be provided in the first region L, which may be the left region; the second sound-generating device may be provided in the second region R, which may be the right region, and a sound-generating device may not be provided in a third region, which may be a center region. Accordingly, the degradation in sound quality caused by interference in the first region L and the second region R may be reduced. Also, a sound characteristic corresponding to each of the low-, middle-, and high-pitched sounds may be enhanced.

In FIGS. 16A to 16C, the sound-generating device of FIG. 5 will be described as an example, and the sound-generating device of each of FIGS. 9A to 9D may be applied similarly. Also, descriptions given above with reference to FIGS. 8 and 10 to 14 may be applied similarly.

With reference to FIG. 16A, a first sound-generating device 1600 may be provided in a first region L, which may be a left region of a rear surface of a display panel 100; and a second sound-generating device 1600' may be provided in a second region R, which may be a right region of the display panel 100. Also, at least two partitions (for example, a second partition 1700' and a third partition 1700") may be between the first sound-generating device 1600 and the second sound-generating device 1600'. One of the second partition 1700' and the third partition 1700" may include two or more sub-partitions between the first sound-generating device 1600 and the second sound-generating device 1600'. The second partition 1700' may be between the first region L and a third region C, and the third partition 1700" may be between the second region R and the third region C.

The first partition 1700 may surround the first region L, the second region R, and the third region C. The first partition 1700 may be in a periphery of a supporting member 300, or in a periphery of an upper surface of the supporting member 300. Also, the first partition 1700 may be between the display panel 100 and the supporting member 300. For example, the first partition 1700 may be between a rear surface of the display panel 100 and the upper surface of the supporting member 300.

Moreover, the first partition 1700, the second partition 1700', and the third partition 1700" may be on the rear surface of the display panel 100. The first partition 1700, the second partition 1700', and the third partition 1700" may be on a rear surface or the upper surface of the supporting member 300. Also, the first partition 1700, the second partition 1700', and the third partition 1700" may be between the display panel 100 and the supporting member 300. For example, the first partition 1700, the second partition 1700', and the third partition 1700" may be between the rear surface of the display panel 100 and the upper surface of the supporting member 300.

Therefore, two or more partitions may be provided in a center region of the display panel 100, thereby decreasing an influence of a sound characteristic caused by a resonance frequency difference of a middle- and/or high-pitched sound in the left region and the right region of the display panel 100.

A sound wave, which may be generated when a display panel vibrates by a sound-generating device (e.g., a vibration-generating device), may be spread radially from a center of the sound-generating device, and may travel. The sound wave may be referred to as a "progressive wave." The progressive wave may be reflected by one side of a partition to generate a reflected wave, and the reflected wave may travel in a direction opposite to the progressive wave. The reflected wave may overlap and interfere with the progressive wave, and may not travel, thereby generating a standing wave that may stand at a certain position. A sound pressure may be reduced by the standing wave, and thus, a sound output characteristic may be reduced. Therefore, a bent portion may be provided in the partition to decrease the degree of reduction in sound pressure caused by the standing wave generated by interference between the reflected wave and the progressive wave. Also, the standing wave, which may cause the sound pressure to be reduced, may be generated a great amount at a position at which a level of each of the progressive wave and the reflected wave may be high. Accordingly, the bent portion may be at a position at which a level of a sound wave transferred from the vibration-generating device may be highest. This will be described below with reference to FIGS. 16B and 16C.

FIGS. 16B and 16C illustrate examples of an embodiment in which a partition having a double structure including two or more partitions may be provided, and a bent portion may be further provided on at least one side of the partition.

With reference to FIGS. 16B and 16C, a first sound-generating device 1600 may be provided in a first region L, which may be a left region of a rear surface of a display panel 1001 and a second sound-generating device 1600' may be provided in a second region R, which may be a right region of the display panel 100. Also, a second partition 1700' and a third partition 1700" may be between the first sound-generating device 1600 and the second sound-generating device 1600'. Alternatively, one of the second partition 1700' and the third partition 1700" may include two or more sub-partitions provided between the first sound-generating device 1600 and the second sound-generating device 1600'.

The first partition 1700 may surround the first region L, the second region R, and a third region C. The first partition 1700 may be in a periphery of a supporting member 300. For example, the first partition 1700 may be in a periphery of an upper surface of the supporting member 300. Also, the first partition 1700 may be in a periphery of the display panel 100. For example, the first partition 1700 may be in a periphery of a rear surface of the display panel 100. Also, a plurality of bent portions 711 to 714 may be on one or more sides of the first partition 1700.

The bent portions 711 to 714 may be provided on one or more sides, which a strongest sound wave may reach, among four sides of the first partition 1700, and may face first and second sound-generating devices 1600 and 1600'. For example, the bent portions 711 and 713 may face the first sound-generating device 1600, and the bent portions 712 and 714 may face the second sound-generating device 1600'. Accordingly, the degree of reduction in a sound pressure caused by a standing wave may be reduced.

The rear surface of the display panel 100 or the upper surface of the supporting member 300 may include four sides, and the bent portions 711 to 714 may be provided on one or more sides of the four sides. Also, a bent portion may be provided on each of two sides (for example, an upper side and a lower side) of four sides surrounding the display panel 100 or the supporting member 300 to have a certain inclined angle "θ" with respect to a horizontal direction (or a widthwise direction) of the display panel 100. Also, the inclined angle "θ" of the bent portion 711 may vary based on a degree to which restriction of the standing wave may be desired, and may be variably adjusted to 10° (degrees) to 30° (degrees). For example, if a sound output region is for the low-pitched sound or an output of a sound-generating device is large, the inclined angle of the bent portion 711 may be a large angle. Alternatively, if the sound output region is for the high-pitched sound or the output of the sound-generating device is small, the inclined angle of the bent portion 711 may be a small angle. The inclined angle may be applied identically or similarly to the bent portions 712 to 714. The inclined angle of the bent portion 711 may be an angle at which one side of the first partition 1700 is inclined with respect to a horizontal direction (or a widthwise direction) of the display panel 100. Also, the horizontal direction (or the widthwise direction) may correspond to a direction of a long side of a display device, and a vertical direction (or a lengthwise direction) may correspond to a direction of a short side of the display device.

Each of the bent portions 711 to 714 may be configured with two rectilinear parts, and may be provided at a position at which the two rectilinear parts contact each other. The bent portions 711 to 714 may each be provided in a rectilinear shape, a curve shape, a round shape, or the like, but a shape of each of the bent portions 711 to 714 is not limited thereto.

Moreover, the first partition 1700 may be provided in a bent shape between the second partition 1700' and the third partition 1700", or may be provided in an unbent shape. Also, the bent shape may face the supporting member 300. The first partition 1700 may be provided in a bent shape, a rectilinear shape, a curve shape, or a round shape between the second partition 1700' and the third partition 1700", but a shape of the first partition 1700 is not limited thereto.

Moreover, the first partition 1700 may be provided in a zigzag shape or a bow necktie shape. When the first partition 1700 is provided in a zigzag shape or a bow necktie shape, the first partition 1700 may be provided in a zigzag shape or a bow necktie shape between the second partition 1700' and the third partition 1700", or may not be provided in a zigzag shape or a bow necktie shape.

With reference to FIG. 16C, the bent portions 711 to 714 and one or more protrusion portions 722 and 724 may be provided. For example, the bent portions 711 to 714 may be provided on one or more sides of the first partition 1700, and the one or more protrusion portions 722 and 724 may be provided on a side vertical to a side on which the bent portions 711 to 714 may be provided. The protrusion portion 722 in the first region L of the display panel 100 may face the first sound-generating device 1600. Also, the protrusion portion 724 in the second region R of the display panel 100 may face the second sound-generating device 1600'.

The protrusion portions 722 and 724 may trap a reflected wave, thereby decreasing the degree of reduction in a sound pressure caused by the standing wave. Also, the protrusion portions 722 and 724 may be provided as one or as a plurality on each of one or more sides of the first partition 1700, and the one or more protrusion portions 722 and 724 may be symmetrically disposed with respect to the sound-generating device. In FIG. 16C, the one or more protrusion portions 722 and 724 may be provided on one or more of a first side and a second side, vertical to the first side, among four sides of the display panel 100.

In FIGS. 16A to 16C, the first partition 1700 may be provided as a sealed structure, or the first partition 1700 may be provided as an unsealed structure. If the first partition 1700 is provided in the unsealed structure, the cost of materials of the first partition 1700 may be reduced in comparison with the sealed structure. Also, the present inventor has confirmed that a sound characteristic difference does not occur between a case in which the first partition 1700 is provided in the unsealed structure and a case in which the first partition 1700 is provided in the sealed structure.

In FIGS. 16A to 16C, the display panel 100 may include three regions, and a sound-generating device may not be provided in the third region C, which may be a center region of the display panel 100. Also, an area of the third region C may be less than each of an area of the first region L and an area of the second region R. Accordingly, the low-pitched sound may be enhanced. Also, the third region C may decrease the degradation in sound quality caused by interference in the first region L and the second region R. Accordingly, each of the low-, middle-, and high-pitched sounds may be enhanced.

FIGS. 16A to 16C illustrate examples of an embodiment in which the sound-generating device may be in the left region or the right region, without being disposed in a center of the left region (the first region L) or the right region (the second region R) of the display panel 100, but the present embodiment is not limited thereto. For example, the sound-generating device may be in the center of the left region (the first region L) or the right region (the second region R) of the display panel 100. Alternatively, the sound-generating device may be asymmetrically disposed in the left region (the first region L) and the right region (the second region R) of the display panel 100. A stereo sound characteristic may be more enhanced when the sound-generating device is in the left region or the right region, than when the sound-generating device is in the center of the left region (the first region L) or the right region (the second region R) of the display panel 100.

A sound output characteristic corresponding to a case in which a bent portion is provided will be described below with reference to FIG. 17. Also, a sound output characteristic corresponding to a case in which a bent portion and a protrusion portion are provided will be described below with reference to FIG. 18. Experiment results relevant thereto may be the same as or similar to an experiment result of a case in which the sound-generating device of each of FIGS. 9A to 9D may be applied.

Figure 17:
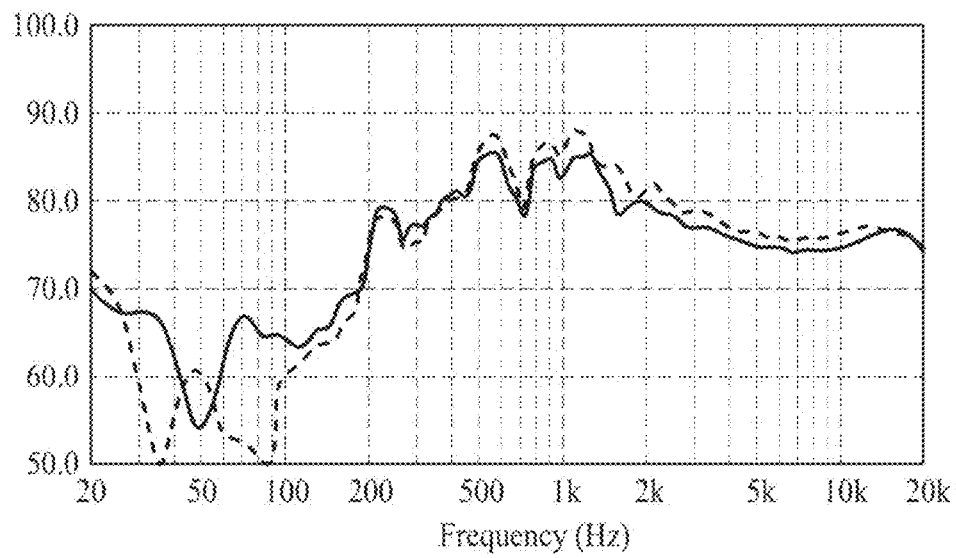
FIG. 17 illustrates a sound output characteristic of a sound-generating device according to an embodiment of the present disclosure.

FIG. 17 illustrates a sound output characteristic of a sound-generating device according to an embodiment of the present disclosure.

In FIG. 17, a dotted line shows a sound output characteristic according to the example of FIG. 16A, and a solid line shows a sound output characteristic according to the example of FIG. 16B. With reference to FIG. 17, it may be seen that, in a frequency of about 200 Hz or less, corresponding to the low-pitched sound, a sound output characteristic may be better when a bent portion is provided, rather than when the bent portion is not provided.

Figure 18:
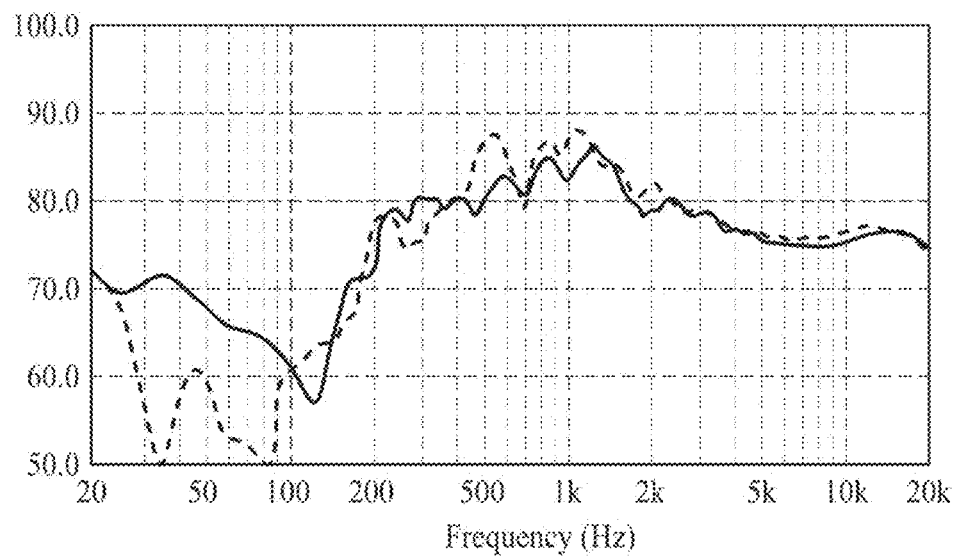
FIG. 18 illustrates a sound output characteristic of a sound-generating device according to an embodiment of the present disclosure.

FIG. 18 illustrates a sound output characteristic of a sound-generating device according to an embodiment of the present disclosure.

In FIG. 18, a dotted line shows a sound output characteristic according to the example of FIG. 16A, and a solid line shows a sound output characteristic according to the example of FIG. 16C. With reference to FIG. 18, it may be seen that a frequency characteristic in a full pitched sound may be better when a bent portion and a protrusion portion are provided, rather than when the bent portion and the protrusion portion are not provided.

The sound output characteristics shown in FIGS. 17 and 18 may be measured by a sound analysis apparatus. The sound analysis apparatus may include a sound card that may transmit or receive a sound to or from a control personal computer (PC), an amplifier that may amplify a signal generated from the sound card and transfer the amplified signal to the sound-generating devices 1600 and 1600', and a microphone that may collect a sound generated by the sound-generating devices 1600 and 1600' in a display panel. The sound collected through the microphone may be input to the control PC through the sound card, and a control program may check the input sound to analyze the sounds of the sound-generating devices 1600 and 1600'.

Figure 19A:
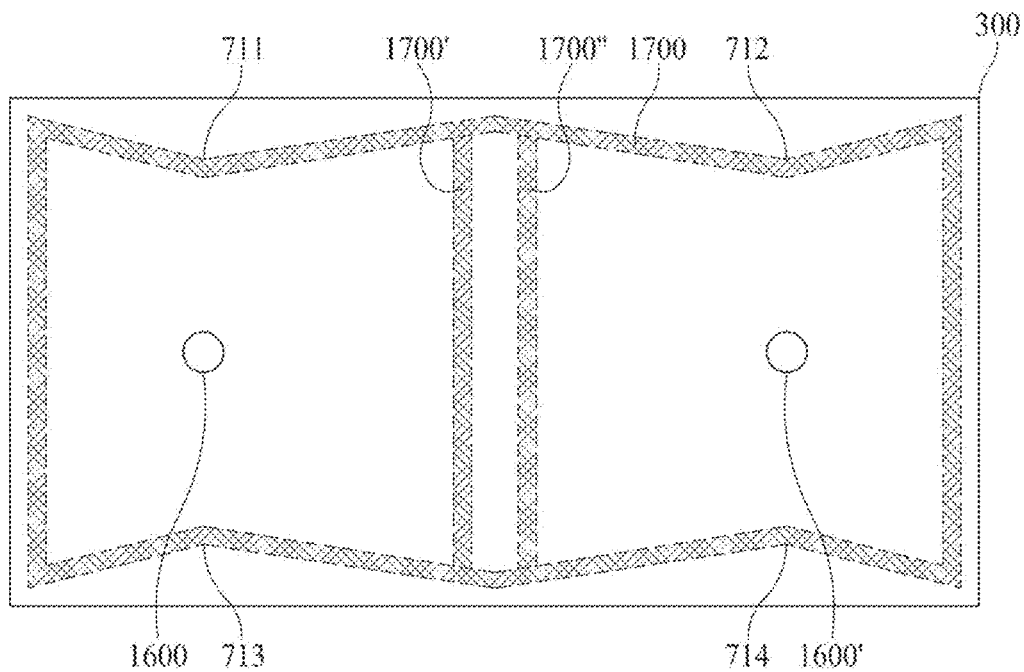
FIGS. 19A and 19B illustrate examples of an embodiment of each of a sound-generating device and a partition in a display apparatus according to an embodiment of the present disclosure.
Figure 19B:
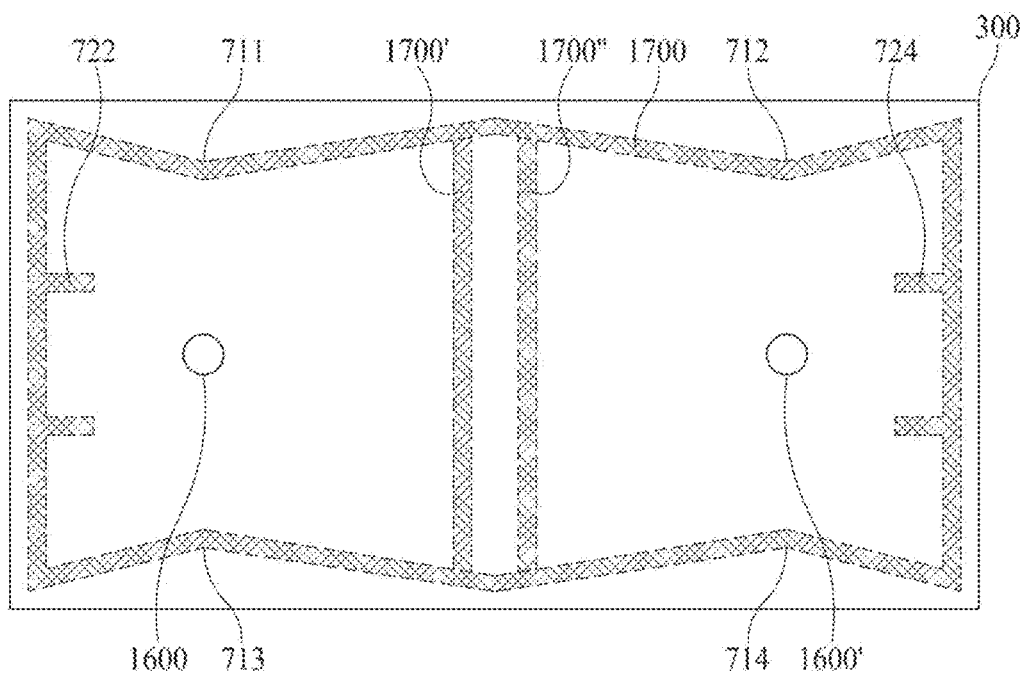

FIGS. 19A and 19B illustrate examples of an embodiment of each of a sound-generating device and a partition in a display apparatus according to an embodiment of the present disclosure.

With reference to FIGS. 19A and 19B, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. A first sound-generating device 1600 may be in the first region L of the rear surface of the display panel 100, and a second sound-generating device 1600' may be in the second region R of the rear surface of the display panel 100.

Each of the first sound-generating device 1600 and the second sound-generating device 1600' may be configured with the sound-generating device of FIG. 9A. However, the present embodiment is not limited thereto. For example, each of the first sound-generating device 1600 and the second sound-generating device 1600' may be configured with the sound-generating device of each of FIGS. 9B to 9D.

A partition may be provided between the first sound-generating device 1600 and the second sound-generating device 1600'. A second partition 1700' and a third partition 1700" may be closer to each other than in the examples of FIGS. 16A to 16C. Thus, sounds generated by the first sound-generating device 1600 and the second sound-generating device 1600' being transferred to the third region C may be reduced. For example, the high-pitched sound, generated in the first region L and the second region R, being transferred to the third region C, may be reduced or prevented.

As described above with reference to FIG. 16B, a plurality of bent portions 711 to 714 may be provided in the first partition 1700. With reference to FIG. 19B, the plurality of bent portions 711 to 714 and a plurality of protrusion portions 722 and 724 may be in the first partition 1700.

Descriptions of the partitions, the bent portions, and the protrusion portions may be substantially similar to descriptions given above with reference to FIGS. 15A to 18, and thus, may be omitted.

Figure 20A:
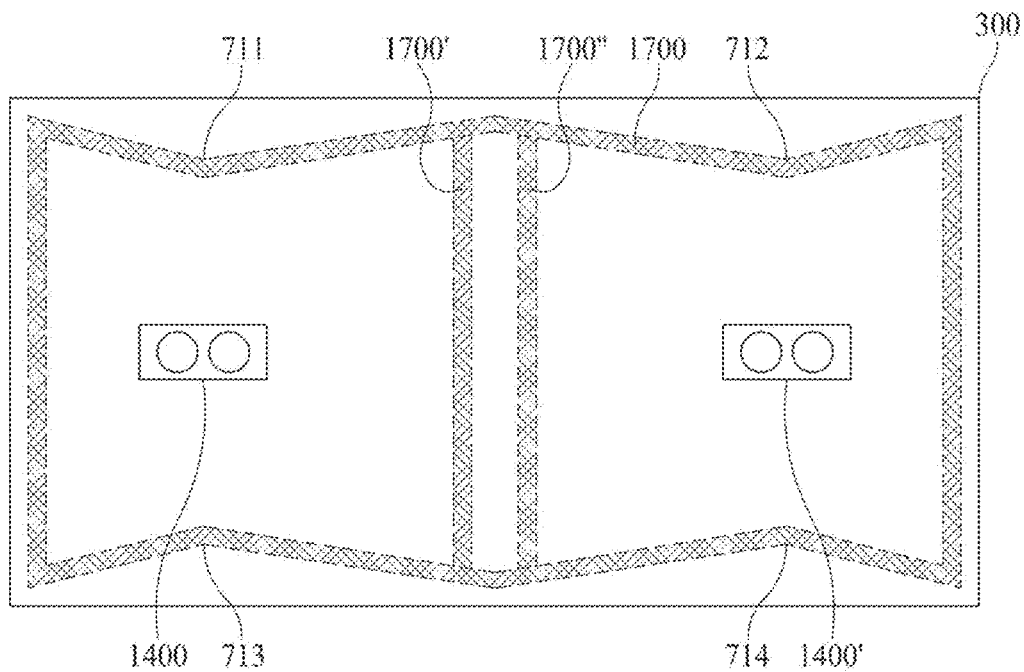
FIGS. 20A and 20B illustrate examples of an embodiment of each of a sound-generating device and a partition in a display apparatus according to an embodiment of the present disclosure.
Figure 20B:
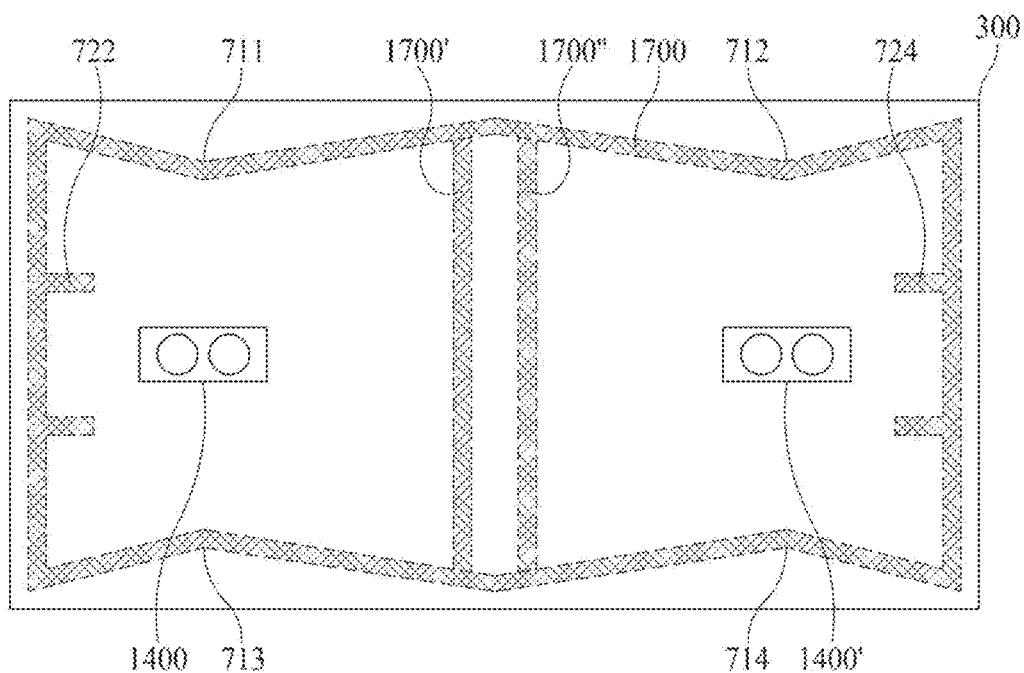

FIGS. 20A and 20B illustrate examples of an embodiment of each of a sound-generating device and a partition in a display apparatus according to an embodiment of the present disclosure.

With reference to FIGS. 20A and 20B, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. A first sound-generating device 1400 may be in the first region L of the rear surface of the display panel 100, and a second sound-generating device 1400' may be in the second region R of the rear surface of the display panel 100.

A second partition 1700' and a third partition 1700" may be closer to each other than in the examples of FIGS. 16A to 16C. Thus, sounds generated by the first sound-generating device 1400 and the second sound-generating device 1400', being transferred to the third region C, may be reduced.

The first sound-generating device 1400 and the second sound-generating device 1400' may each be configured as a pair of sound-generating devices. Descriptions of the pair of sound-generating devices may be substantially similar to descriptions given above with reference to FIGS. 6 and 7, and thus, may be omitted. Descriptions of the partitions, the bent portions, and the protrusion portions may be substantially similar to descriptions given above with reference to FIGS. 15A to 18, and thus, may be omitted.

Figure 21A:
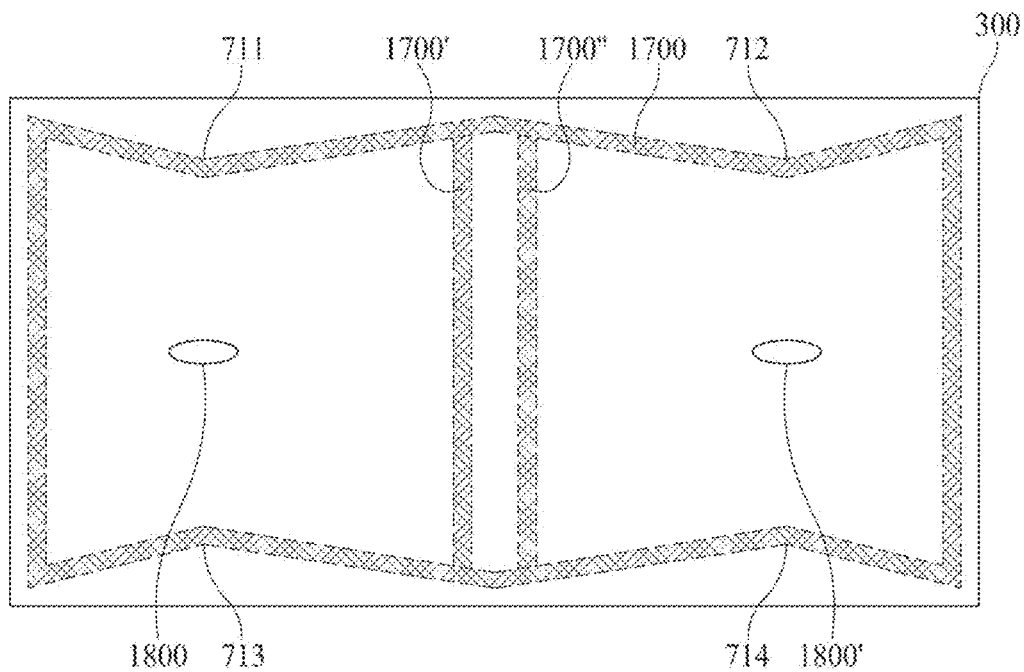
FIGS. 21A and 21B illustrate examples of an embodiment of each of a sound-generating device and a partition in a display apparatus according to an embodiment of the present disclosure.
Figure 21B:
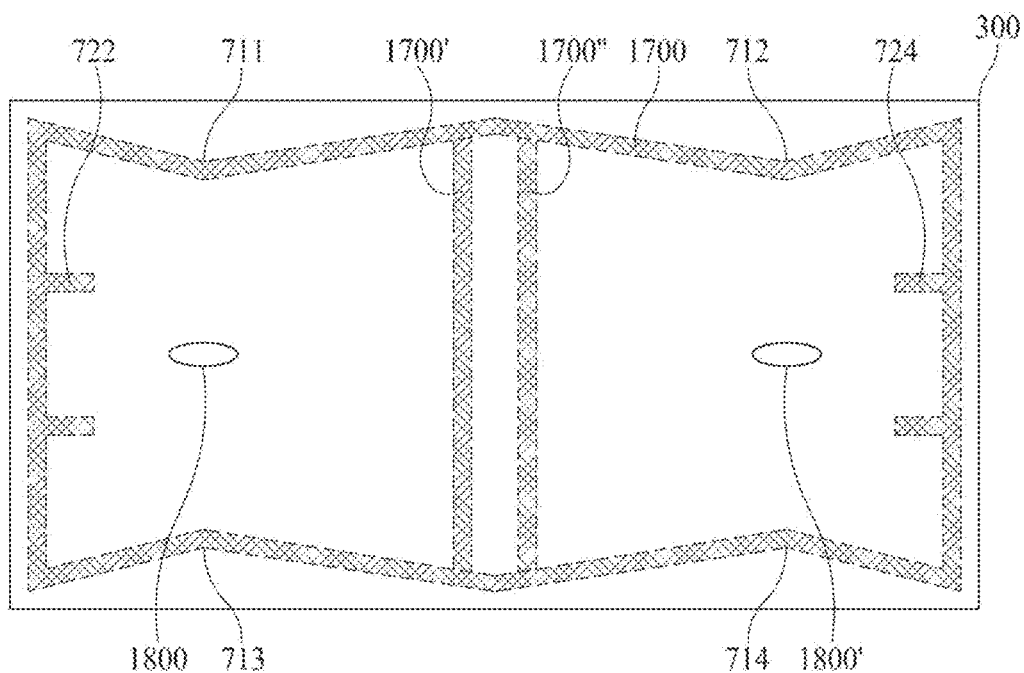

FIGS. 21A and 21B illustrate examples of an embodiment of each of a sound-generating device and a partition in a display apparatus according to an embodiment of the present disclosure.

With reference to FIGS. 21A and 21B, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. A first sound-generating device 1800 may be in the first region L of the rear surface of the display panel 100, and a second sound-generating device 1800' may be in the second region R of the rear surface of the display panel 100.

A second partition 1700' and a third partition 1700" may be closer to each other than in the examples of FIGS. 16A to 16C. Thus, sounds generated by the first sound-generating device 1800 and the second sound-generating device 1800', being transferred to the third region C, may be reduced.

The first sound-generating device 1800 and the second sound-generating device 1800' may each be configured as an oval sound-generating device. The oval sound-generating device may have an elliptical shape, a rectangular shape with rounded corners, or non-circular curved shape having a width different from its height, but is not limited thereto. When the oval sound-generating device is applied, a sound output characteristic corresponding to a middle- and/or high-pitched sound may be enhanced. Descriptions of the partitions, the bent portions, and the protrusion portions may be substantially similar to descriptions given above with reference to FIGS. 15A to 18, and thus, may be omitted.

Figure 22A:
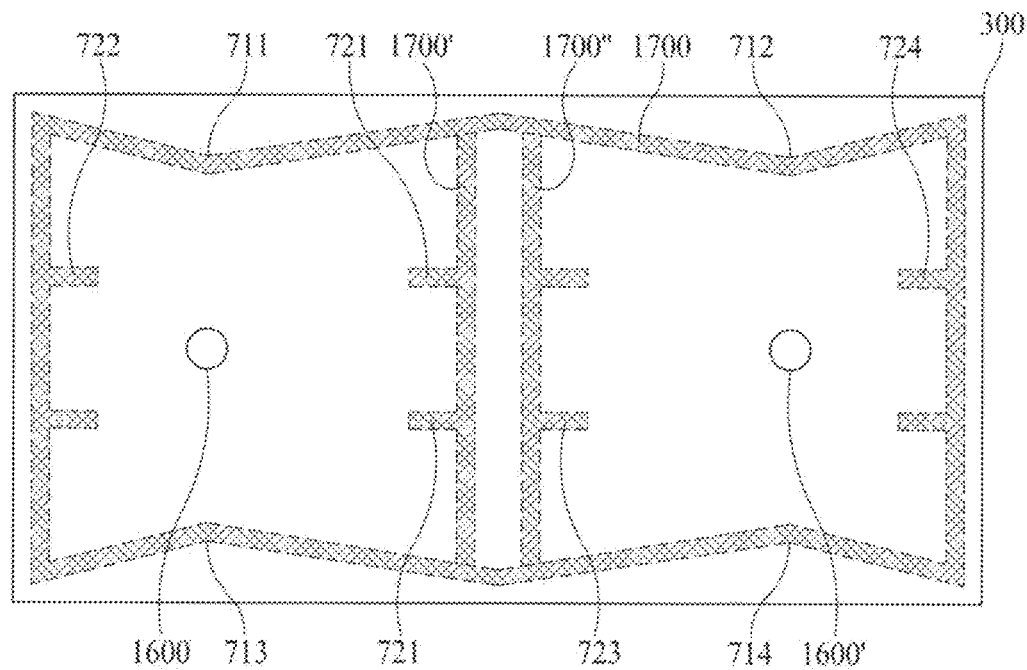
FIGS. 22A to 22C illustrate examples of an embodiment of each of a sound-generating device and a partition in a display apparatus according to an embodiment of the present disclosure.
Figure 22B:
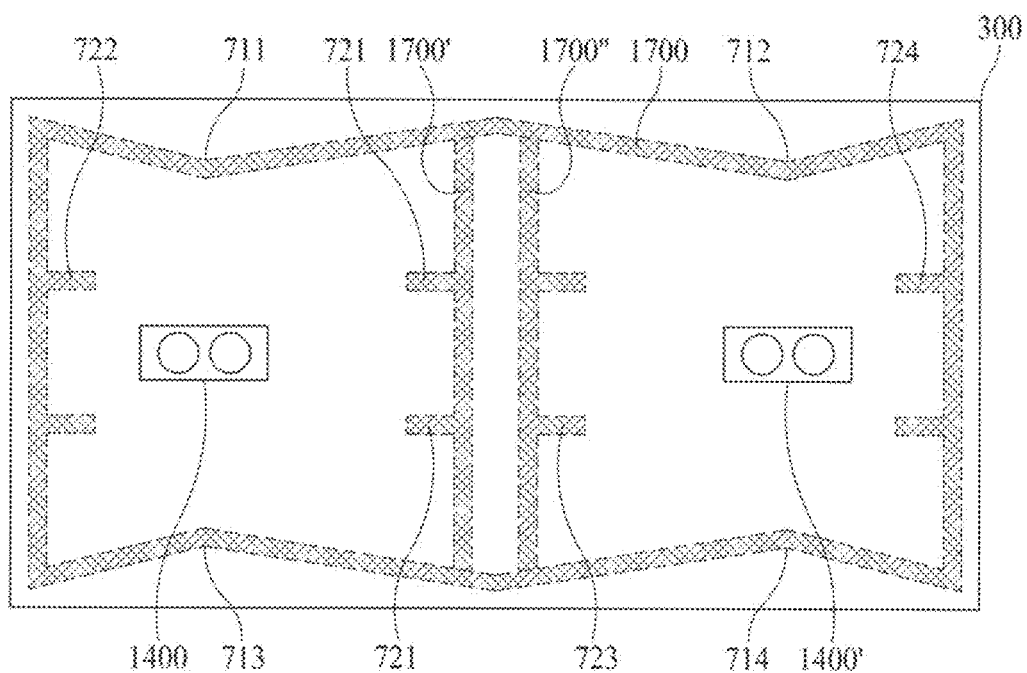
Figure 22C:
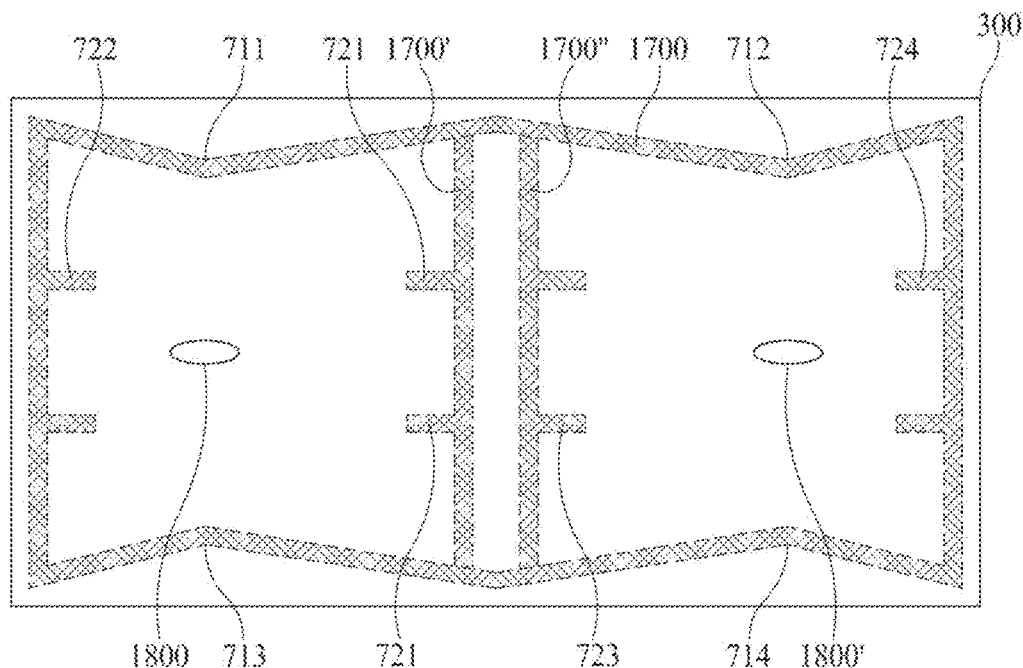

FIGS. 22A to 22C illustrate examples of an embodiment of each of a sound-generating device and a partition in a display apparatus according to an embodiment of the present disclosure.

With reference to FIGS. 22A and 22B, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. Descriptions of the partitions, the bent portions, and the protrusion portions may be substantially similar to descriptions given above with reference to FIGS. 15A to 18, and thus, may be omitted.

With reference to FIGS. 22A to 22C, a first sound-generating device 1600 may be in the first region L of the rear surface of the display panel 100, and a second sound-generating device 1600' may be in the second region R of the rear surface of the display panel 100. The first sound-generating device 1600 and the second sound-generating device 1600' of FIG. 22A may each be configured as a circular sound-generating device. A first sound-generating device 1400 and a second sound-generating device 1400' of FIG. 22B may each be configured as a pair of sound-generating devices. Also, a first sound-generating device 1800 and a second sound-generating device 1800' of FIG. 22C may each be configured as an oval sound-generating device.

With reference to FIGS. 22A to 22C, to decrease the peak or the dip that may each occur in a lengthwise direction of each of the first sound-generating device 1600 and the second sound-generating device 1600' due to a standing wave, a pad part may be provided on at least one side of each of a second partition 1700' and a third partition 1700". A first pad part 721 may be one side of the second partition 1700' to face the first sound-generating device 1600. The first pad part 721 may be on the same plane as a protrusion portion 722, and may be provided symmetrically or asymmetrically with respect to the protrusion portion 722, but is not limited thereto. Also, a second pad part 723 may be one side of the third partition 1700' to face the second sound-generating device 1600'. The second pad part 723 may be on the same plane as a protrusion portion 724, and may be provided symmetrically or asymmetrically with respect to the protrusion portion 724, but is not limited thereto. The first and second pad parts 721 and 723 may trap reflected waves from the first and second sound-generating devices 1600 and 1600', thereby decreasing the peak or the dip caused by the standing wave.

A display apparatus having a thin thickness may be implemented for enhancing a sense of beauty in appearance. A substrate configuring the display panel 100 may use a glass substrate. To implement a display apparatus having a thin thickness, a thickness of the glass substrate may be thin. For example, using the glass substrate having a thickness thinned from, e.g., 0.7 mm to 0.5 mm, the display apparatus may be more thinly implemented. When the thickness of the substrate is thinned, and when the partition is provided on the rear surface of the display panel 100 or an upper surface of a supporting member, a problem in which the display panel 100 may be not flat and a step height may be formed in the display panel 100 may occur due to the partition when the supporting member is attached on the display panel 100. For example, a problem in which the display panel 100 may be not flat and a screen may be unevenly seen may occur due to a shape of the bent portion bouncing on a screen of the display panel 100 or a separated or divided portion of the bent portion, for example, a portion in which the two rectilinear portions contact each other. Such a phenomenon may be referred to as an uneven phenomenon or a wave phenomenon of the display panel 100, and the term is not limited thereto. This will be described below with reference to FIGS. 23 to 25B.

Figure 23:
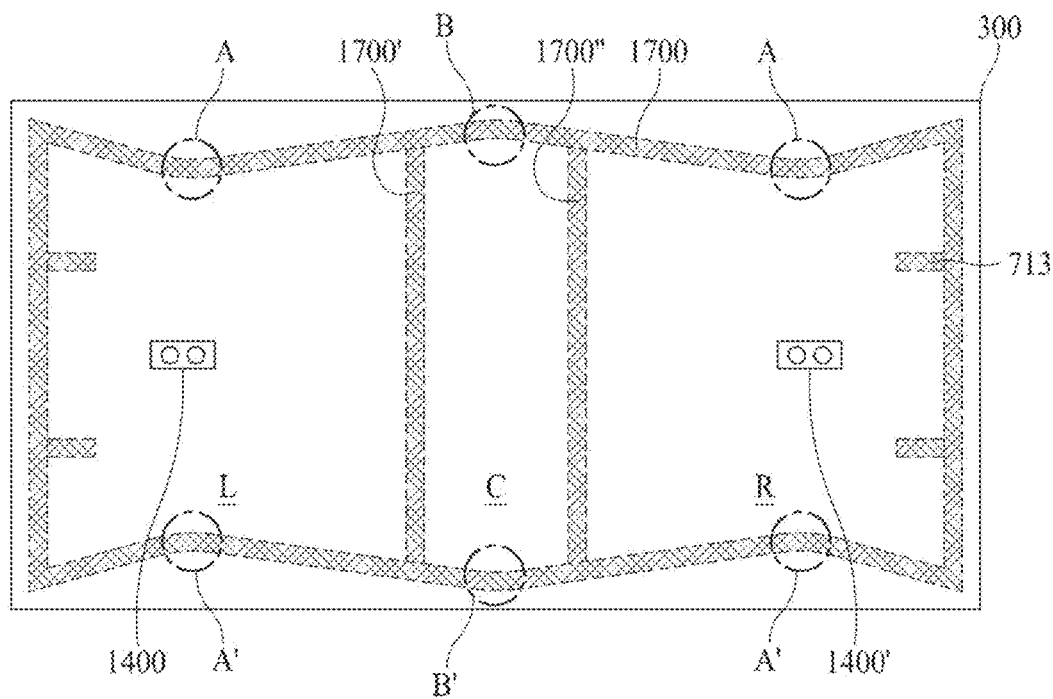
FIG. 23 illustrates an another embodiment of each of a sound-generating device and a partition in a display apparatus according to an embodiment of the present disclosure.

FIG. 23 illustrates another embodiment of each of a sound-generating device and a partition in a display apparatus according to an embodiment of the present disclosure.

With reference to FIG. 23, a display panel according to the present embodiment may be implemented by changing a shape of each of the bent portions 711 to 714, described above with reference to FIG. 16C, to a concave shape or a round shape. This may solve a wave phenomenon of the display panel by changing a shape of each of the bent portions 711 to 714. A result obtained by checking the display panel according to the present embodiment will be described below with reference to FIGS. 24A to 25B.

FIGS. 24A to 25B illustrate examples of an experimental result obtained by measuring a rear surface of a display panel.

Figure 24A:
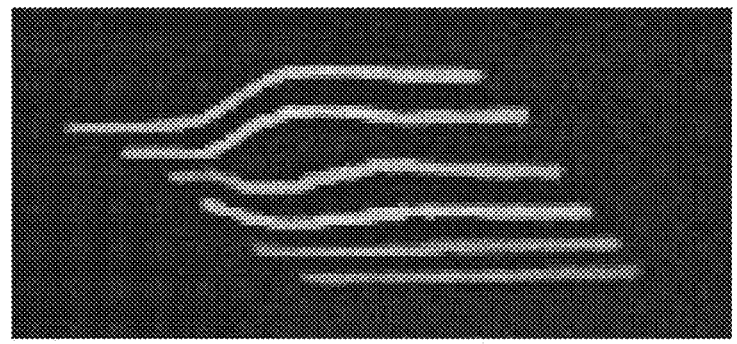
FIGS. 24A to 25B illustrate examples of an experimental result obtained by measuring a rear surface of a display panel in a display apparatus according to an embodiment of the present disclosure.
Figure 24B:
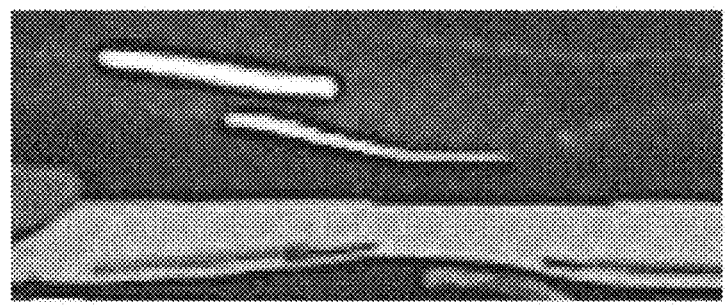

FIGS. 24A and 24B show experimental results obtained by checking a portion A and a portion A' of the FIG. 23 example. The portion A and the portion A' are in a supporting member 300. The portion A is a bent portion 712 provided in a first partition 1700 disposed in a first region L. FIG. 24A shows the portion A of FIG. 23, and FIG. 24B shows the portion A' of FIG. 23. In FIGS. 24A and 24B, a portion shown in white is a portion in which a wave phenomenon occurs. Therefore, it may be seen that the wave phenomenon of the display panel occurs less in the portion A' than in the portion A, but the wave phenomenon still occurs.

Figure 25A:
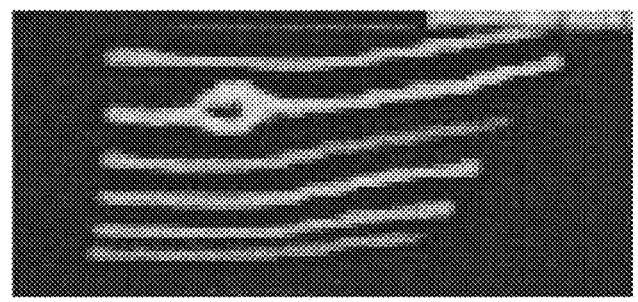
Figure 25B:
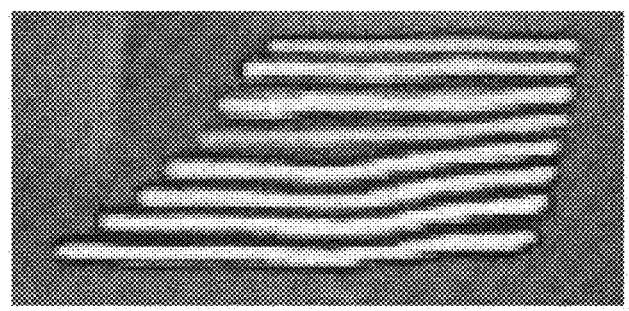

FIGS. 25A and 25B illustrate experimental results obtained by checking a portion B and a portion B' of FIG. 23. The portion B and the portion B' are in the supporting member 300. Each of the portion B and the portion B' is a bent portion in a first partition 1700 in a third region C. FIG. 25A shows the portion B of FIG. 23, and FIG. 25B shows the portion B' of FIG. 23. In FIGS. 25A and 25B, a portion shown in white is a portion in which the wave phenomenon occurs. Therefore, it may be seen that the wave phenomenon of the display panel occurs less in the portion B' than the portion B, but the wave phenomenon still occurs. Accordingly, it may be seen that, even when a shape of the bent portion 712 is changed, the wave phenomenon still occurs.

Therefore, the present inventor has recognized that a bent portion that allows a vibration to be laterally spread, for controlling a peak or a dip caused by a standing wave of a sound-generating device in a lengthwise direction (e.g., a lengthwise direction of a display panel) may lead to the occurrence of the wave phenomenon. For this reason, to solve the wave phenomenon, the present inventor has performed various experiments for controlling the peak or the dip caused by the standing wave or decreasing the wave phenomenon. Through the various experiments, the present inventor has invented a display apparatus having a new structure. This will be described below with reference to FIGS. 26A to 30D.

Figure 26A:
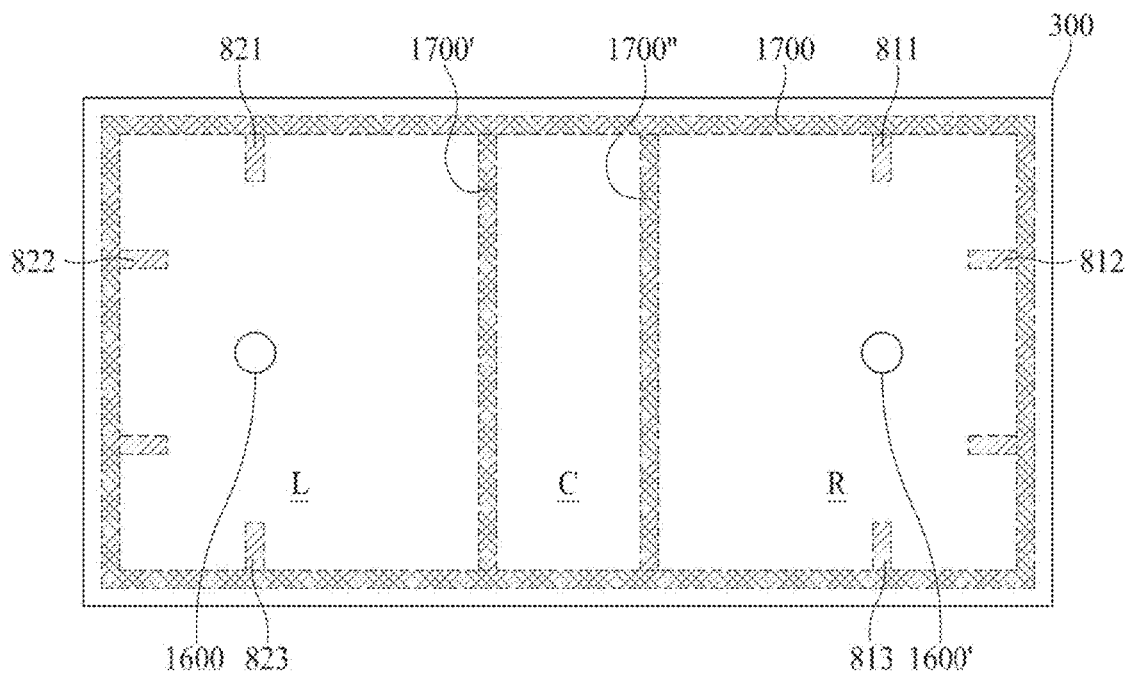
FIGS. 26A to 26C illustrate examples of another embodiment of each of a sound-generating device and a partition in a display apparatus according to an embodiment of the present disclosure.
Figure 26B:
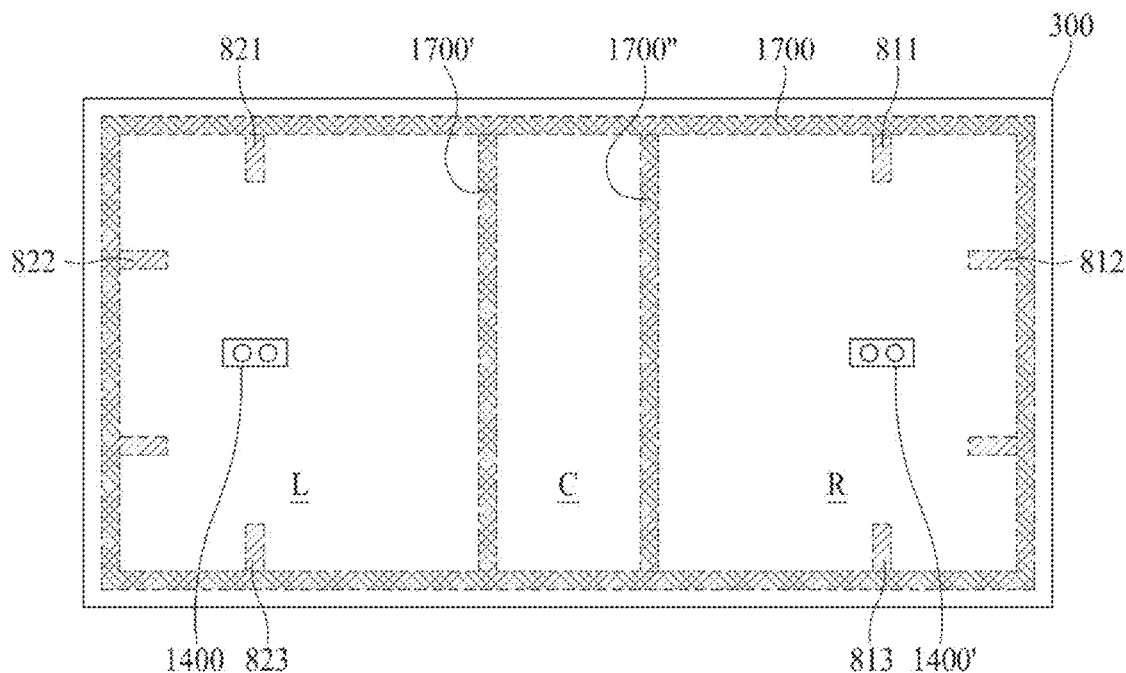
Figure 26C:
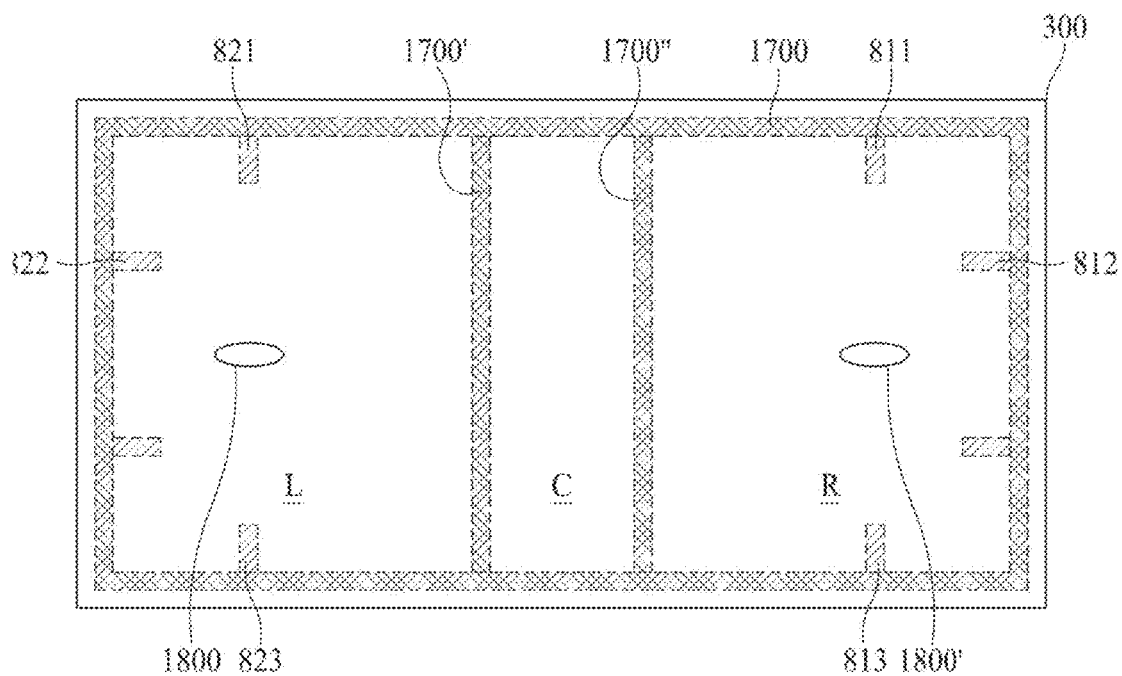

FIGS. 26A to 26C illustrate examples of another embodiment of each of a sound-generating device and a partition according to an embodiment of the present disclosure.

With reference to FIGS. 26A to 26C, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. Also, one or more sound-generating devices may be in at least one of the first region L, the second region R, and the third region C. The one or more sound-generating devices may include one or more of: a circular sound-generating device, an oval sound-generating device, and a pair of sound-generating devices. The oval sound-generating device may have an elliptical shape, a rectangular shape with rounded corners, or non-circular curved shape having a width different from its height, but is not limited thereto. The one or more sound-generating devices may vibrate the display panel 100 to generate sound. For example, the one or more sound-generating devices may directly vibrate the display panel 100 to generate sound.

In FIG. 26A, a first sound-generating device 1600 and a second sound-generating device 1600' may each be configured as a circular sound-generating device. In FIG. 26B, a first sound-generating device 1400 and a second sound-generating device 1400' may each be configured as a pair of sound-generating devices. Descriptions of the pair of sound-generating devices may be substantially similar to descriptions given above with reference to FIGS. 6A to 7, and thus, may be omitted. In FIG. 26C, a first sound-generating device 1800 and a second sound-generating device 1800' may each be configured as an oval sound-generating device.

With reference to FIG. 26A, the first sound-generating device 1600 may be in the first region L, and the second sound-generating device 1600' may be in the second region R. For example, the first sound-generating device 1600 may be in the first region L of the rear surface of the display panel 100, and the second sound-generating device 1600' may be in the second region R of the rear surface of the display panel 100. Also, as described above with reference to FIG. 8, the first sound-generating device 1600 and the second sound-generating device 1600' may be in the display panel 100.

Therefore, the first sound-generating device 1600 may be in the first region L, which may be the left region of the rear surface of the display panel 100, and may vibrate the first region L of the display panel 100; and the second sound-generating device 1600' may be in the second region R, which may be the right region of the rear surface of the display panel 100, and may vibrate the second region R of the display panel 100. The first sound-generating device 1600 and the second sound-generating device 1600' may receive different vibration signals, and may be independently driven. For example, the first sound-generating device 1600 may generate sound using the first region L of the display panel 100 as a vibration plate, and the second sound-generating device 1600' may generate sound using the second region R of the display panel 100 as a vibration plate. Such descriptions may be applied to FIGS. 26B to 30D similarly or identically. Also, descriptions given above with reference to FIGS. 11 to 14 may be applied identically or similarly.

A partition and a pad part will be described below with reference to FIG. 26A for example, and such descriptions may be applied to FIGS. 26B and 26C similarly or identically.

With reference to FIGS. 26A to 26C, a first partition 1700 may be between a display panel and a supporting member 300. For example, the first partition 1700 may be between a rear surface of the display panel and an upper surface of the supporting member 300. Also, the first partition 1700 may be on the supporting member 300. For example, the first partition 1700 may be in a periphery of the supporting member 300, or in a periphery of an upper surface of the supporting member 300. Also, the first partition 1700 may be in a periphery of the display panel. For example, the first partition 1700 may be in a periphery of the rear surface of the display panel. Also, the first partition 1700 may be a whole region of the rear surface of the display panel or the supporting member 300. Also, the first partition 1700 may be a whole region of four outer sides of the supporting member 300 or the whole region of the rear surface of the display panel.

With reference to FIG. 26A, at least two partitions, for example, a second partition 1700' and a third partition 1700" may be between the first sound-generating device 1600 and the second sound-generating device 1600'. For example, the second partition 1700' may be between the first region L and the third region C, and the third partition 1700" may be between the second region R and the third region C. Descriptions of the first partition 1700, the second partition 1700', and the third partition 1700" may be substantially similar to descriptions given above with reference to FIGS. 16A and 16C, and thus, may be omitted.

The first sound-generating device 1600 may be provided in the first region L, which may be the left region, the second sound-generating device 1600' may be provided in the second region R, which may be the right region, and a sound-generating device may not be provided in a third region C, which may be a center region. Accordingly, the degradation in sound quality, caused by interference in the first region L and the second region R, may be reduced. Also, a sound characteristic corresponding to each of the low-, middle-, and high-pitched sounds may be further enhanced.

An area of the first region L and an area of the second region R may each be greater than that of the third region C. When the area of the first region L and the area of the second region R increase, the low-pitched sound may be enhanced, and the third region C may decrease the degradation in sound quality caused by interference in the first region L and the second region R. Accordingly, the quality of sounds of the low-, middle-, and high-pitched sounds may be enhanced.

In FIGS. 26A to 30D, the first partition 1700 may be the adhesive member described above with reference to FIG. 1B. Also, the adhesive member for attaching the supporting member on the display panel may be further provided between the display panel and the supporting member, each described above with reference to FIG. 1B. For example, the adhesive member may be further provided in a periphery of the display panel, or in a periphery of the supporting member.

FIGS. 26A to 27B illustrate an example in which the sound-generating device may be in the left region or the right region, without being disposed in a center of the left region (the first region L) or the right region (the second region R) of the display panel 100, but the present embodiment is not limited thereto. For example, the sound-generating device may be in the center of the left region (the first region L) or the right region (the second region R) of the display panel 100. Alternatively, the sound-generating device may be asymmetrically disposed in the first region L and the second region R of the display panel 100. A stereo sound characteristic may be further enhanced when the sound-generating device is in the left region or the right region, rather than when the sound-generating device is in the center of the left region (the first region L) or the right region (the second region R) of the display panel 100.

Moreover, as described above with reference to FIGS. 23 to 25B, the bent portion may be provided in the first partition 1700 to decrease a peak and a dip, which may be caused by a standing wave occurring in a lengthwise direction of each of the first and second sound-generating devices 1800 and 1800'. Here, the peak is a phenomenon in which a sound pressure bounces in a particular frequency, and the dip is a phenomenon in which generating of a particular frequency is suppressed. Thus, a low sound pressure may be generated. A sound output characteristic of the display apparatus may be reduced by the peak or the dip. Also, the present inventor has recognized that the first partition 1700 should be implemented in another shape, e.g., for decreasing a wave phenomenon caused by the bent part. Therefore, the present inventor has recognized that the first partition 1700 should be disposed based on a shape of the display panel 100 without the bent part, e.g., for decreasing the wave phenomenon.

The first partition 1700 may be disposed along a shape of the display panel 100. For example, the first partition 1700 may have a tetragonal (e.g., quadrilateral) shape, but is not limited thereto. For example, a shape of the first partition 1700 may be modified based on a shape of the display panel 100. If the display panel 100 is a curved display panel having a curve shape or the like, the first partition 1700 may have a curved shape or a curve shape. Accordingly, the first partition 1700 may be along a shape of the display panel 100. Thus, a degree to which the display panel 100 may be pulled may be reduced in a process of attaching the supporting member to the display panel 100, thereby preventing or reducing the wave phenomenon.

However, if the first partition 1700 is provided, it may be unable to control the peak and the dip caused by the standing wave. Thus, the present inventor has recognized that the first partition 1700 should have a structure for controlling the peak and the dip caused by the standing wave. The structure may be configured to prevent or reduce the wave phenomenon and to enable the peak and the dip caused by the standing wave to be easily controlled. The structure may be not implemented through a simple procedure, but has been implemented through various experiments.

Therefore, a pad part may be provided on each of one or more sides of the first partition 1700, e.g., for decreasing the peak and the dip caused by the standing wave. For example, the first partition 1700 may include a first side and a second side vertical to the first side, and first and second pad parts 821 and 811 may be provided on the first side. Also, the first pad part 821 may be in the first region L, and the second pad part 811 may be in the second region R. Each of the first and second pad parts 821 and 811 may be provided as one or as a plurality. Also, the first side may be side along a widthwise direction of the display panel 100 or the supporting member 300, and the second side may be a side along a lengthwise direction of the display panel 100 or the supporting member 300.

The first pad part 821 may face the first sound-generating device 1600, and the second pad part 811 may face the second sound-generating device 1600'. For example, the first pad part 821 may be in the first region L to face the first sound-generating device 1600, and the second pad part 811 may be in the second region R to face the second sound-generating device 1600'. Accordingly, the first pad parts 821 and the second pad part 811 may decrease the peak or the dip caused by the standing wave that may occur in a lengthwise direction of each of the first sound-generating device 1600 and the second sound-generating device 1600', and may allow a vibration to laterally transferred, thereby enhancing a sound output characteristic.

Moreover, a shape of each of the first pad part 821 and the second pad part 811 may be implemented to prevent or reduce the wave phenomenon from occurring when the display panel 100 is pulled in a process of attaching a pad part, on the supporting member, to the display panel 100. Alternatively, a shape of each of the first pad part 821 and the second pad part 811 may be implemented to reduce or prevent the wave phenomenon from occurring when the display panel 100 is pulled in a process of attaching the pad part, on the supporting member, to the display panel 100. Therefore, the present inventor has performed various experiments on shapes of the first and second pad parts 821 and 811 to reduce the wave phenomenon that may occur when the bent portion is configured as described above with reference to FIGS. 23 to 25B, for decreasing the peak or the dip caused by the standing wave. For example, an example in which a partition is on a supporting member will be described, and even when the partition is on a rear surface of the display panel, a wave phenomenon may occur. Therefore, the partition may be on the rear surface of the display panel or an upper surface of the supporting member, and may be between the rear surface of the display panel and the upper surface of the supporting member, but is not limited thereto. Accordingly, the shape of each of the pad parts may be not modified through a simple procedure, but has been modified through various experiments. For example, the shape of each of the pad parts should be implemented to reduce or prevent the wave phenomenon, and to enable the peak and the dip caused by the standing wave to be easily controlled. The pad parts have been implemented in a tetragonal (e.g., quadrilateral) shape or an end-rounded tetragonal (e.g., quadrilateral) shape through various experiments.

The first partition 1700 may include a double-sided tape, a single-sided tape, an adhesive, and/or a bond, but is not limited thereto. When the first partition 1700 may include the double-sided tape, an adhesive force may be enhanced in a process of attaching the upper surface of the supporting member on the rear surface of the display panel 100. Also, the first partition 1700 may include a material having an elastic force that enables compression to be made to a certain degree, and for example, may include a polyurethane, a polyolefin, a polyethylene, and/or the like, but is not limited thereto.

The second partition 1700' and the third partition 1700" may include the same material as that of the first partition 1700. When each of the second partition 1700' and the third partition 1700" includes the same material as that of the first partition 1700, an adhesive force may be enhanced in a process of attaching the upper surface of the supporting member to the rear surface of the display panel 100. The second partition 1700' and the third partition 1700" may include a double-sided tape, but is not limited thereto. For example, the second partition 1700' and the third partition 1700" may include a material having an elastic force that enables compression to be made to a certain degree, and for example, may include a polyurethane, a polyolefin, a polyethylene, and/or the like, but is not limited thereto.

Moreover, the first partition 1700, the second partition 1700', and the third partition 1700" may be closest to the periphery of the rear surface of the display panel 100 or the periphery of the upper surface of the supporting member, thereby reducing the wave phenomenon seen on a screen of the display panel 100. Also, the first partition 1700 may be configured based on the shape of the display panel 100. Thus, workability may be improved in a process of attaching the display panel 100 to the supporting member 300 that may support the rear surface of the display panel 100.

Various experiments have been performed so that the first pad part 821 and the second pad part 811 may include materials for decreasing a degree to which the display panel 100 may be pulled in a process of attaching the supporting member to the display panel 100. The present inventor has recognized that the first pad part 821 and the second pad part 811, each disposed in the first partition 1700, should be formed of materials for decreasing a degree to which the display panel 100 may be pulled in a process of contacting the display panel 100. Therefore, the present inventor has performed various experiments on a material that reduces or prevents the wave phenomenon, and enables the peak or the dip caused by the standing wave to be controlled, instead of simply changing a material. The present inventor has recognized that the first pad part 821 and the second pad part 811 should be formed of materials having an adhesive force that may be weaker than that of the first partition 1700, based on various experiments. When the pad parts include the same material as that of the first partition 1700, it has been confirmed that the wave phenomenon occurs at a position at which the first pad part 821 and the second pad part 811 are disposed. The present inventor has recognized that the reason may be because, when an adhesive force of the first partition 1700 is the same as that of the pad parts, the display panel 100 may be pulled more at the position at which the pad parts are disposed. Thus, the wave phenomenon occurs. For example, when the first partition 1700 and the pad parts disposed in the supporting member include materials having the same adhesive force, the wave phenomenon may occur at the position, at which the pad parts are disposed, when the first partition 1700 and the pad parts 811 and 821 in the supporting member are attached on the display panel 100. Also, the first partition and the pad parts in the supporting member may be described with reference to FIGS. 26B to 30D, but without being limited thereto, the same description may also be applied to a case in which the first partition and the pad parts are on the rear surface of the display panel 100. For example, when the first partition and the pad parts on the rear surface of the display panel include materials having the same adhesive force, the wave phenomenon may occur at a position at which the pad parts are disposed, when the supporting member is attached to the first partition and the pad parts on the rear surface of the display panel 100.

Therefore, the first pad part 821 and the second pad part 811 may include materials that differ from that of the first partition 1700. As another example, the first pad part 821 and the second pad part 811 may include materials that differ from those of the first partition 1700, the second partition 1700', and the third partition 1700". For example, the first pad part 821 and the second pad part 811 may include materials having an adhesive force that may be weaker than that of the first partition 1700. Also, the first pad part 821 and the second pad part 811 may include materials having an adhesive force that may be weaker than that of each of the first partition 1700, the second partition 1700', and the third partition 1700". The first pad part 821 and the second pad part 811 may include, for example, a single-sided tape. The single-sided tape may include a foam material that may absorb an impact when contacting the display panel 100. When the single-sided tape does not include the foam material, it may be seen that an undesired abnormal sound may occur due to contacting the display panel 100. The single-sided tape may include, for example, a polyurethane, a polyolefin, a polyethylene, and/or the like, but is not limited thereto. Also, when the first partition 1700, the first pad part 821, and the second pad part 811 include different materials, the different materials may be the same materials having different adhesive forces. As another example, the different materials may be different materials having different adhesive forces, but is not limited thereto. Therefore, the first partition may include a material that may be strong in adhesive force, for an adhesive force between the display panel and the supporting member, and the pad part may include a material that may be weaker in adhesive force than a material of the first partition, thereby decreasing a wave phenomenon.

A third pad part 822 and a fourth pad part 812 may be further provided on a second side of the first partition 1700. The third pad part 822 and the fourth pad part 812 may further decrease a peak or a dip caused by a standing wave generated by interference between a reflected wave and a progressive wave, and may reduce or prevent sound quality from being degraded by the standing wave or the reflected wave. Each of the third pad part 822 and the fourth pad part 812 may be provided as one or as a plurality on at least one side of the first partition 1700. The third pad part 822 may be in the first region L, and the fourth pad part 812 may be in the second region R. For example, the third pad part 822 may be on a second side of the first partition 1700 of the first region L, and the fourth pad part 812 may be on a second side of the first partition 1700 of the second region R. The third pad part 822 and the fourth pad part 812 may be symmetrically with respect to a sound-generating device. In FIG. 26A, each of the third pad part 822 and the fourth pad part 812 may be provided as one or as a plurality on one of a first side and a second side vertical thereto among four sides of the display panel 100, but is not limited thereto. For example, each of the third pad part 822 and the fourth pad part 812 may be provided as two or more.

Moreover, the third pad part 822 and the fourth pad part 812 may include one of a double-sided tape, a single-sided tape, an adhesive, and/or a bond. When the third pad part 822 and the fourth pad part 812 include materials that differ from those of the first pad part 821 and the second pad part 811, the wave phenomenon may occur due to different adhesive forces when contacting the display panel. Therefore, the present inventor has recognized that, when the third pad part 822 and the fourth pad part 812 include the same material as that of each of the first pad part 821 and the second pad part 811, the wave phenomenon may be reduced, and the occurrence of an abnormal sound may be reduced. For example, the third pad part 822 and the fourth pad part 812 may include a single-sided tape. The single-sided tape may include a foam material that may absorb an impact when contacting the display panel. When the single-sided tape does not include the foam material, it may be seen that an undesired abnormal sound may occur due to contacting the display panel. The single-sided tape may include, for example, a polyurethane, a polyolefin, a polyethylene, and/or the like, but is not limited thereto.

A fifth pad part 823 and a sixth pad part 813 may be further provided on a side facing the first side of the first partition 1700. For example, the fifth pad part 823 may be on a side facing the first side of the first partition 1700 in the first region L, and the sixth pad part 813 may be on a side facing the first side of the first partition 1700 in the second region R. Also, the fifth pad part 823 may face the first pad part 821, and the sixth pad part 813 may face the second pad part 811. Each of the fifth pad part 823 and the sixth pad part 813 may be provided as one or as a plurality. Therefore, the first and second pad parts 821 and 811 and the fifth and sixth pad parts 823 and 813 may trap reflected waves from the first and second sound-generating devices 1800 and 1800', thereby decreasing the peak or the dip caused by the standing wave. Also, the third pad part 822 and the fourth pad part 812 may further decrease a peak or a dip caused by a standing wave generated by interference between a reflected wave and a progressive wave, and may reduce or prevent sound quality from being degraded by the standing wave or the reflected wave.

The fifth pad part 823 and the sixth pad part 813 may include one or more of: a double-sided tape, a single-sided tape, an adhesive, and a bond. When the fifth pad part 823 and the sixth pad part 813 include materials that differ from those of the first pad part 821 and the second pad part 811, the wave phenomenon may occur due to different adhesive forces when contacting the display panel. Therefore, the present inventor has recognized that, when the fifth pad part 823 and the sixth pad part 813 include the same material as that of each of the first pad part 821 and the second pad part 811, the wave phenomenon may be reduced, and the occurrence of an abnormal sound may be reduced. For example, the fifth pad part 823 and the sixth pad part 813 may include a single-sided tape. The single-sided tape may include a foam material that may absorb an impact when contacting the display panel. When the single-sided tape does not include the foam material, it may be seen that an undesired abnormal sound may occur due to contacting the display panel. The single-sided tape may include, for example, a polyurethane, a polyolefin, a polyethylene, and/or the like, but is not limited thereto.

At least one of the first pad part 821 and second pad part 811 may include the same material as that of at least one of the third, fourth, fifth, and sixth pad parts 822, 812, 823, and 813. For example, at least one first pad part 821 and second pad part 811 may include the same material as that of each of the third, fourth, fifth, and sixth pad parts 822, 812, 823, and 813.

Therefore, the first partition 1700, the second partition 1700', and the third partition 1700" may each be formed of a material that differs from that of each of the first, second, third, fourth, fifth, and sixth pad parts 821, 811, 822, 812, 823, and 813. For example, a material of each of the first partition 1700, the second partition 1700', and the third partition 1700" may have an adhesive force that differs from that of a material of each of the first, second, third, fourth, fifth, and sixth pad parts 821, 811, 822, 812, 823, and 813. For example, the first partition 1700, the second partition 1700', and the third partition 1700" may each be formed of a double-sided tape; and the first, second, third, fourth, fifth, and sixth pad parts 821, 811, 822, 812, 823, and 813 may each be formed of a single-sided tape. When the first partition 1700, the second partition 1700', and the third partition 1700" include materials that differ from that of each of the first, second, third, fourth, fifth, and sixth pad parts 821, 811, 822, 812, 823, and 813, the materials may be the same materials having different adhesive forces. As another example, the materials may be different materials having different adhesive forces, but the present embodiment is not limited thereto.

As a size of each of the first and second pad parts 821 and 811, a size of each of the third and fourth pad parts 822 and 812, and a size of each of the fifth and sixth pad parts 823 and 813 increase, it may be easy to control the peak or the dip caused by the standing wave. For example, if each of a width of the second pad part 811 and a width of the fourth pad part 812 is less than, e.g., about 10 mm, it may be difficult to control the peak or the dip caused by the standing wave. Therefore, the width of the second pad part 811 and the width of the fourth pad part 812 may each be, e.g., about 10 mm or more. Also, a size of the sixth pad part 813 may be equal to that of the second pad part 811, but is not limited thereto. For example, a width of the sixth pad part 813 may be, e.g., about 10 mm or more, and a length of the sixth pad part 813 may be, e.g., about 50 mm or less. However, the present embodiment is not limited thereto. Also, a size of the second pad part 811, a size of the fourth pad part 812, and a size of the sixth pad part 813 may be identically or similarly applied to the first pad part 821, the third pad part 822, and the fifth pad part 823.

Moreover, a size of each of the first pad part 821 and the second pad part 811 may be greater than or equal to that of each of the third pad part 822 and the fourth pad part 812, but the present embodiment is not limited thereto. A length of the second pad part 811 may be greater than or equal to that of the fourth pad part 812. For example, the length of the second pad part 811 may be, e.g., about 90 mm or less, and the length of the fourth pad part 812 may be, e.g., about 50 mm or less, but the present embodiment is not limited thereto. The length of the second pad part 811 and the length of the fourth pad part 812 may be identically or similarly applied to the first pad part 821 and the third pad part 822. A shape of each of the first and second pad parts 821 and 811, a shape of each of the third and fourth pad parts 822 and 812, and a shape of each of the fifth and sixth pad parts 823 and 813 may each be a tetragonal (e.g., quadrilateral) shape or an end-rounded tetragonal (e.g., quadrilateral) shape, but is not limited thereto and may be provided as various shapes, such as a circular shape.

Therefore, when a partition is configured based on a shape of a display panel and one or more pad parts are provided on at least one side of the partition, the wave phenomenon may decrease, and the peak or the dip caused by the standing wave may be reduced, thereby enhancing a sound output characteristic. Also, when the partition and the pad parts include different materials, the wave phenomenon may decrease, and the occurrence of an abnormal sound may be reduced or prevented, thereby enhancing a sound output characteristic.

Figure 27A:
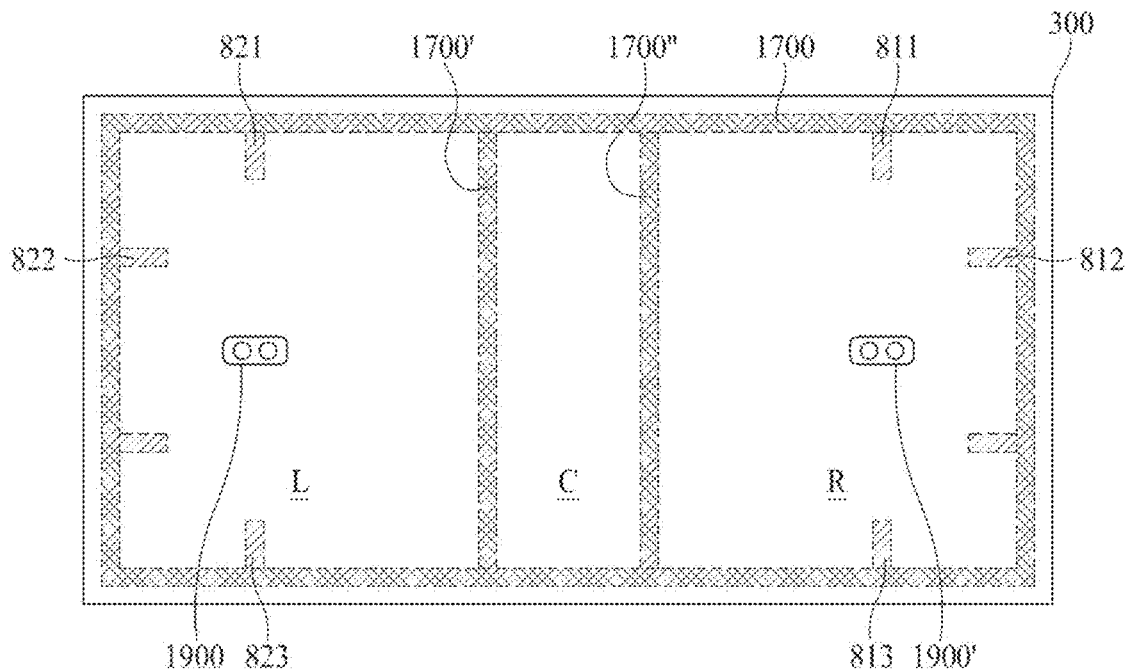
FIGS. 27A and 27B illustrate examples of another embodiment of each of a sound-generating device and a partition in a display apparatus according to an embodiment of the present disclosure.
Figure 27B:
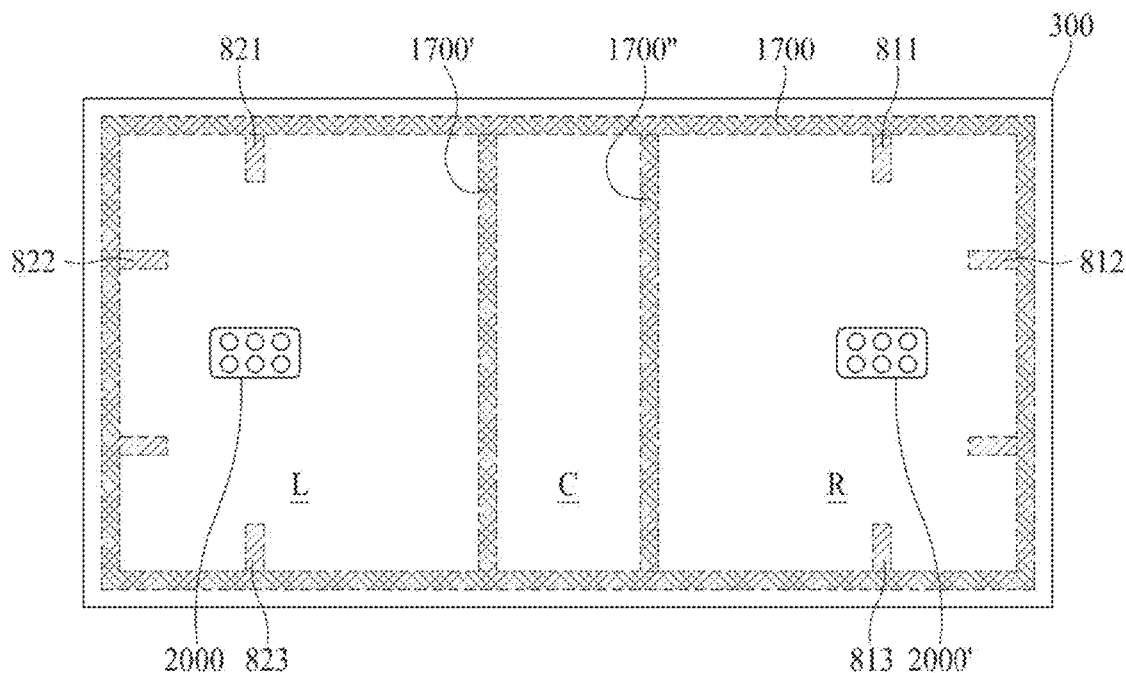

FIGS. 27A and 27B illustrate examples of another embodiment of each of a sound-generating device and a partition according to an embodiment of the present disclosure.

In FIGS. 27A and 27B, the same descriptions as descriptions given above with reference to FIGS. 26A to 26C may be omitted or will be briefly given. For example, descriptions of a sound-generating device, a partition, and a pad part may be omitted or will be briefly given. In describing the sound-generating device, the partition, and the pad part with reference to FIGS. 27A to 30D, the same descriptions as descriptions given above with reference to FIGS. 26A to 26C may be omitted or will be briefly given. In FIGS. 27A to 30D, a one sound-generating device of FIG. 9A, a two-device array sound-generating device of FIG. 9B, and a six-device array sound-generating device of FIG. 9DF will be described below as examples of a sound-generating device, but the four-device array sound-generating device of FIG. 9C may also be applied.

With reference to FIGS. 27A and 27B, a first partition 1700 may be between a display panel and a supporting member 300. For example, the first partition 1700 may be between a rear surface of the display panel and an upper surface of the supporting member 300. Also, the first partition 1700 may be on the supporting member 300. For example, the first partition 1700 may be at an edge of the supporting member 300, or may be at an edge of the upper surface of the supporting member 300. Also, the first partition 1700 may be at an edge of the display panel. For example, the first partition 1700 may be on the rear surface of the display panel or at the edge of the supporting member 300. Also, the first partition 1700 may be a whole region of the rear surface of the display panel, or may be a whole region of four outer sides of the supporting member.

The first partition 1700 may be disposed along a shape of the display panel 100. For example, the first partition 1700 may have a tetragonal (e.g., quadrilateral) shape, but is not limited thereto. In other embodiments, a shape of the first partition 1700 may be modified based on a shape of the display panel. If the display panel is a curved display panel having a curve shape or the like, the first partition 1700 may have a curved shape or a curve shape. Accordingly, the first partition 1700 may be disposed along a shape of the display panel, thereby preventing or reducing the wave phenomenon.

At least one pad part may be on a first side and a second side vertical thereto among sides of the first partition 1700. Descriptions of a side, a shape, and a material of the pad part may be the same as or similar to descriptions given above with reference to FIGS. 26A to 26C, and thus, may be omitted.

With reference to FIG. 27A, a second partition 1700' may be between a first region L and a third region C, and a third partition 1700" may be between a second region R and the third region C. A first sound-generating device 1900 may be in the first region L, and a second sound-generating device 1900' may be in the second region R. The sound-generating devices may include one or more of: a circular sound-generating device, an oval sound-generating device, one sound-generating device, and a two or more device array sound-generating device. One oval sound-generating device, described above with reference to FIG. 9A, may have an elliptical shape, a rectangular shape with rounded corners, or non-circular curved shape having a width different from its height, but is not limited thereto. The one or more sound-generating devices may vibrate a display panel to generate sound. For example, the one or more sound-generating devices may directly vibrate the display panel to generate sound.

The first sound-generating device 1900 and the second sound-generating device 1900' may each be configured as the sound-generating device described above with reference to FIG. 9B. For example, the first sound-generating device 1900 and the second sound-generating device 1900' may each be configured with two sound-generating devices. The first sound-generating device 1900 and the second sound-generating device 1900' may output different middle- and/or high-pitched sounds in the first region L and the second region R. For example, each of the first sound-generating device 1900 and the second sound-generating device 1900' may output a sound corresponding to a range of about 200 Hz to about 20 kHz, but the range is not limited thereto.

Therefore, the first sound-generating device 1900 and the second sound-generating device 1900' may output different middle- and/or high-pitched sounds, and may output a stereo sound by separating left and right sounds, thereby providing a display apparatus having a two-channel sound output characteristic.

With reference to FIG. 27B, a first sound-generating device 2000 may be in a first region L, and a second sound-generating device 2000' may be in a second region R. The first sound-generating device 2000 and the second sound-generating device 2000' may each be configured as the sound-generating device described above with reference to FIG. 9D. For example, the first sound-generating device 2000 and the second sound-generating device 2000' may each be configured with six sound-generating devices. The first sound-generating device 2000 and the second sound-generating device 2000' may output different middle- and/or high-pitched sounds in the first region L and the second region R. For example, each of the first sound-generating device 2000 and the second sound-generating device 2000' may output a sound corresponding to a range of about 200 Hz to about 20 kHz, but the range is not limited thereto. Therefore, the first sound-generating device 1900 and the second sound-generating device 1900' may output different middle- and/or high-pitched sounds, and may output a stereo sound by separating left and right sounds, thereby providing a display apparatus having a two-channel sound output characteristic.

When a sound-generating device is in a display panel, a sound pressure of the sound-generating device may be reduced due to a thin thickness (or height). To solve such a problem, the present inventor has implemented a sound-generating device in which an area of a damper may be wide and a sound pressure may not be reduced. Therefore, the implemented sound-generating device may have a sound output characteristic that may be similar or equal to that of the sound-generating device having a configuration described above with reference to FIGS. 5 to 7.

Figure 28A:
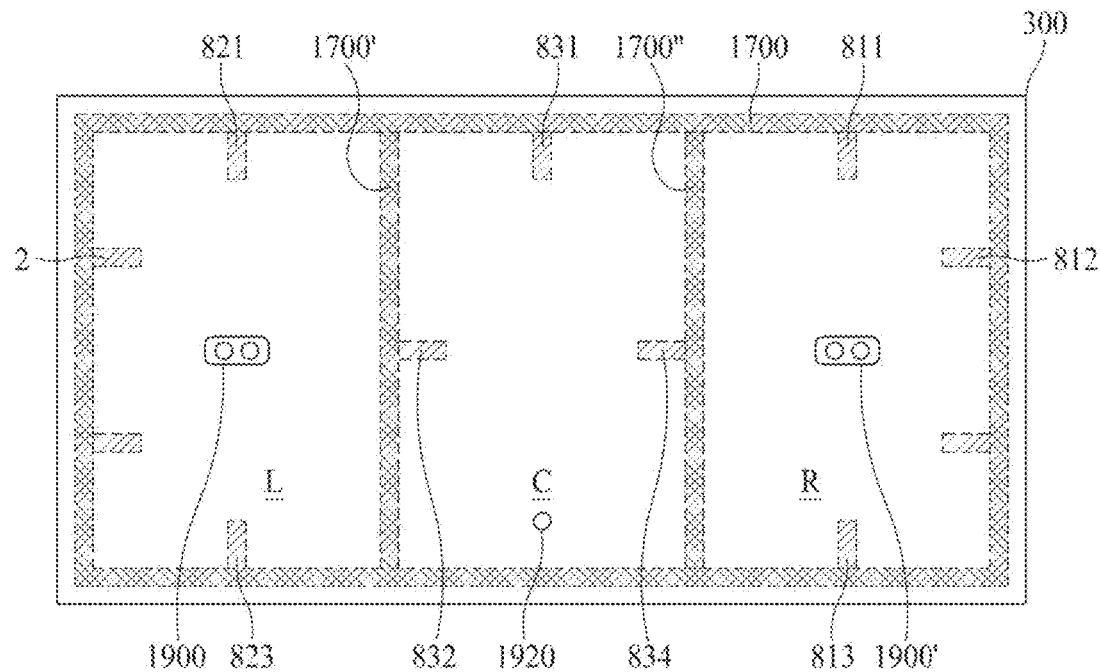
FIGS. 28A and 28B illustrate examples of another embodiment of each of a sound-generating device and a partition in a display apparatus according to an embodiment of the present disclosure.
Figure 28B:
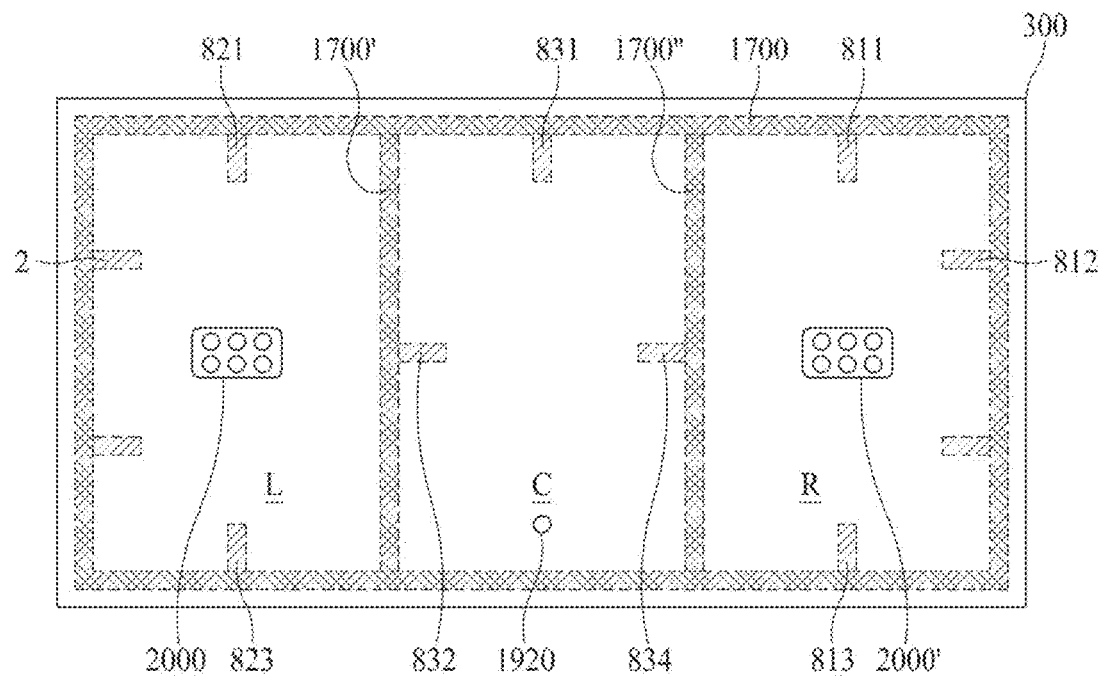

FIGS. 28A and 28B illustrate examples of another embodiment of each of a sound-generating device and a partition according to an embodiment of the present disclosure.

In FIGS. 28A and 28B, the same descriptions as descriptions given above with reference to FIGS. 26A to 26C may be omitted or will be briefly given. For example, descriptions of a sound-generating device, a partition, and a pad part may be omitted or will be briefly given.

With reference to FIGS. 28A and 28B, a first partition 1700 may be between a display panel and a supporting member 300. For example, the first partition 1700 may be between a rear surface of the display panel and an upper surface of the supporting member 300. Also, the first partition 1700 may be on the supporting member 300. For example, the first partition 1700 may be in a periphery of the supporting member 300, or may be in a periphery of the upper surface of the supporting member 300. Also, the first partition 1700 may be in a periphery of the display panel. For example, the first partition 1700 may be on the rear surface of the display panel, or may be in the periphery of the supporting member 300. Also, the first partition 1700 may be a whole region of the rear surface of the display panel, or may be a whole region of four outer sides of the supporting member.

The first partition 1700 may be disposed along a shape of the display panel 100. For example, the first partition 1700 may have a tetragonal (e.g., quadrilateral) shape, but is not limited thereto. For example, a shape of the first partition 1700 may be modified based on a shape of the display panel. If the display panel is a curved display panel having a curve shape or the like, the first partition 1700 may have a curved shape or a curve shape. Accordingly, the first partition 1700 may be disposed along a shape of the display panel, thereby preventing or reducing the wave phenomenon.

At least one pad part may be on a first side and a second side vertical thereto among sides of the first partition 1700. Descriptions of a side, a shape, and a material of the pad part may be the same as or similar to descriptions given above with reference to FIGS. 26A to 26C, and thus, may be omitted.

With reference to FIG. 28A, a first sound-generating device 1900 may be in a first region L, and a second sound-generating device 1900' may be in a second region R. The first sound-generating device 1900 and the second sound-generating device 1900' may each be configured as the sound-generating device described above with reference to FIG. 9B. For example, the first sound-generating device 1900 and the second sound-generating device 1900' may each be configured with two sound-generating devices. The first sound-generating device 1900 and the second sound-generating device 1900' may output different middle- and/or high-pitched sounds in the first region L and the second region R. For example, each of the first sound-generating device 1900 and the second sound-generating device 1900' may output a sound corresponding to a range of about 200 Hz to about 20 kHz, but the range is not limited thereto.

A third sound-generating device 1920 may be in a third region C. The third sound-generating device 1920 may be configured as the sound-generating device described above with reference to FIG. 9A. For example, the third sound-generating device 1920 may be configured with one sound-generating device. The third sound-generating device 1920 may output a middle- and/or low-pitched sound in the third region C. For example, the third sound-generating device 1920 may output a sound corresponding to a range of about 100 Hz to about 10 kHz, but the range is not limited thereto.

Therefore, the first sound-generating device 1900 and the second sound-generating device 1900' may output different middle- and/or high-pitched sounds, and the third sound-generating device 1920 may output the middle- and/or low-pitched sound. Accordingly, a stereo sound may be output by separating left and right sounds, thereby providing a display apparatus having a three-channel sound output characteristic.

With reference to FIG. 28B, a first sound-generating device 2000 may be in a first region L, and a second sound-generating device 2000' may be in a second region R. The first sound-generating device 2000 and the second sound-generating device 2000' may each be configured as the sound-generating device described above with reference to FIG. 9D. For example, the first sound-generating device 2000 and the second sound-generating device 2000' may each be configured with six sound-generating devices. The first sound-generating device 2000 and the second sound-generating device 2000' may output different middle- and/or high-pitched sounds in the first region L and the second region R. For example, each of the first sound-generating device 2000 and the second sound-generating device 2000' may output a sound corresponding to a range of about 200 Hz to about 20 kHz, but the range is not limited thereto.

A third sound-generating device 1920 may be in a third region C. The third sound-generating device 1920 may be configured as the sound-generating device described above with reference to FIG. 9A. For example, the third sound-generating device 1920 may be configured with one sound-generating device. The third sound-generating device 1920 may output a middle- and/or low-pitched sound in the third region C. For example, the third sound-generating device 1920 may output a sound corresponding to a range of about 100 Hz to about 10 kHz, but the range is not limited thereto.

Therefore, the first sound-generating device 2000 and the second sound-generating device 2000' may output different middle- and/or high-pitched sounds, and the third sound-generating device 1920 may output the middle- and/or low-pitched sound. Accordingly, a stereo sound may be output by separating left and right sounds, thereby providing a display apparatus having a three-channel sound output characteristic.

With reference to FIGS. 28A and 28B, a first sound-generating device of a first region L and a second sound-generating device of a second region R may be asymmetrically disposed with a third sound-generating device of a third region C. For example, in FIG. 28A, the first sound-generating device 1900 of the first region L and the second sound-generating device 1900' of the second region R may be on a line differing from the third sound-generating device 1920 of the third region C. The first sound-generating device 1900 of the first region L and the second sound-generating device 1900' of the second region R may be symmetrically disposed, and the third sound-generating device 1920 of the third region C may be asymmetrically disposed with the first sound-generating device 1900 of the first region L and the second sound-generating device 1900' of the second region R. The third sound-generating device 1920 of the third region C may be lower in position than the first sound-generating device 1900 of the first region L and the second sound-generating device 1900' of the second region R, but the present embodiment is not limited thereto.

With reference to FIGS. 28A and 28B, one member may be further provided on at least one side of each of a first partition 1700, a second partition 1700', and a third partition 1700". This will be described below with reference to FIG. 28A for example, and the description may be applied to FIG. 28B identically or similarly. A first member 831 may be on a first side of the first partition 1700. For example, the first member 831 may face the third sound-generating device 1920. A second member 832 may be on a side of the second partition 1700'. For example, the second member 832 may be in the third region C. A third member 834 may be on a side of the third partition 1700". For example, the third member 834 may be in the third region C. The second member 832 may face the third member 834. The first member 831, the second member 832, and the third member 834 may decrease or prevent the transfer of vibration, generated by the first region L and/or the second region R, to the third region C, thereby providing a display apparatus for realizing a sharp and clean sound. The first member 831 may decrease a peak or a dip caused by a standing wave that may occur in a lengthwise direction of a sound-generating device, and thus, may be referred to as a "pad part."

One of the second member 832 and the third member 834 may be symmetrically disposed with respect to the first sound-generating device 1900 and/or the second sound-generating device 1900'. For example, one of the second member 832 and the third member 834 may be on the same plane or line as the first sound-generating device 1900 and/or the second sound-generating device 1900', but the present embodiment is not limited thereto. One of the second member 832 and the third member 834 may be asymmetrically disposed with respect to the first sound-generating device 1900 and/or the second sound-generating device 1900'. For example, one of the second member 832 and the third member 834 may be on a plane or a line, each differing from the first sound-generating device 1900 and/or the second sound-generating device 1900', but the present embodiment is not limited thereto. The second member 832 may be between adjacent third pad parts 822 or adjacent fourth pad parts 812, each on at least one side of the first partition 1700, but is not limited thereto. The third member 834 may be between adjacent third pad parts 822 or adjacent fourth pad parts 812, each on at least one side of the first partition 1700, but is not limited thereto. For example, the second member 832 may be on or under the third pad part 822 or the fourth pad part 812, and the third member 834 may be on or under the third pad part 822 or the fourth pad part 812. However, the present embodiment is not limited thereto.

The first member 831, the second member 832, and the third member 834 may include one or more of: a double-sided tape, a single-sided tape, an adhesive, and a bond. When the first member 831, the second member 832, and the third member 834 include materials that differ from those of the first pad part 821, the second pad part 811, the third pad part 822, the fourth pad part 812, the fifth pad part 823, and the sixth pad part 813, the wave phenomenon may occur due to different adhesive forces when contacting the display panel 100. Therefore, when the first member 831, the second member 832, and the third member 834 include the same material as that of each of the first pad part 821, the second pad part 811, the third pad part 822, the fourth pad part 812, the fifth pad part 823, and the sixth pad part 813, the wave phenomenon may be reduced, and the occurrence of an abnormal sound may be reduced. Therefore, the first member 831, the second member 832, and the third member 834 may include the same material as that of each of the first pad part 821, the second pad part 811, the third pad part 822, the fourth pad part 812, the fifth pad part 823, and the sixth pad part 813. For example, the first member 831, the second member 832, and the third member 834 may include a single-sided tape. The single-sided tape may include a foam material that may absorb an impact when contacting the display panel 100. When the single-sided tape does not include the foam material, it may be seen that an undesired abnormal sound may occur due to contacting the display panel 100. The single-sided tape may include, for example, polyurethane, polyolefin, polyethylene, and/or the like, but is not limited thereto. A shape or a size of each of the first member 831, the second member 832, and the third member 834, may be equal or similar to that of each of the first pad part 821, the second pad part 811, the third pad part 822, the fourth pad part 812, the fifth pad part 823, and the sixth pad part 813, as described above with reference to FIGS. 26A to 26C.

In FIGS. 28A to 30D, the first region L, the second region R, and the third region C are illustrated as having the same area, but embodiments of the present disclosure are not limited thereto. For example, an area of each of the first region L and the second region R may be greater than that of the third region C. When the first region L, the second region R, and the third region C have the same area, a relatively lower pitched sound may be output. For example, when an area of the third region C, which outputs the middle- and/or low-pitched sound, is greater than that of each of the first region L and the second region R, a reproduction region corresponding to the low-pitched sound may further increase.

Figure 29A:
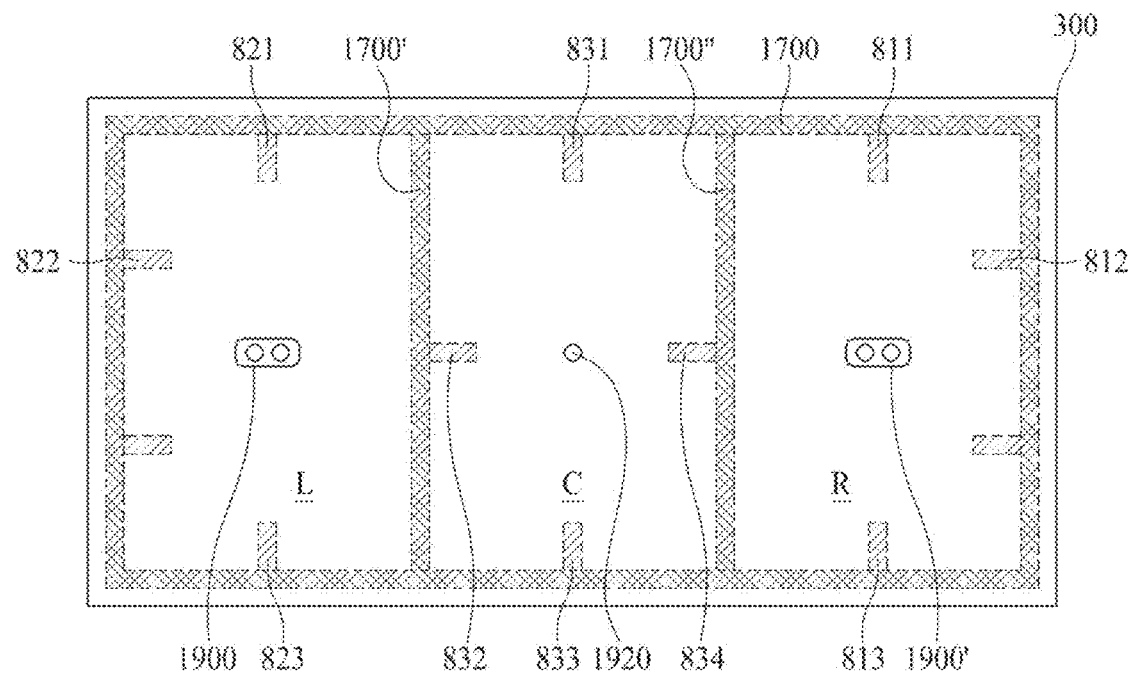
FIGS. 29A and 29B illustrate examples of another embodiment of each of a sound-generating device and a partition in a display apparatus according to an embodiment of the present disclosure.
Figure 29B:
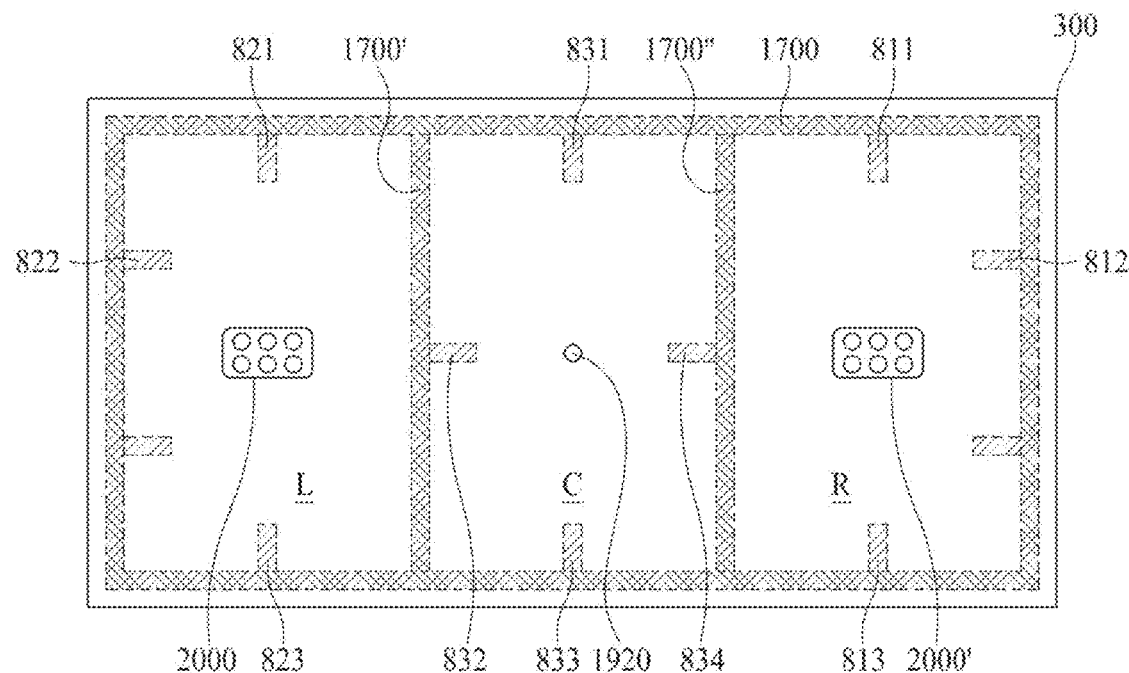

FIGS. 29A and 29B illustrate examples of another embodiment of each of a sound-generating device and a partition according to an embodiment of the present disclosure.

In FIGS. 29A and 29B, the same descriptions as descriptions given above with reference to FIGS. 26A to 26C may be omitted or will be briefly given. For example, descriptions of a sound-generating device, a partition, and a pad part may be omitted or will be briefly given. Descriptions of features of the examples of FIGS. 29A and 29B are similar to descriptions given above with reference to FIGS. 28A and 28B, and thus, their detailed descriptions may be omitted.

With reference to FIG. 29A, a first sound-generating device 1900 may be in a first region L, and a second sound-generating device 1900' may be in a second region R. The first sound-generating device 1900 and the second sound-generating device 1900' may each be configured as the sound-generating device described above with reference to FIG. 9B. For example, the first sound-generating device 1900 and the second sound-generating device 1900' may each be configured with two sound-generating devices. The first sound-generating device 1900 and the second sound-generating device 1900' may output different middle- and/or high-pitched sounds in the first region L and the second region R. For example, each of the first sound-generating device 1900 and the second sound-generating device 1900' may output a sound corresponding to a range of about 200 Hz to about 20 kHz, but the range is not limited thereto.

A third sound-generating device 1920 may be in a third region C. The third sound-generating device 1920 may be configured as the sound-generating device described above with reference to FIG. 9A. For example, the third sound-generating device 1920 may be configured with one sound-generating device. The third sound-generating device 1920 may output a middle- and/or low-pitched sound in the third region C. For example, the third sound-generating device 1920 may output a sound corresponding to a range of about 100 Hz to about 10 kHz, but the range is not limited thereto.

Therefore, the first sound-generating device 1900 and the second sound-generating device 1900' may output different middle- and/or high-pitched sounds, and the third sound-generating device 1920 may output the middle- and/or low-pitched sound. Accordingly, a stereo sound may be output by separating left and right sounds, thereby providing a display apparatus having a three-channel sound output characteristic.

With reference to FIG. 29B, a first sound-generating device 2000 may be in a first region L, and a second sound-generating device 2000' may be in a second region R. The first sound-generating device 2000 and the second sound-generating device 2000' may each be configured as the sound-generating device described above with reference to FIG. 9D. For example, the first sound-generating device 2000 and the second sound-generating device 2000' may each be configured with six sound-generating devices. The first sound-generating device 2000 and the second sound-generating device 2000' may output different middle- and/or high-pitched sounds in the first region L and the second region R. For example, each of the first sound-generating device 2000 and the second sound-generating device 2000' may output a sound corresponding to a range of about 200 Hz to about 20 kHz, but the range is not limited thereto.

A third sound-generating device 1920 may be in a third region C. The third sound-generating device 1920 may be configured as the sound-generating device described above with reference to FIG. 9A. For example, the third sound-generating device 1920 may be configured with one sound-generating device. The third sound-generating device 1920 may output a middle- and/or low-pitched sound in the third region C. For example, the third sound-generating device 1920 may output a sound corresponding to a range of about 100 Hz to about 10 kHz, but the range is not limited thereto.

Therefore, the first sound-generating device 2000 and the second sound-generating device 2000' may output different middle- and/or high-pitched sounds, and the third sound-generating device 1920 may output the middle- and/or low-pitched sound. Accordingly, a stereo sound may be output by separating left and right sounds, thereby providing a display apparatus having a three-channel sound output characteristic.

With reference to FIGS. 29A and 29B, a first sound-generating device of a first region L and a second sound-generating device of a second region R may be symmetrically disposed with a third sound-generating device of a third region C. For example, in FIG. 29A, the first sound-generating device 1900 of the first region L, the second sound-generating device 1900' of the second region R, and the third sound-generating device 1920 of the third region C may be on the same line. For example, heights of sound sources that may generate sound may become equal or similar. Thus, when reproducing a stereo sound that expresses a position of a sound based on a difference between left and right sounds, sound image localization, in which a sound image may be realized at a normal position, may be enhanced.

With reference to FIGS. 29A and 29B, one member may be further provided on at least one side of each of a first partition 1700, a second partition 1700', and a third partition 1700". This will be described below with reference to FIG. 29A for example, and the description may be applied to FIG. 29B identically or similarly. A first member 831 may be on a first side of the first partition 1700. For example, the first member 831 may face the third sound-generating device 1920. A second member 832 may be on a side of the second partition 1700'. For example, the second member 832 may be in the third region C. A third member 834 may be on a side of the third partition 1700". For example, the third member 834 may be in the third region C. The second member 832 may face the third member 834. A fourth member 833 may be on the first side of the first partition 1700. For example, the fourth member 833 may face the third sound-generating device 1920. The first member 831 may face the fourth member 833. The first member 831, the second member 832, the third member 834, and the fourth member 833 may decrease or prevent the transfer of vibration, generated by the first region L and/or the second region R, to the third region C, thereby providing a display apparatus for realizing a sharp and clean sound. The first member 831 and the fourth member 833 may decrease a peak or a dip caused by a standing wave that may occur in a lengthwise direction of a sound-generating device, and thus, may be referred to as a "pad part."

One of the second member 832 and the third member 834 may be symmetrically disposed with respect to the first sound-generating device 1900 and/or the second sound-generating device 1900'. For example, one of the second member 832 and the third member 834 may be on the same plane or line as the first sound-generating device 1900 and/or the second sound-generating device 1900', but the present embodiment is not limited thereto. One of the second member 832 and the third member 834 may be asymmetrically disposed with respect to the first sound-generating device 1900 and/or the second sound-generating device 1900'. For example, one of the second member 832 and the third member 834 may be on a plane or a line, each differing from the first sound-generating device 1900 and/or the second sound-generating device 1900', but the present embodiment is not limited thereto. The second member 832 may be between adjacent third pad parts 822 or adjacent fourth pad parts 812, each on at least one side of the first partition 1700, but is not limited thereto. The third member 834 may be between adjacent third pad parts 822 or adjacent fourth pad parts 812, each on at least one side of the first partition 1700, but is not limited thereto. For example, the second member 832 may be on or under the third pad part 822 or the fourth pad part 812, and the third member 834 may be on or under the third pad part 822 or the fourth pad part 812. However, the present embodiment is not limited thereto.

The first member 831, the second member 832, the third member 834, and the fourth member 833 may include one or more of: a double-sided tape, a single-sided tape, an adhesive, and a bond. When the first member 831, the second member 832, the third member 834, and the fourth member 833 include materials that differ from those of the first pad part 821, the second pad part 811, the third pad part 822, the fourth pad part 812, the fifth pad part 823, and the sixth pad part 813, the wave phenomenon may occur due to different adhesive forces when contacting the display panel 100. Therefore, when the first member 831, the second member 832, the third member 834, and the fourth member 833 include the same material as that of each of the first pad part 821, the second pad part 811, the third pad part 822, the fourth pad part 812, the fifth pad part 823, and the sixth pad part 813, the wave phenomenon may be reduced, and the occurrence of an abnormal sound may be reduced. Therefore, the first member 831, the second member 832, the third member 834, and the fourth member 833 may include the same material as that of each of the first pad part 821, the second pad part 811, the third pad part 822, the fourth pad part 812, the fifth pad part 823, and the sixth pad part 813. For example, the first member 831, the second member 832, the third member 834, and the fourth member 833 may include a single-sided tape. The single-sided tape may include a foam material that may absorb an impact when contacting the display panel 100. When the single-sided tape does not include the foam material, it may be seen that an undesired abnormal sound may occur due to contacting the display panel 100. The single-sided tape may include, for example, polyurethane, polyolefin, polyethylene, and/or the like, but is not limited thereto. A shape or a size of each of the first member 831, the second member 832, the third member 834, and the fourth member 833 may be equal or similar to that of each of the first pad part 821, the second pad part 811, the third pad part 822, the fourth pad part 812, the fifth pad part 823, and the sixth pad part 813, as described above with reference to FIGS. 26A to 26C.

FIGS. 30A to 30D illustrate examples of another embodiment of each of a sound-generating device and a partition according to an embodiment of the present disclosure.

In FIGS. 30A to 30D, the same descriptions as descriptions given above with reference to FIGS. 26A to 26C may be omitted or will be briefly given. For example, descriptions of a sound-generating device, a partition, and a pad part may be omitted or will be briefly given.

With reference to FIGS. 30A to 30D, a first region L and a second region R may each include at least two regions, and a sound-generating device may be in each of the at least two regions of each of the first region L and the second region R. A fourth partition 1704 may be further provided between the two regions of the first region L. A fifth partition 1705 may be further provided between the two regions of the second region R.

Figure 30A:
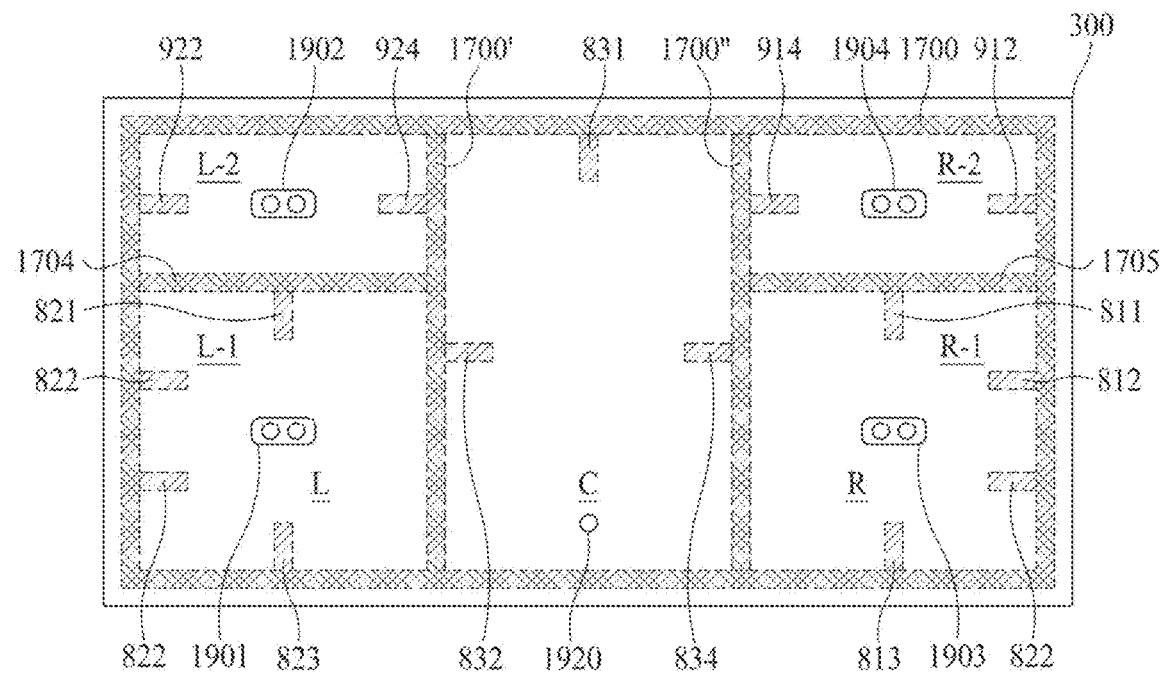
FIGS. 30A to 30D illustrate examples of another embodiment of each of a sound-generating device and a partition in a display apparatus according to an embodiment of the present disclosure.

With reference to FIG. 30A, the first region L may be divided into a 1-1$^{st}$ region L-1 and a 1-2$^{nd}$ region L-2, a first sound-generating device 1901 may be in the 1-1$^{st}$ region L-1, and a second sound-generating device 1902 may be in the 1-2$^{nd}$ region L-2. The first sound-generating device 1901 and the second sound-generating device 1902 may be provided as sound-generating devices having the same structure. When the first sound-generating device 1901 and the second sound-generating device 1902 are in different structures, for example, when the first sound-generating device 1901 is configured with two sound-generating devices and the second sound-generating device 1902 is configured with six sound-generating devices, the first region L may output different-pitched sounds. Thus, it may be difficult to output a clean sound. Even when the first sound-generating device 1901 is configured with two sound-generating devices and the second sound-generating device 1902 is configured with six sound-generating devices, when the first sound-generating device 1901 is configured with sound-generating devices for outputting sounds of the same-pitched sound and the second sound-generating device 1902 is configured with sound-generating devices for outputting sounds of the same-pitched sound, a clean sound may be output. The 1-1$^{st}$ region L-1 may be larger (e.g., in area) than the 1-2$^{nd}$ region L-2, but the present embodiment is not limited thereto. For example, the 1-2$^{nd}$ region L-2 may be in a region corresponding to one-third of the 1-1$^{st}$ region L-1, but is not limited thereto. For example, when the middle-pitched sound is higher than the high-pitched sound, the 1-1$^{st}$ region L-1 may be larger (e.g., in area) than the 1-2$^{nd}$ region L-2, but is not limited thereto. For example, the 1-2$^{nd}$ region L-2 may have the same area as that of the 1-1$^{st}$ region L-1. The first sound-generating device 1901 of the 1-1$^{st}$ region L-1 may output the middle-pitched sound, and the second sound-generating device 1902 of the 1-2$^{nd}$ region L-2 may output the high-pitched sound. For example, the second sound-generating device 1902 of the 1-2$^{nd}$ region L-2 may output a high-pitched sound based on a surround algorithm. For example, the second sound-generating device 1902 of the 1-2$^{nd}$ region L-2 may output a surround sound to which a sound field effect algorithm, e.g., for increasing a sense of space of a sound, may be applied.

The second region R may be divided into a 2-1$^{st}$ region R-1 and a 2-2$^{nd}$ region R-2, a third sound-generating device 1903 may be in the 2-1$^{st}$ region R-1, and a fourth sound-generating device 1904 may be in the 2-2$^{nd}$ region R-2. The 2-1$^{st}$ region R-1 may be larger (e.g., in area) than the 2-2$^{nd}$ region R-2, but is not limited thereto. The third sound-generating device 1903 of the 2-1$^{st}$ region R-1 may output the middle-pitched sound, and the fourth sound-generating device 1904 of the 2-2$^{nd}$ region R-2 may output the high-pitched sound. For example, the fourth sound-generating device 1904 of the 2-2$^{nd}$ region R-2 may output the high-pitched sound based on the surround algorithm. For example, the fourth sound-generating device 1904 of the 2-2$^{nd}$ region R-2 may output a surround sound to which a sound field effect algorithm, e.g., for increasing a sense of space of a sound, may be applied.

The first sound-generating device 1901, the second sound-generating device 1902, the third sound-generating device 1903, and the fourth sound-generating device 1904 may be provided as sound-generating devices having the same structure. For example, each of the first sound-generating device 1901, the second sound-generating device 1902, the third sound-generating device 1903, and the fourth sound-generating device 1904 may be configured with two sound-generating devices described above with reference to FIG. 9B. When each of the first sound-generating device 1901 and the second sound-generating device 1902 are configured with two sound-generating devices, and each of the third sound-generating device 1903 and the fourth sound-generating device 1904 are configured with six sound-generating devices, the first region L and the second region R may output different-pitched sounds. Thus, it may be difficult to output a clean sound.

A fifth sound-generating device 1920 may be in a third region C. The fifth sound-generating device 1920 may be configured as the sound-generating device described above with reference to FIG. 9A. For example, the fifth sound-generating device 1920 may be configured with one sound-generating device. The fifth sound-generating device 1920 may output the middle- and/or low-pitched sound in the third region C. For example, the fifth sound-generating device 1920 may output a sound corresponding to a range of about 100 Hz to about 10 kHz, but the range is not limited thereto.

Figure 30B:
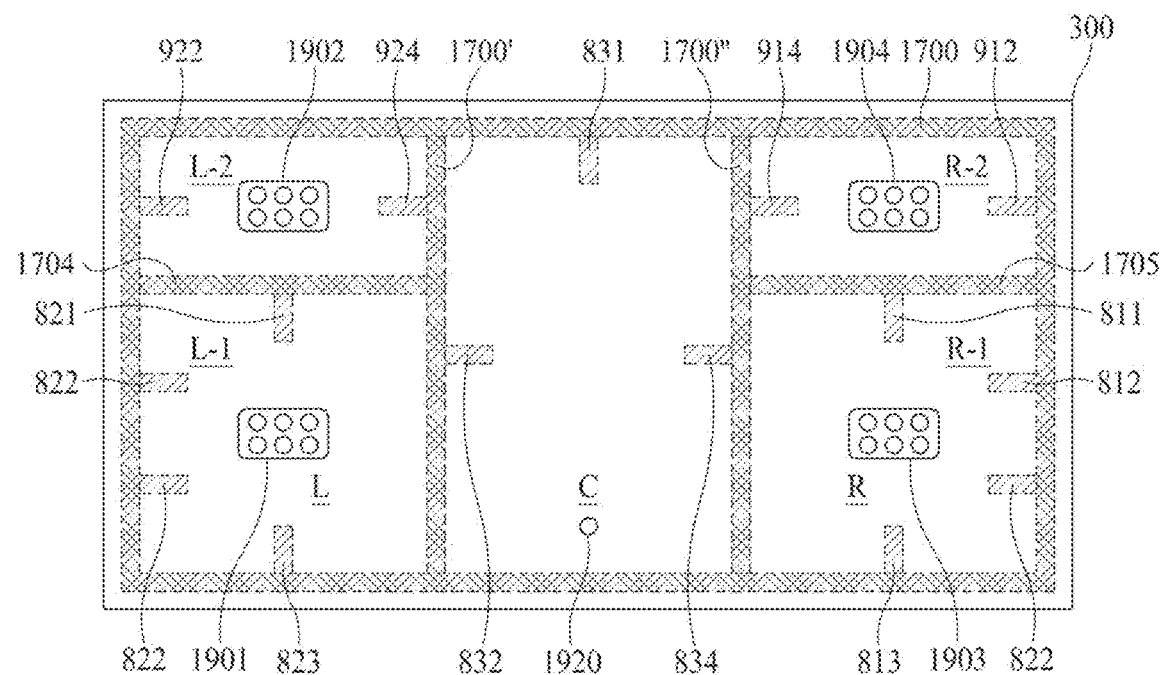

With reference to FIGS. 30A and 30B, the fourth partition 1704 may be between the 1-1$^{st}$ region L-1 and the 1-2$^{nd}$ region L-2 of the first region L. At least one pad part may be on at least one side of a first partition 1700 in the 1-1$^{st}$ region L-1. For example, at least one third pad part 822 may be on a second side of the first partition 1700, and at least one fifth pad part 823 may be on a first side vertical to the second side of the first partition 1700. For example, the at least one third pad part 822 and the at least one fifth pad part 823 may face the first sound-generating device 1901.

At least one first pad part 821 may be on at least one side of the fourth partition 1704. For example, the at least one first pad part 821 may face the first sound-generating device 1901. The at least one first pad part 821 may face the at least one fifth pad part 823, but the present embodiment is not limited thereto.

At least one pad part may be on at least one side of each of the first partition 1700 and a second partition 1700' in the 1-2$^{nd}$ region L-2. For example, at least one seventh pad part 922 may be on the second side of the first partition 1700. At least one eighth pad part 924 may be on one side of the second partition 1700'. The at least one seventh pad part 922 and the at least one eighth pad part 924 may face the second sound-generating device 1902. Also, the at least one seventh pad part 922 and the at least one eighth pad part 924 may be symmetrically disposed with respect to the second sound-generating device 1902, but the present embodiment is not limited thereto. For example, the at least one seventh pad part 922 and the at least one eighth pad part 924 may be on the same plane or line with respect to the second sound-generating device 1902.

The fifth partition 1705 may be between the 2-1$^{st}$ region R-1 and the 2-2$^{nd}$ region R-2 of the second region R. At least one pad part may be on at least one side of the first partition 1700 in the 2-1$^{st}$ region R-1. For example, at least one fourth pad part 812 may be on the second side of the first partition 1700, and at least one sixth pad part 813 may be on the first side vertical to the second side of the first partition 1700. For example, the at least one fourth pad part 812 and the at least one sixth pad part 813 may face the third sound-generating device 1903.

At least one second pad part 811 may be on at least one side of the fifth partition 1705. For example, the at least one second pad part 811 may face the third sound-generating device 1903. The at least one second pad part 811 may face the at least one sixth pad part 813, but the present embodiment is not limited thereto.

At least one pad part may be on at least one side of each of the first partition 1700 and a third partition 1700" in the 2-2$^{nd}$ region R-2. For example, at least one ninth pad part 912 may be on the second side of the first partition 1700. At least one tenth pad part 914 may be on one side of the third partition 1700". The at least one ninth pad part 912 and the at least one tenth pad part 914 may face the fourth sound-generating device 1904. Also, the at least one ninth pad part 912 and the at least one tenth pad part 914 may be symmetrically disposed with respect to the fourth sound-generating device 1904, but the present embodiment is not limited thereto. For example, the at least one ninth pad part 912 and the at least one tenth pad part 914 may be on the same plane or line with respect to the fourth sound-generating device 1904.

The fourth partition 1704 and the fifth partition 1705 may include the same material as that of the first partition 1700. When the fourth partition 1704 and the fifth partition 1705 include the same material, an adhesive force may be enhanced in a process of attaching a supporting member to the display panel 100. For example, the fourth partition 1704 and the fifth partition 1705 may include the same material as that of each of the first partition 700, the second partition 1700', and the third partition 1700". The fourth partition 1704 and the fifth partition 1705 may include a double-sided tape, but is not limited thereto. For example, the fourth partition 1704 and the fifth partition 1705 may include a material having an elastic force that may enable compression to be made to a certain degree, and for example, may include a polyurethane, a polyolefin, a polyethylene, and/or the like, but is not limited thereto.

With reference to FIG. 30B, each of the first sound-generating device 1901, the second sound-generating device 1902, the third sound-generating device 1903, and the fourth sound-generating device 1904 may be configured with six sound-generating devices described above with reference to FIG. 9D. Descriptions relevant thereto may be the same as descriptions given above with reference to FIG. 30A, and thus, may be omitted. Descriptions of a member and a pad part may be the same as or similar to descriptions given above with reference to FIGS. 28A to 29B, and thus, may be omitted. Descriptions of a size, a shape, and a material of the pad part may be applied identically or similarly.

The seventh pad part 922, the eighth pad part 924, the ninth pad part 912, and the tenth pad part 914 may include one of a double-sided tape, a single-sided tape, an adhesive, and a bond. When the seventh pad part 922, the eighth pad part 924, the ninth pad part 912, and the tenth pad part 914 include materials that differ from those of the first pad part 821, the second pad part 811, the third pad part 822, the fourth pad part 812, the fifth pad part 823, and the sixth pad part 813, the wave phenomenon may occur due to different adhesive forces when contacting the display panel 100. Therefore, when the first member 831, the second member 832, the third member 834, and the fourth member 833 include the same material as that of each of the first pad part 821, the second pad part 811, the third pad part 822, the fourth pad part 812, the fifth pad part 823, and the sixth pad part 813, the wave phenomenon may be reduced, and the occurrence of an abnormal sound may be reduced. Therefore, the seventh pad part 922, the eighth pad part 924, the ninth pad part 912, and the tenth pad part 914 may include the same material as that of each of the first pad part 821, the second pad part 811, the third pad part 822, the fourth pad part 812, the fifth pad part 823, and the sixth pad part 813. For example, the seventh pad part 922, the eighth pad part 924, the ninth pad part 912, and the tenth pad part 914 may include a single-sided tape. The single-sided tape may include a foam material that may absorb an impact when contacting the display panel 100. When the single-sided tape does not include the foam material, it may be seen that an undesired abnormal sound may occur due to contacting the display panel 100. The single-sided tape may include, for example, polyurethane, polyolefin, polyethylene, and/or the like, but is not limited thereto. A shape or a size of each of the seventh pad part 922, the eighth pad part 924, the ninth pad part 912, and the tenth pad part 914 may be equal or similar to that of each of the first pad part 821, the second pad part 811, the third pad part 822, the fourth pad part 812, the fifth pad part 823, and the sixth pad part 813, as described above with reference to FIGS. 26A to 26C. Descriptions relevant thereto may be applied to FIGS. 30B to 30D identically or similarly.

With reference to FIGS. 30A and 30B, the first and second sound-generating devices of the first region L, the third and fourth sound-generating devices of the second region R, and the fifth sound-generating device of the third region C may be asymmetrically disposed. For example, in FIG. 30A, the first and second sound-generating devices 1901 and 1902 of the first region L and the third and fourth sound-generating devices 1903 and 1904 of the second region R may be on a line differing from the fifth sound-generating device 1920 of the third region C. The first and second sound-generating devices 1901 and 1902 of the first region L and the third and fourth sound-generating devices 1903 and 1904 of the second region R may be symmetrically disposed, and the fifth sound-generating device 1920 of the third region C may be asymmetrically disposed with respect to the first and second sound-generating devices 1901 and 1902 of the first region L and the third and fourth sound-generating devices 1903 and 1904 of the second region R. The fifth sound-generating device 1920 of the third region C may be at a position that may be lower than the first and second sound-generating devices 1901 and 1902 of the first region L and the third and fourth sound-generating devices 1903 and 1904 of the second region R.

Figure 30C:
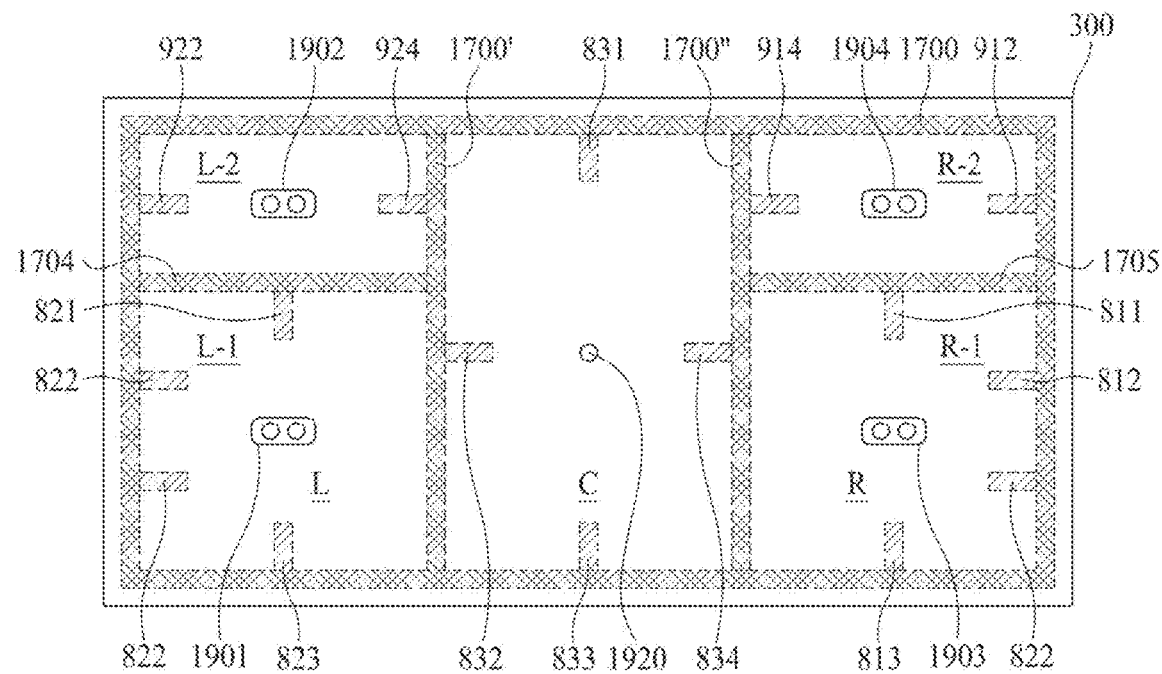
Figure 30D:
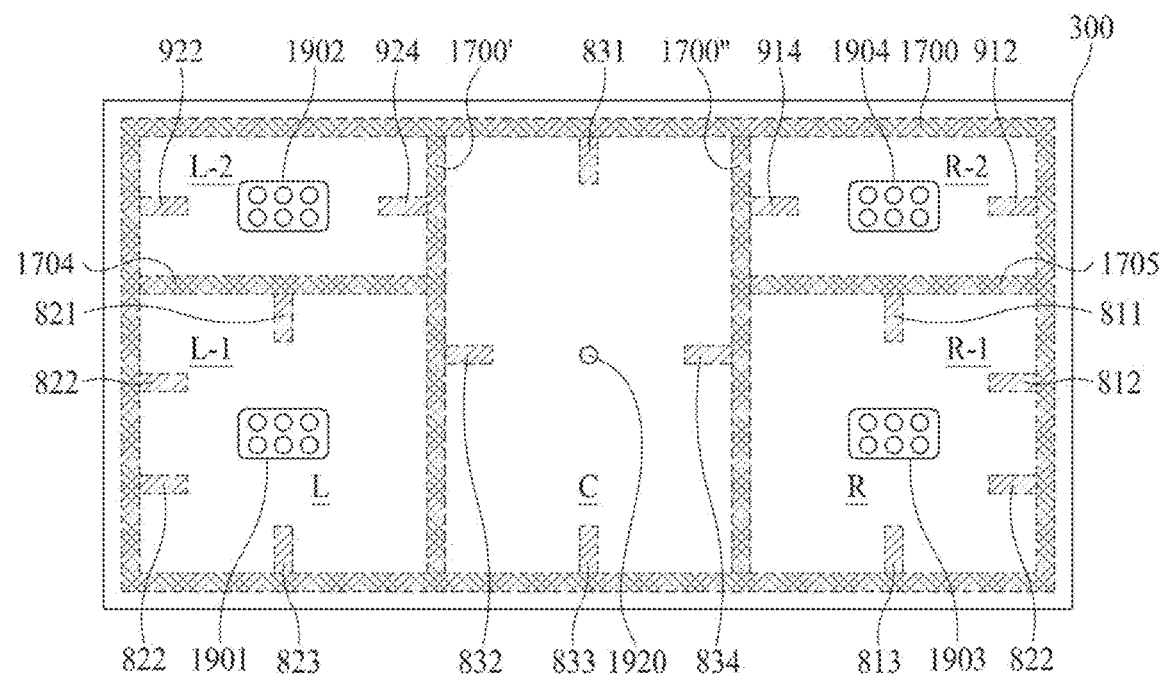

Descriptions of FIGS. 30C and 30D may be similar to descriptions given above with reference to FIGS. 30A and 30B. Thus, their detailed descriptions may be omitted.

With reference to FIGS. 30C and 30D, the first and second sound-generating devices 1901 and 1902 of the first region L, the third and fourth sound-generating devices 1903 and 1904 of the second region R, and the fifth sound-generating device 1920 of the third region C may be symmetrically disposed. For example, in FIG. 30C, the first and second sound-generating devices 1901 and 1902 of the first region L and the third and fourth sound-generating devices 1903 and 1904 of the second region R may be on the same line as the fifth sound-generating device 1920 of the third region C. For example, heights of sound sources, which may generate sound, may become equal or similar. Thus, when reproducing a stereo sound that may express a position of a sound based on a difference between left and right sounds, sound image localization in which a sound image may be realized at a normal position may be enhanced.

Therefore, the first sound-generating device 1901 and the third sound-generating device 1903 may output different middle-pitched sounds, the second sound-generating device 1902 and the fourth sound-generating device 1904 may output different high-pitched sounds, and the fifth sound-generating device 1920 may output the middle- and/or low-pitched sound. Accordingly, a display apparatus, having a five-channel or multiple channel sound output characteristic, may be provided.

The sound-generating device according to an embodiment of the present disclosure may be applied as a sound-generating device provided in a display apparatus. The display apparatus according to an embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), wall paper display apparatuses, signage devices, game machines, notebook computers, monitors, cameras, camcorders, home appliances, etc. Also, the sound-generating device according to an embodiment of the present disclosure may be applied to organic light-emitting lighting devices or inorganic light-emitting lighting devices. When the sound-generating device is applied to a lighting device, the sound-generating device may act as lighting and as a speaker.

A display apparatus according to an example embodiment of the present disclosure may be described as follows.

According to an embodiment of the present disclosure, a display apparatus may include: a display panel configured to display an image, a supporting member configured to support the display panel, a coupling member in the supporting member, and at least one sound-generating device coupled to the display panel by the coupling member, the at least one sound-generating device being configured to vibrate the display panel to generate sound.

For example, in the display apparatus according to an embodiment of the present disclosure, the at least one sound-generating device may include: a plate, a magnet on the plate, a center pole on the plate, a bobbin around the center pole, a frame outside the plate, and a damper between the frame and the bobbin. For example, in the display apparatus according to an embodiment of the present disclosure, the coupling member may be on an extension part of the plate.

For example, in the display apparatus according to an embodiment of the present disclosure, the damper may be a line configured through which to apply a sound signal to the at least one sound-generating device. For example, in the display apparatus according to an embodiment of the present disclosure, the line may be between a rear surface of the display panel and the supporting member.

For example, the display apparatus according to an embodiment of the present disclosure may further include an encapsulation substrate on a rear surface of the display panel, a polarity of a magnetic force of the encapsulation substrate being opposite to a polarity of a magnetic force of the magnet. For example, in the display apparatus according to an embodiment of the present disclosure, the encapsulation substrate may be configured to generate a repulsive magnetic force with respect to the magnet to maintain a distance to the magnet.

For example, the display apparatus according to an embodiment of the present disclosure may further include a heat dissipation member between the display panel and the at least one sound-generating device. For example, the display apparatus according to an embodiment of the present disclosure may further include a pad between the at least one sound-generating device and the supporting member.

For example, the display apparatus according to an embodiment of the present disclosure may further include: an encapsulation substrate on a rear surface of the display panel, and a shielding sheet on a rear surface of the encapsulation substrate. For example, in the display apparatus according to an embodiment of the present disclosure, the shielding sheet may be configured to decrease a degree to which a magnetic force generated by the at least one sound-generating device may be transferred to the encapsulation substrate.

According to an embodiment of the present disclosure, a display apparatus may include: a display panel configured to display an image and including: a first region, a second region, and a third region, a supporting member configured to support the display panel, a coupling member in the supporting member, at least one sound-generating device coupled between the display panel and the supporting member by the coupling member, the at least one sound-generating device being in at least one of: the first region, the second region, and the third region, and a first partition between the display panel and the supporting member.

For example, in the display apparatus according to an embodiment of the present disclosure, the first partition may include at least one pad part disposed to face the at least one sound-generating device. For example, in the display apparatus according to an embodiment of the present disclosure, the at least one sound-generating device may include one or more of: a pair of sound-generating devices, an elliptical sound-generating device, a circular sound-generating device, a single type sound-generating device, and a two or more device array sound-generating device.

For example, the display apparatus according to an embodiment of the present disclosure may further include: a second partition between the first region and the third region, and a third partition between the second region and the third region. For example, in the display apparatus according to an embodiment of the present disclosure, a first and a second of the at least one sound-generating device may be respectively in each of the first region and the second region.

For example, in the display apparatus according to an embodiment of the present disclosure, the first partition may include a first side and a second side vertical to the first side, and at least one pad part may be disposed on at least one of the first side and the second side of the first partition. For example, in the display apparatus according to an embodiment of the present disclosure, a first and a second of the at least one pad part may be respectively disposed in each of the first region and the second region to respectively face the first and the second of the at least one sound-generating device. For example, in the display apparatus according to an embodiment of the present disclosure, the first and the second of the at least one sound-generating device may be configured to vibrate the display panel to respectively output middle- or high-pitched sound.

For example, in the display apparatus according to an embodiment of the present disclosure, a first, a second, and a third of the at least one sound-generating device may be respectively in each of the first region, the second region, and the third region. For example, in the display apparatus according to an embodiment of the present disclosure, the first region, the second region, and the third region have a same area.

For example, the display apparatus according to an embodiment of the present disclosure may further include at least one pad part on at least one side of the first partition, a first and a second of the at least one pad part being respectively disposed in each of the first region and the second region to face the at least one sound-generating device. For example, the display apparatus according to an embodiment of the present disclosure may further include: a second partition between the first region and the third region, a third partition between the second region and the third region, at least one pad part on at least one side of the first partition, respectively, in each of the first region and the second region, and at least one member, respectively, on at least one side of each of the first partition, the second partition, and the third partition in the third region.

For example, in the display apparatus according to an embodiment of the present disclosure, the first partition, the second partition, and the third partition may include a same material. For example, in the display apparatus according to an embodiment of the present disclosure, each of the first partition, the second partition, and the third partition may include a material differing from a material of the at least one pad part and a material of the at least one member, and the at least one pad part and the at least one member may include a same material.

For example, in the display apparatus according to an embodiment of the present disclosure, each of the first and the second of the at least one sound-generating device may be configured to vibrate the display panel to respectively output a middle- or high-pitched sound, and the third of the at least one sound-generating device may be configured to vibrate the display panel to output a middle- or low-pitched sound. For example, in the display apparatus according to an embodiment of the present disclosure, the first, the second, and the third of the at least one sound-generating device may be disposed on a same line.

For example, in the display apparatus according to an embodiment of the present disclosure, the first region may include a $1\text{-}1^{st}$ region and a $1\text{-}2^{nd}$ region, and the second region may include a $2\text{-}1^{st}$ region and a $2\text{-}2^{nd}$ region. For example, the display apparatus according to an embodiment of the present disclosure may further include: a fourth partition between the $1\text{-}1^{st}$ region and the $1\text{-}2^{nd}$ region, and a fifth partition between the $2\text{-}1^{st}$ region and the $2\text{-}2^{nd}$ region.

For example, in the display apparatus according to an embodiment of the present disclosure, the fourth partition and the fifth partition may include a same material as a material of the first partition. For example, the display apparatus according to an embodiment of the present disclosure may further include at least one pad part respectively on at least one side of each of the fourth partition and the fifth partition.

For example, the display apparatus according to an embodiment of the present disclosure may further include: at least one pad part respectively on at least one side of each of the first partition and the second partition in the $1\text{-}2^{nd}$ region, and at least one other pad part respectively on at least one side of each of the first partition and the third partition in the $2\text{-}2^{nd}$ region.

For example, in the display apparatus according to an embodiment of the present disclosure, each of a sound-generating device in the $1\text{-}1^{st}$ region and a sound-generating device in the $1\text{-}2^{nd}$ region may have a same structure, and each of a sound-generating device in the $2\text{-}1^{st}$ region and a sound-generating device in the $2\text{-}2^{nd}$ region may have a same structure. For example, in the display apparatus according to an embodiment of the present disclosure, each of a sound-generating device in the $1\text{-}1^{st}$ region and a sound-generating device in the $2\text{-}1^{st}$ region may be configured to vibrate the display panel to output a middle-pitched sound, each of a sound-generating device in the $1\text{-}2^{nd}$ region and a sound-generating device in the $2\text{-}2^{nd}$ region may be configured to vibrate the display panel to output a high-pitched sound, and a sound-generating device in the third region may be configured to vibrate the display panel to output a middle- or low-pitched sound.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:
1. A display apparatus, comprising:
   a display panel configured to display an image;
   a supporting member configured to support the display panel;

a coupling member in the supporting member;

at least one sound generating device disposed between the display panel and the supporting member by the coupling member, the at least one sound generating device being configured to vibrate the display panel to generate sound; and an encapsulation substrate on a rear surface of the display panel, wherein the at least one sound generating device is disposed between the display panel and a surface of the supporting member facing the display panel, and wherein a polarity of a magnetic force of the encapsulation substrate is opposite to a polarity of a magnetic force of a magnet of the at least one sound generating device.

2. The display apparatus of claim 1, wherein the at least one sound generating device comprises:

a plate;

the magnet on the plate;

a center pole on the plate;

a bobbin around the center pole;

a frame outside the plate; and a damper between the frame and the bobbin.

3. The display apparatus of claim 2, wherein the coupling member is on an extension part of the plate.

4. The display apparatus of claim 2, wherein the damper is a line through which a sound signal is configured to be applied to the at least one sound generating device.

5. The display apparatus of claim 4, wherein the line is between a rear surface of the display panel and the supporting member.

6. The display apparatus of claim 1, wherein the encapsulation substrate is configured to generate a repulsive magnetic force with respect to the magnet to maintain a distance to the magnet.

7. The display apparatus of claim 1, further comprising a heat dissipation member between the display panel and the at least one sound generating device.

8. The display apparatus of claim 1, further comprising a pad between the at least one sound generating device and the supporting member.

9. The display apparatus of claim 1, further comprising:

a shielding sheet on a rear surface of the encapsulation substrate.

10. The display apparatus of claim 9, wherein the shielding sheet is configured to decrease a degree to which a magnetic force generated by the at least one sound generating device is transferred to the encapsulation substrate.

11. The display apparatus of claim 1, wherein the coupling member includes a screw and a nut to fix the at least one sound generating device to the supporting member.

* * * * *